United States Patent
Endo

(10) Patent No.: US 10,546,958 B2
(45) Date of Patent: Jan. 28, 2020

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventor: Yuta Endo, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 106 days.

(21) Appl. No.: 15/907,343

(22) Filed: Feb. 28, 2018

(65) Prior Publication Data

US 2018/0190826 A1 Jul. 5, 2018

Related U.S. Application Data

(62) Division of application No. 15/147,279, filed on May 5, 2016, now Pat. No. 9,966,473.

(30) Foreign Application Priority Data

May 11, 2015 (JP) ................................ 2015-096317

(51) Int. Cl.
*H01L 29/786* (2006.01)
*H01L 29/24* (2006.01)
(Continued)

(52) U.S. Cl.
CPC ...... *H01L 29/7869* (2013.01); *H01L 21/8258* (2013.01); *H01L 27/0688* (2013.01);
(Continued)

(58) Field of Classification Search
CPC ....... H01L 21/76224; H01L 21/823418; H01L 21/823425; H01L 21/823468;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, pp. 183-186.
(Continued)

*Primary Examiner* — Duy T Nguyen
(74) *Attorney, Agent, or Firm* — Fish & Richardson P.C.

(57) ABSTRACT

A miniaturized transistor with less variation and highly stable electrical characteristics is provided. Further, high performance and high reliability of a semiconductor device including the transistor are achieved. A semiconductor and a conductor are formed over a substrate, a sacrificial layer is formed over the conductor, and an insulator is formed to cover the sacrificial layer. After that, a top surface of the insulator is removed to expose a top surface of the sacrificial layer. The sacrificial layer and a region of the conductor overlapping with the sacrificial layer are removed, whereby a source region, a drain region, and an opening are formed. Next, a gate insulator and a gate electrode are formed in the opening.

9 Claims, 52 Drawing Sheets

(51) Int. Cl.
*H01L 29/66* (2006.01)
*H01L 29/78* (2006.01)
*H01L 21/8258* (2006.01)
*H01L 27/06* (2006.01)
*H01L 27/12* (2006.01)

(52) U.S. Cl.
CPC ...... *H01L 27/1207* (2013.01); *H01L 27/1225* (2013.01); *H01L 27/1259* (2013.01); *H01L 29/24* (2013.01); *H01L 29/66969* (2013.01); *H01L 29/785* (2013.01); *H01L 29/78618* (2013.01); *H01L 29/78648* (2013.01); *H01L 29/78696* (2013.01)

(58) Field of Classification Search
CPC ..... H01L 21/823481; H01L 21/823487; H01L 21/823814; H01L 21/823828; H01L 21/823871; H01L 27/088; H01L 27/1203; H01L 29/0847; H01L 29/1054; H01L 29/41741; H01L 29/66666; H01L 29/7827
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,524,752 | B2 * | 4/2009 | Tsutsue ............. H01L 21/76808 257/E21.304 |
| 7,674,650 | B2 | 3/2010 | Akimoto et al. |
| 7,732,819 | B2 | 6/2010 | Akimoto et al. |
| 7,989,334 | B2 | 8/2011 | Tsutsue |
| 8,547,771 | B2 | 10/2013 | Koyama |
| 8,962,457 | B2 | 2/2015 | Watanabe |
| 9,443,934 | B2 | 9/2016 | Kobayashi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 * | 5/2007 | Akimoto ........... H01L 29/41733 257/61 |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 * | 12/2008 | Ryu ................ H01L 21/02554 257/43 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280609 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0233522 | A1 * | 9/2011 | Cohen ................ H01L 29/0673 257/24 |
| 2015/0187898 | A1 | 7/2015 | Miyairi |
| 2015/0187989 | A1 * | 7/2015 | Sato .................... H01L 27/3244 257/98 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-103957 A | 4/2004 |
| JP | 2004-273614 A | 9/2004 |
| JP | 2004-273732 A | 9/2004 |
| JP | 2012-059860 A | 3/2012 |
| JP | 2012-257187 A | 12/2012 |
| JP | 5215589 | 6/2013 |
| TW | 201515230 | 4/2015 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest Of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaOS(ZnO)3, and Ga2O3(ZnO)m (m=7, 8, 9, and 16) in the In2O3—ZnGaZO4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW'08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2OS$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 101, 110, 120, 130A, 130B, 140A

135

135

130a, 130b, 140

130a, 130b, 140

195, 190A 195, 190A

190B

190B

190

190

180A

180A

180

180

140a   140b 101 120 130B
110 130A

135

135

130b
130a 130b
130a 145
140A
130C 145
130C
140A

FIG. 13A
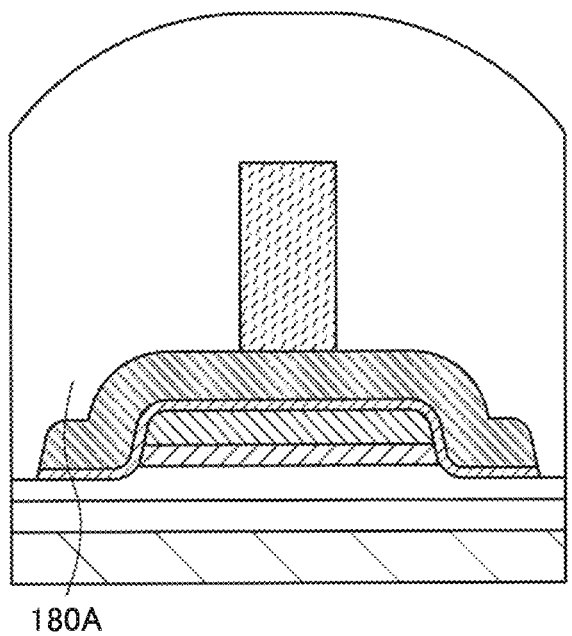
180A
FIG. 13B
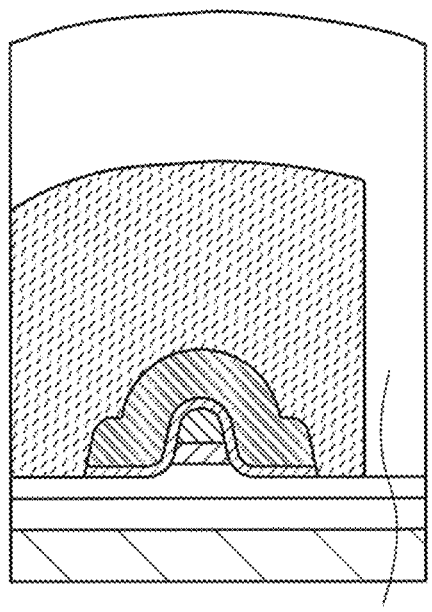
180A
FIG. 13C
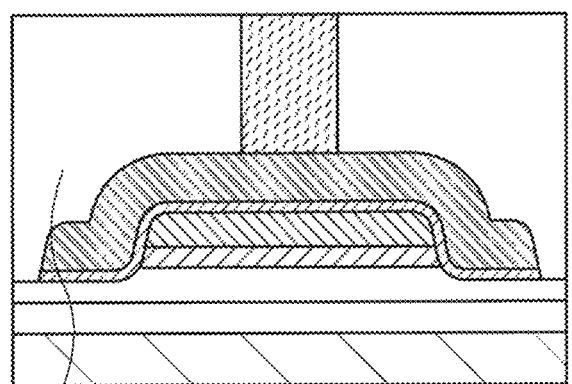
180
FIG. 13D
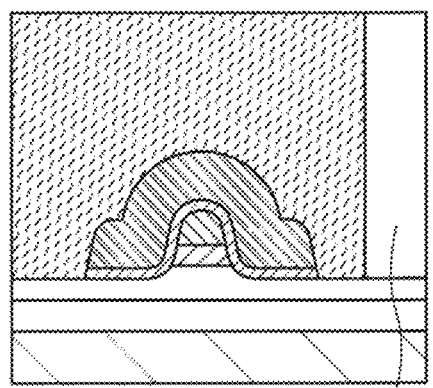
180
FIG. 13E
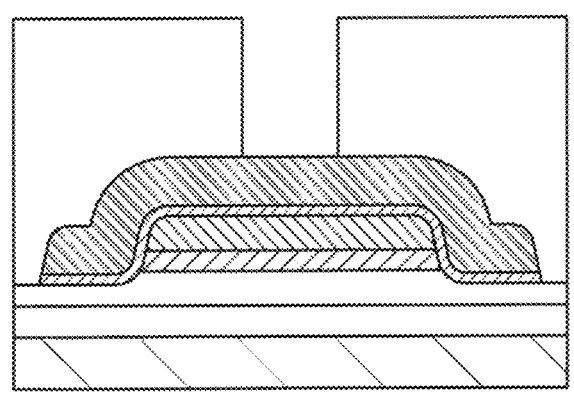
FIG. 13F
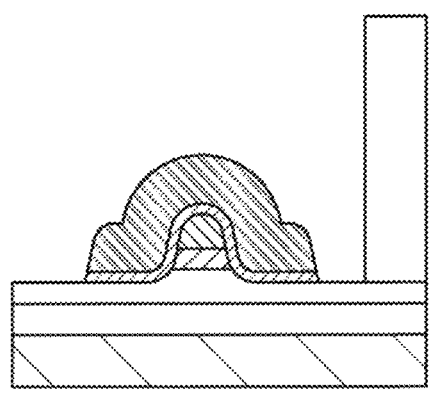

180

180

160A 150A
130C

160A 150A  130C 101　120　　130B
　110　　130A

135

135

130b
130a 130b
130a

130C

130C

180A

180A

180

180

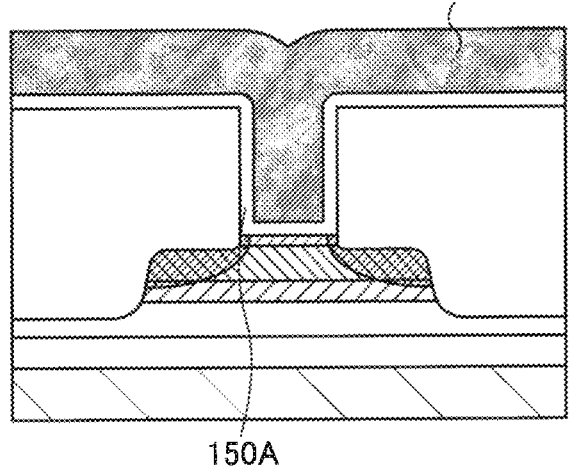
FIG. 24A
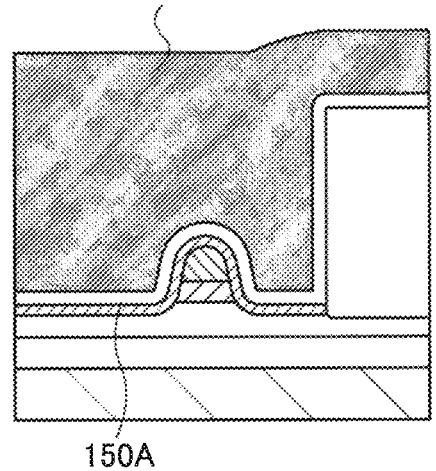
FIG. 24B
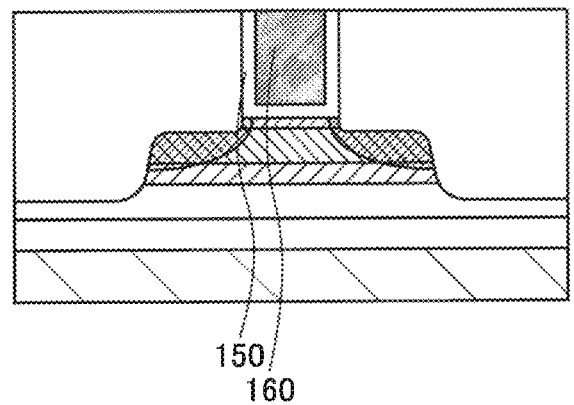
FIG. 24C
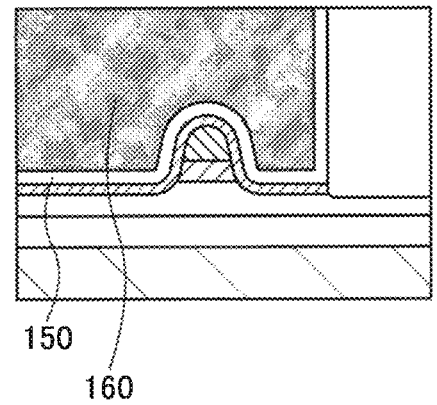
FIG. 24D FIG. 47A1
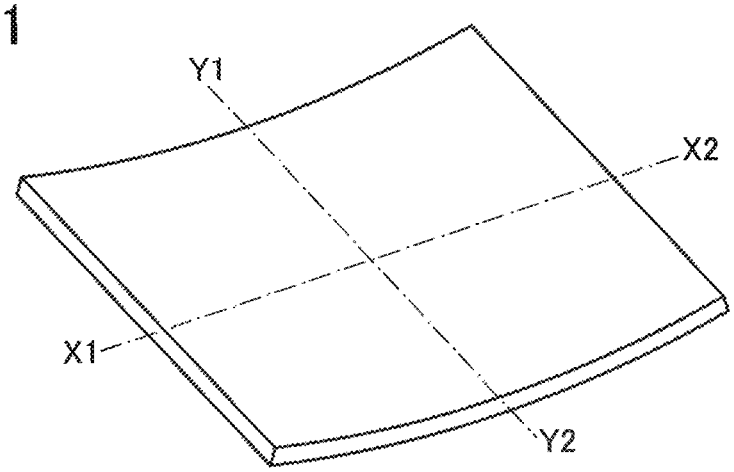
FIG. 47A2
FIG. 47A3
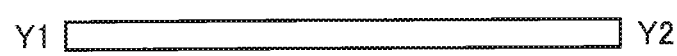
FIG. 47B1
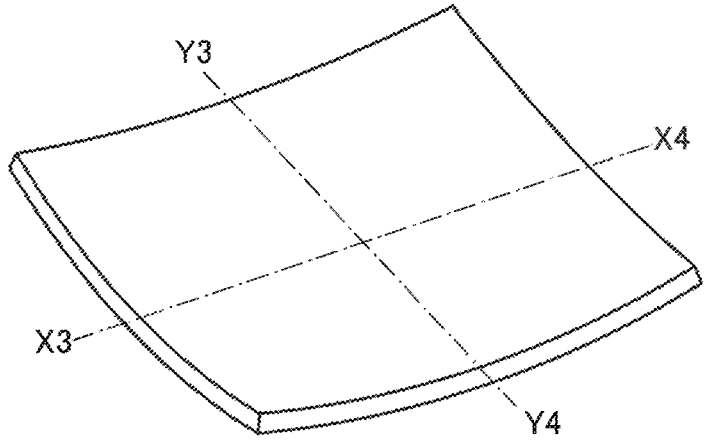
FIG. 47B2
FIG. 47B3
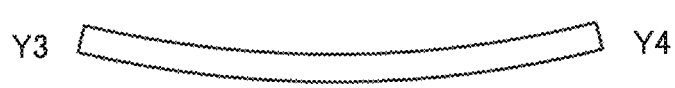

MANUFACTURING METHOD OF SEMICONDUCTOR DEVICE

CROSS-REFERENCE TO RELATED APPLICATIONS

This application is a divisional of U.S. application Ser. No. 15/147,279, filed May 5, 2016, now allowed, which claims the benefit of a foreign priority application filed in Japan as Serial No. 2015-096317 on May 11, 2015, both of which are incorporated by reference.

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, a processor, an imaging device, and an electronic device. The present invention relates to methods for manufacturing an oxide, a display device, a liquid crystal display device, a light-emitting device, a memory device, a processor, an imaging device, and an electronic device. The present invention relates to methods for driving a semiconductor device, a display device, a liquid crystal display device, a light-emitting device, a memory device, a processor, an imaging device, and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

In this specification and the like, a semiconductor device refers to any device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where driver circuits are formed over the same substrate, it is preferable to use polycrystalline silicon, which can be used to form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

In addition, a transistor including an amorphous oxide semiconductor is disclosed (see Patent Document 3). An oxide semiconductor can be formed by a sputtering method or the like, and thus can be used for a semiconductor of a transistor in a large display device. A transistor including an oxide semiconductor has high field-effect mobility; therefore, a high-performance display device where driver circuits are formed over the same substrate can be obtained. Moreover, there is an advantage that capital investment can be reduced because part of production equipment for a transistor including amorphous silicon can be retrofitted and utilized.

Recent research and development results show that using a crystalline oxide semiconductor increases the reliability of a transistor as compared to the case of using an amorphous oxide semiconductor (Non-Patent Document 1).

It is also disclosed that a transistor having a high field-effect mobility can be obtained by a well potential formed using an active layer including an oxide semiconductor (see Patent Document 4). It is known that a transistor including an oxide semiconductor has an extremely low leakage current in an off state. For example, a low power consumption CPU and the like utilizing a characteristic of a low leakage current of the transistor including an oxide semiconductor are disclosed (see Patent Document 5).

REFERENCE

Patent Document

[Patent Document 1] Japanese Published Patent Application No. S63-239117
[Patent Document 2] Japanese Translation of PCT International Application No. H11-505377
[Patent Document 3] Japanese Patent No. 5215589
[Patent Document 4] Japanese Published Patent Application No. 2012-059860
[Patent Document 5] Japanese Published Patent Application No. 2012-257187

Non-Patent Document

[Non-Patent Document 1] Shunpei Yamazaki, Jun Koyama, Yoshitaka Yamamoto, and Kenji Okamoto, "Research, Development, and Application of Crystalline Oxide Semiconductor", *SID 2012 DIGEST*, pp. 183-186

SUMMARY OF THE INVENTION

However, miniaturization of transistors with an increase in high integration of a semiconductor device makes the manufacturing process complicated, which causes a reduction in yield in some cases. In addition, the electrical characteristics of transistors in the semiconductor device vary significantly.

An object of one embodiment of the disclosed invention is to provide a transistor that can be miniaturized. Another object is to provide a transistor with low parasitic capacitance. Another object is to provide a transistor with high operation frequency. Another object is to provide a transistor with stable electrical characteristics. Another object of one embodiment of the invention disclosed is to provide a transistor whose channel length is easily adjusted. Another object of one embodiment of the invention disclosed is to provide a transistor whose amount of on-state current is large.

Another object of one embodiment of the present invention is to achieve high integration, high performance, high reliability, and high productivity also of a semiconductor device including the transistor. Another object is to provide a novel semiconductor device. Note that the descriptions of these objects do not disturb the existence of other objects. Note that one embodiment of the present invention does not necessarily achieve all the objects listed above. Other objects will be apparent from and can be derived from the description of the specification, the drawings, the claims, and the like.

One embodiment of the present invention is a manufacturing method of a semiconductor device including the steps of: forming a semiconductor and a first conductor over a substrate; forming a sacrificial layer over the first conductor; forming a first insulator so as to cover the semiconductor, the first conductor, and the sacrificial layer; exposing a top surface of the sacrificial layer by a chemical mechanical polishing method; removing the sacrificial layer to form an opening in the first insulator, so that part of the first conductor is exposed; forming a first electrode and a second electrode by removing part of the first conductor; forming a second insulator so as to cover the first insulator and the opening; forming a second conductor over the second insulator; and removing part of the second conductor.

In the above structure, the part of the second conductor is removed by a chemical mechanical polishing method.

One embodiment of the present invention is a manufacturing method of a semiconductor device including the steps of: forming a semiconductor over a substrate; forming a sacrificial layer over the semiconductor; forming a low resistance region by adding an impurity to part of the semiconductor; forming a first insulator so as to cover the semiconductor and the sacrificial layer; exposing a top surface of the sacrificial layer by a chemical mechanical polishing method; removing the sacrificial layer to form an opening in the first insulator, so that part of the semiconductor is exposed; forming a second insulator so as to cover the first insulator and the opening; forming a conductor over the second insulator; and removing part of the conductor.

In the above structure, part of the conductor is removed by a chemical mechanical polishing method.

In any of the above structures, the sacrificial layer is removed by a wet etching method.

In each of the above structures, the first insulator preferably contains oxygen.

One embodiment of the present invention is a manufacturing method of an electronic device that includes any of the above semiconductor devices.

With use of the present invention, transistors that have little variation in characteristics even when being miniaturized can be provided. Alternatively, a transistor with low parasitic capacitance can be provided. A transistor with high operation frequency can be provided. It is also possible to provide a transistor with stable electrical characteristics. Further alternatively, one embodiment of the invention disclosed can provide a transistor whose amount of on-state current is large.

With use of the present invention, yield for mass production can also be improved. In the transistor structure, the channel length of the transistor can be easily adjusted.

Furthermore, with a structure in which a region in the oxide semiconductor layer to be a channel is in contact with an insulator containing oxygen, oxygen can be supplied to the oxide semiconductor. Oxygen vacancies in the oxide semiconductor are filled with supplied oxygen, whereby the reliability of a transistor using the oxide semiconductor can be increased.

With the above structures, a transistor with high and stable electrical characteristics can be provided even when the transistor is miniaturized. Furthermore, the yield in mass production is increased and the manufacturing cost can be reduced.

Also in a semiconductor device including the transistor, high performance, high reliability, and high productivity can be achieved. Alternatively, a novel semiconductor device can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 13A to 13F are cross-sectional views illustrating one embodiment of a manufacturing method of a semiconductor device.

FIGS. 24A to 24D are cross-sectional views illustrating one embodiment of a manufacturing method of a semiconductor device.

FIGS. 47A1, 47A2, 47A3, 47B1, 47B2, and 47B3 are perspective views and cross-sectional views of semiconductor devices according to one embodiment of the present invention.

DETAILED DESCRIPTION OF THE INVENTION

Figure 1A:
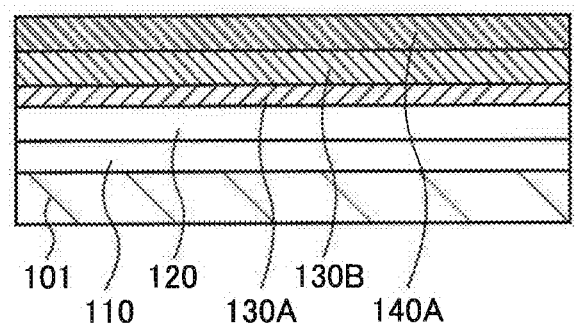
FIGS. 1A to 1H are cross-sectional views illustrating one embodiment of a manufacturing method of a semiconductor device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. The same hatching pattern is applied to portions having similar functions, and the portions are not especially denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification and the like, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source. Note that in this specification and the like, a channel region refers to a region through which current mainly flows.

Functions of a source and a drain are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductor, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductor, or a layer).

Even when independent components are electrically connected to each other in a circuit diagram, one component has functions of a plurality of components in some cases. For example, when part of a wiring also functions as an electrode, one conductor functions as the wiring and the electrode. Thus, the term "electrical connection" in this specification also means such a case where one conductor has functions of a plurality of components.

Embodiment 1

<Structural Example 1 of Semiconductor Device>

In this embodiment, an example of a method for manufacturing a semiconductor device is described with reference to FIGS. 1A to 1H, FIGS. 2A to 2F, FIGS. 3A to 3F, FIGS. 4A to 4D, and FIGS. 5A to 5C.

An example of a method for manufacturing the semiconductor device is described with reference to FIGS. 1A to 1H, FIGS. 2A to 2F, FIGS. 3A to 3F, FIGS. 4A to 4D, and FIGS. 5A to 5C.

First, a substrate 101 is prepared. Although there is no particular limitation on a substrate that can be used as the substrate 101, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used. Further alternatively, any of these substrates provided with a semiconductor element may be used.

Further alternatively, a flexible substrate may be used as the substrate to manufacture the semiconductor device. To manufacture a flexible semiconductor device, a transistor may be directly formed over a flexible substrate; or alternatively, a transistor may be formed over a substrate and then separated from the substrate and transferred to a flexible substrate. For separation of the transistor from the substrate and transfer to the flexible substrate, a separation layer may be provided between the substrate and the transistor including the oxide semiconductor.

Figure 1B:
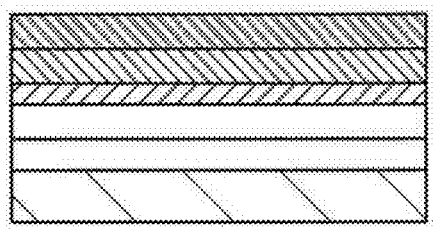

Next, as illustrated in FIGS. 1A and 1B, an insulator 110, an insulator 120, an oxide semiconductor 130A, an oxide semiconductor 130B, and a conductor 140A are formed.

First, the insulator 110 and the insulator 120 are formed over the substrate 101. Although the two-layer structure of the insulator 110 and the insulator 120 is described in this embodiment, the layered structure is not necessarily employed and at least one of the insulator 110 and the insulator 120 may be formed. Alternatively, a layered structure of three or more layers may be employed. The insulator 110 and the insulator 120 can be formed using, for example, a silicon oxide film, a silicon oxynitride film, a silicon nitride oxide film, a silicon nitride film, an aluminum oxide film, an aluminum oxynitride film, an aluminum nitride oxide film, an aluminum nitride film, a hafnium oxide film, a hafnium oxynitride film, a zirconium oxide film, a zirconium oxynitride film, an yttrium oxide film, a yttrium oxynitride film, a gallium oxide film, a gallium oxynitride film, a tantalum oxide film, a tantalum oxynitride film, or the like.

The substrate 101 may release gas or serve as a diffusion source of impurities. Furthermore, a semiconductor element or the like including impurities such as hydrogen and water is formed over the substrate 101 in some cases. In these cases, the insulator 110 or the insulator 120 preferably has a function of blocking such impurities.

In the oxide semiconductors such as the oxide semiconductor 130A and the oxide semiconductor 130B, impurities such as hydrogen and water cause a defect state in some cases. Therefore, the insulator 110 or the insulator 120 is preferably an insulator having a low hydrogen-transmitting property (i.e., a hydrogen barrier property) in some cases.

Because of its small atomic radius or the like, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include an inorganic insulator such as silicon oxide or silicon oxynitride and an organic insulator such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator having crystal grain boundaries can have a high hydrogen-transmitting property. In other words, hydrogen is less likely transmitted through an insulator having no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of a device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The electrical characteristics of a transistor including an oxide semiconductor are sometimes deteriorated by oxygen vacancies in the oxide semiconductor. Therefore, the insulator 110 and/or the insulator 120 is preferably an insulator containing excess oxygen. Note that excess oxygen means oxygen in an insulator or the like which does not bond with (which is liberated from) the insulator or the like or has low bonding energy with the insulator or the like.

Here, an insulator including excess oxygen may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis in the range of a surface temperature of 100° C. to 700° C. or 100° C. to 500° C.

The method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times\alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value Sot is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density of a signal attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

Note that an insulator having a low hydrogen-transmitting property is an insulator having a low oxygen-transmitting property in many cases. Therefore, it is preferable that an insulator having a low hydrogen-transmitting property be used as the insulator 110 and an insulator containing excess oxygen be used as the insulator 120. As described above, with the layered structure including the insulator 110 and the insulator 120, the electrical characteristics of the transistor including an oxide semiconductor can be improved.

The insulator 110 and the insulator 120 can be formed using a sputtering method, a chemical vapor deposition (CVD) method, (including a thermal CVD method, a metal organic CVD (MOCVD) method, a plasma-enhanced CVD (PECVD) method, and the like), a molecular beam epitaxy (MBE) method, an atomic layer deposition (ALD) method, a pulsed laser deposition (PLD) method, or the like. In particular, it is preferable that the insulators be formed by a CVD method, further preferably an ALD method, because coverage can be further improved. It is preferable to use a thermal CVD method, an MOCVD method, or an ALD method in order to reduce plasma damage. Alternatively, the insulators can also be formed using silicon films oxide with high step coverage that is formed by reacting tetraethyl orthosilicate (TEOS), silane, or the like with oxygen, nitrous oxide, or the like.

Next, excess oxygen may be contained in the insulator 110 and/or the insulator 120 by adding oxygen ions. The addition of oxygen ions may be performed by an ion implantation method at an acceleration voltage of greater than or equal to 2 kV and less than or equal to 50 kV at a dose of greater than or equal to $5 \times 10^{14}$ ions/cm$^2$ and less than or equal to $5 \times 10^{16}$ ions/cm$^2$, for example.

Next, the oxide semiconductor 130A and the oxide semiconductor 130B are formed. As the method for forming the oxide semiconductor 130A and the oxide semiconductor 130B, a sputtering method, a coating method, an MBE method, a CVD method, a PLD method, an ALD method, or the like can be used.

Note that excess oxygen may be contained in the oxide semiconductor 130A and/or the oxide semiconductor 130B by adding oxygen ions. The addition of oxygen ions may be performed by an ion implantation method at an acceleration voltage of greater than or equal to 2 kV and less than or equal to 50 kV at a dose of greater than or equal to $5 \times 10^{14}$ ions/cm$^2$ and less than or equal to $5 \times 10^{16}$ ions/cm$^2$, for example. Excess oxygen in the oxide semiconductor 130A and/or the oxide semiconductor 130B can reduce oxygen vacancies in the oxide semiconductor 130A and/or the oxide semiconductor 130B.

For example, in the case where the oxide semiconductor is deposited by a sputtering method, specifically, the substrate temperature is set to higher than or equal to 100° C. and lower than or equal to 500° C., preferably higher than or equal to 150° C. and lower than or equal to 450° C., and the percentage of oxygen in a deposition gas is set to higher than or equal to 2 vol %, preferably higher than or equal to 5 vol %, still further preferably higher than or equal to 10 vol %.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

Here, the case where an oxide semiconductor contains indium, an element M, and zinc is considered. Here, the element M is preferably aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M A favorable range of the atomic ratio of indium to the element M and zinc (x:y:z) of the oxide semiconductor is described with reference to FIGS. 26A and 26B.

Figure 26A:
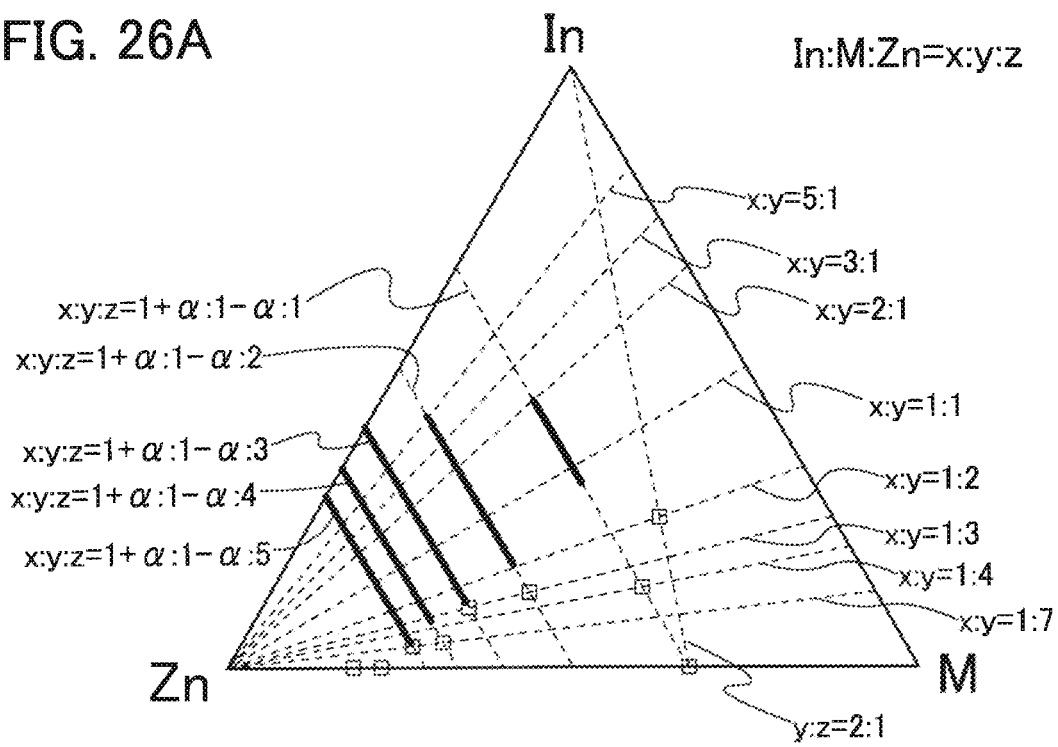
FIGS. 26A and 26B show atomic ratios of an oxide semiconductor of one embodiment of the present invention.
Figure 26B:
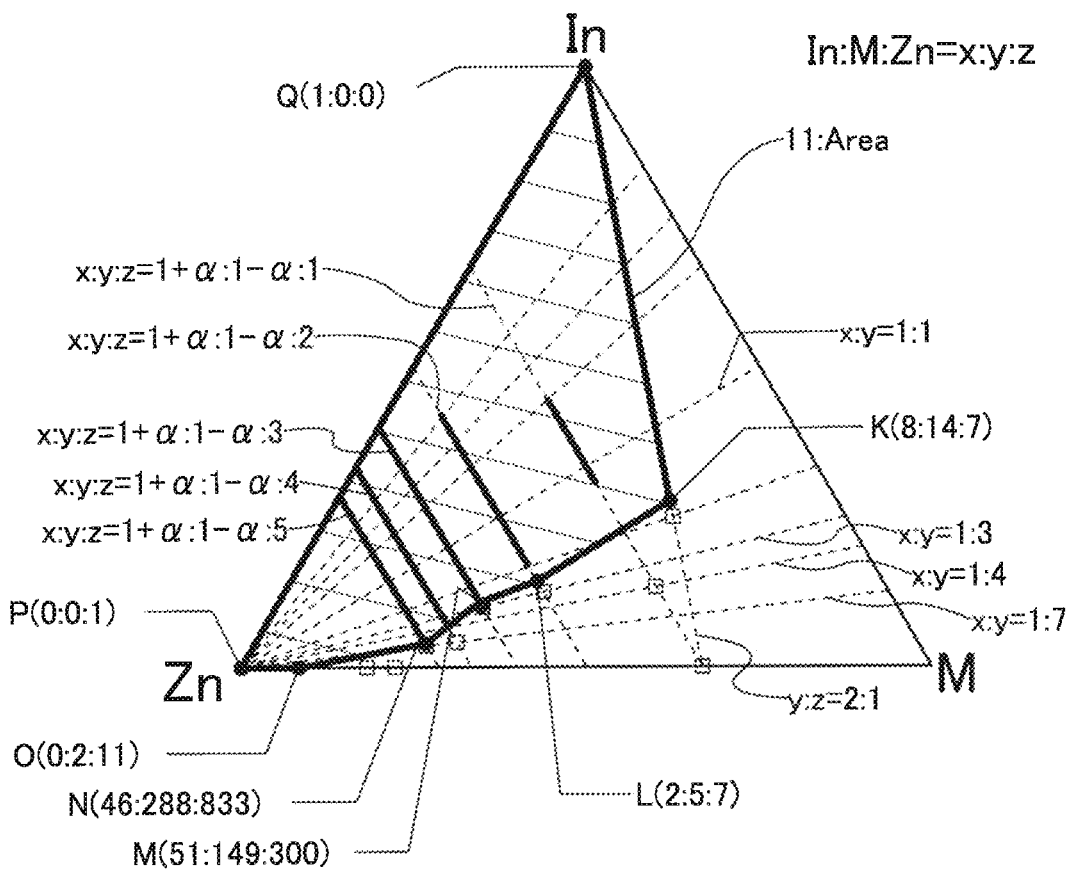

FIGS. 26A and 26B show the range of the atomic ratio of indium to the element M and zinc of the oxide semiconductor. Here, FIGS. 26A and 26B show an example in which the element M is Ga. Note that the proportion of oxygen atoms is not shown in FIGS. 26A and 26B.

For example, it is known that there is a homologous series represented by InMO$_3$(ZnO)$_m$ (m is a natural number) as one of oxides containing indium, the element M, and zinc. Here, for example, the case where the element M is Ga is considered. It is known that regions denoted by thick lines in FIGS. 26A and 26B indicate compositions which allow a single-phase solid solution range when powders of In$_2$O$_3$, Ga$_2$O$_3$, and ZnO are mixed and sintered at 1350° C., for example. Coordinates denoted by square symbols in FIGS. 26A and 26B correspond to known compositions with which a spinel crystal structure is likely to be mixed.

For example, a compound represented by ZnM$_2$O$_4$, such as ZnGa$_2$O$_4$, is known as a compound having a spinel crystal structure, for example. Furthermore, for example, when a composition is in the neighborhood of ZnGa$_2$O$_4$ as illustrated in FIGS. 26A and 26B, that is, the ratio of x toy and z is close to 0:2:1, a spinel crystal structure is likely to be formed. The element M is substituted with In in some cases. Thus, a spinel crystal structure is likely to be formed also in the case where the ratio of x toy and z is close to a:1-a:2 (a is greater than or equal to 0 and less than or equal to 1).

Here, the oxide semiconductor is preferably a CAAC-OS film. Specifically, the CAAC-OS film having no spinel crystal structure is preferred. In addition, to increase carrier mobility, the indium content is preferably increased. In an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby the carrier mobility can be increased.

Accordingly, the atomic ratio of indium to the element M and zinc, x:y:z, of the oxide semiconductor is preferably within the range of an area 11 shown in FIG. 26B, for example. Here, the area 11 includes atomic ratios within the range of an area surrounded by line segments that connect first coordinates K (x:y:z=8:14:7), second coordinates L (x:y:z=2:5:7), third coordinates M (x:y:z=51:149:300), fourth coordinates N (x:y:z=46:288:833), fifth coordinates O (x:y:z=0:2:11), sixth coordinates P (x:y:z=0:0:1), seventh coordinates Q (x:y:z=1:0:0) and the first coordinates K, in this order. Note that the area 11 also includes coordinates positioned on the straight line.

When x:y:z is within the area 11 in FIG. 26B, a spinel crystal structure is not observed or is hardly observed by nanobeam diffraction. Thus, an excellent CAAC-OS film can be obtained. Furthermore, carrier scattering or the like at the boundary between a CAAC structure and a spinel crystal structure can be reduced; therefore, when the oxide semiconductor is used for a transistor, the transistor can have high field-effect mobility. In addition, the transistor can have high reliability.

In the case where the oxide semiconductor is formed by a sputtering method, a film having an atomic ratio deviated from the atomic ratio of the target is formed in some cases. Especially for zinc, the proportion of zinc atoms of a deposited film is smaller than that of zinc atoms of the target in some cases. Specifically, the proportion of zinc atoms of the film may be approximately 40% to 90% of the proportion of zinc atoms of the target. The target used here is preferably polycrystalline.

Although the two-layer structure of the oxide semiconductor 130A and the oxide semiconductor 130B is described in this embodiment, a single layer or a layered structure of n layers (n is three or more) may be employed.

For example, when a second semiconductor is formed over a first semiconductor in which impurities are reduced, the second semiconductor can have fewer impurities than the first semiconductor and prevent diffusion of impurities from layers positioned below the second semiconductor. In the case where a layer is additionally stacked over the oxide semiconductor in a subsequent step, forming a third semiconductor with a small thickness over the second semiconductor can prevent diffusion of impurities from the upper layer of the oxide semiconductor to the second semiconductor. By using a transistor formed so that the second semiconductor in which impurities are reduced serves as a channel region, a highly reliable semiconductor device can be provided.

The thickness of the oxide semiconductor is greater than or equal to 1 nm and less than or equal to 500 nm, preferably greater than or equal to 1 nm and less than or equal to 300 nm, for example.

After the oxide semiconductor 130A and the oxide semiconductor 130B are deposited, heat treatment is preferably performed. The heat treatment is preferably performed at a temperature of higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here can remove impurities such as hydrogen and water from the oxide semiconductor 130A and the oxide semiconductor 130B. Furthermore, by this heat treatment, oxygen can be supplied from the insulator 120 to the oxide semiconductor 130A and the oxide semiconductor 130B. At this time, the insulator 120 preferably contains excess oxygen, in which case oxygen can be supplied efficiently to the oxide semiconductors.

Next, the conductor 140A is formed over the oxide semiconductor 130B. Although a single-layer structure is described here, the conductor 140A may have a stacked-layer structure of two or more layers.

As the conductor 140A, a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used. Alternatively, a semiconductor typified by a polycrystalline silicon doped with an impurity element such as phosphorus, or a silicide film such as a nickel silicide may be used as the conductor 140A. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Moreover, the conductor 140A can have a stacked structure of the above conductive material and the above metal material. For example, a 5-nm-thick titanium film, a 10-nm-thick titanium nitride film, and a 100-nm-thick tungsten film may be stacked.

The conductor 140A can be formed by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage.

Figure 1C:
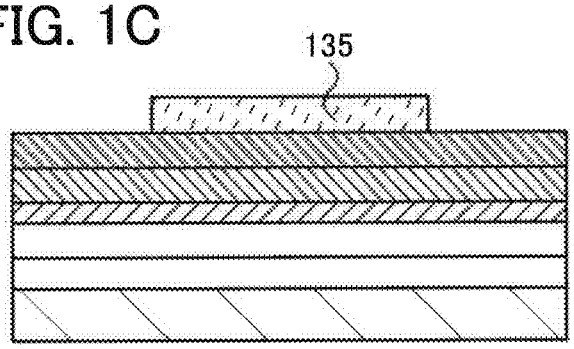
Figure 1D:
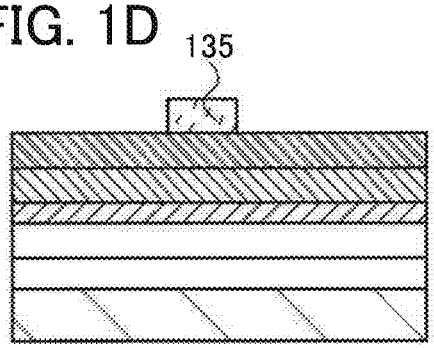
Figure 1E:
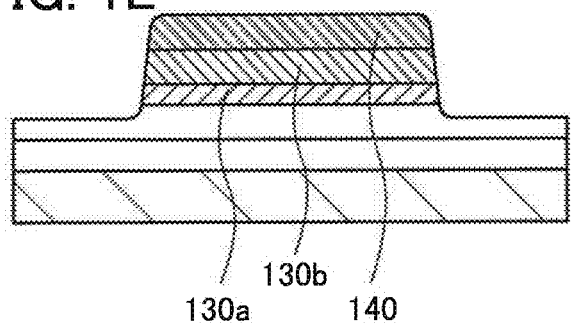
Figure 1F:
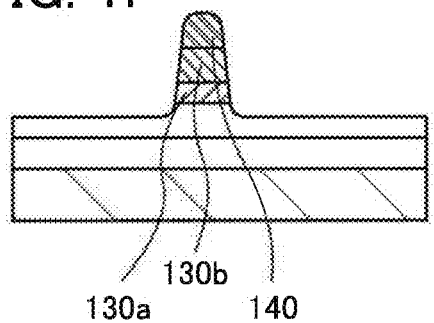

Next, as illustrated in FIGS. 1C and 1D, a resist mask 135 is formed over the conductor 140A by a lithography method or the like, and unnecessary portions of the oxide semiconductor 130A, the oxide semiconductor 130B, and the conductor 140A are removed. After that, the resist mask 135 is removed, so that the oxide semiconductor 130a, the oxide semiconductor 130b, and the conductor 140 having an island-shape illustrated in FIGS. 1E and 1F can be formed.

A method for processing a film is described. In the case of finely processing a film, a variety of fine processing techniques can be used. For example, a method may be used in which a resist mask formed by a lithography process or the like is subjected to slimming treatment. Alternatively, a dummy pattern is formed by a lithography process or the like, the dummy pattern is provided with a sidewall and then removed, and a film is etched using the remaining sidewall as a resist mask. To achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As light for the exposure, extreme ultra-violet light (EUV) or electromagnetic waves such as X rays or an electron beam may be used. It is preferable to use EUV, X-rays, or an electron beam because extremely minute processing can be performed. Note that in the case of performing exposure by scanning of a beam such as an electron beam, a photomask is not needed.

Before a resist film that is processed into the resist mask is formed, an organic resin film having a function of improving adhesion between a film and the resist film may be formed. The organic resin film can be formed by, for example, a spin coating method to planarize a surface by covering a step thereunder and thus can reduce variation in thickness of the resist mask over the organic resin film. In the case of fine processing, in particular, a material serving as an anti-reflection film against light for the exposure is preferably used for the organic resin film. Examples of such an organic resin film serving as an anti-reflection film include a bottom anti-reflection coating (BARC) film. The organic resin film may be removed at the same time as the removal of the resist mask or after the removal of the resist mask.

Figure 1G:
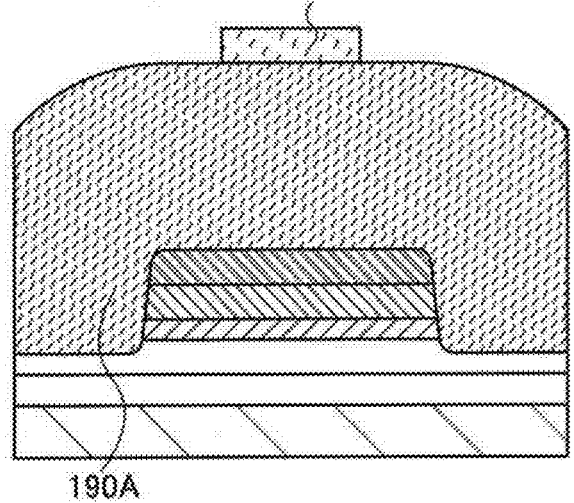
Figure 1H:
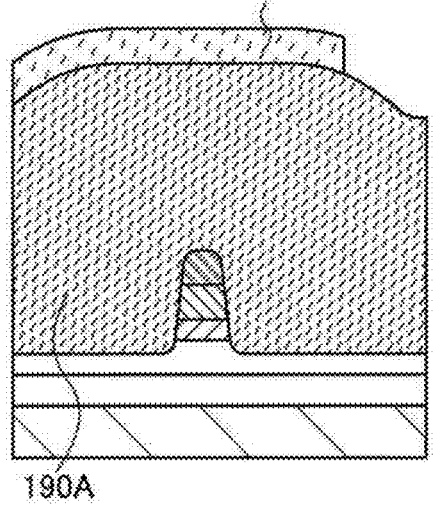
Figure 2A:
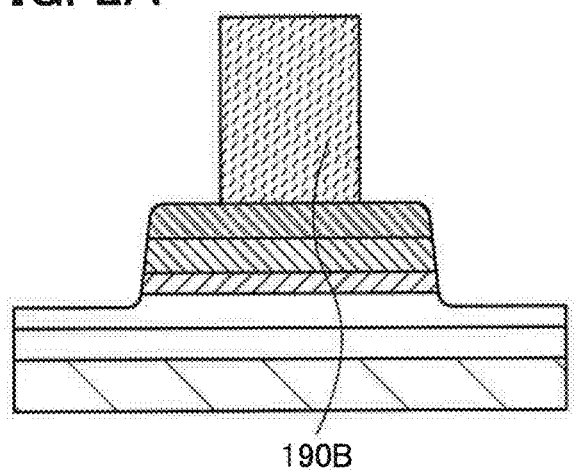
FIGS. 2A to 2F are cross-sectional views illustrating one embodiment of a semiconductor device.
Figure 2B:
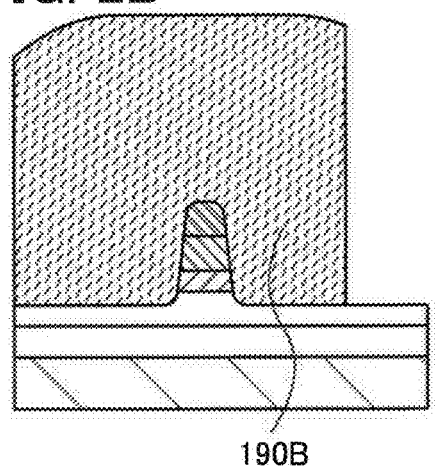
Figure 2C:
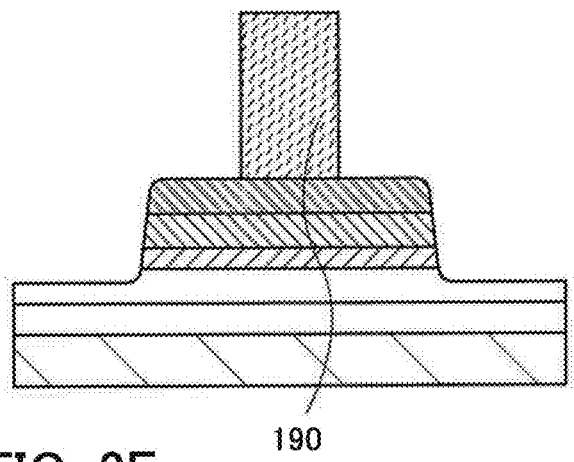
Figure 2D:
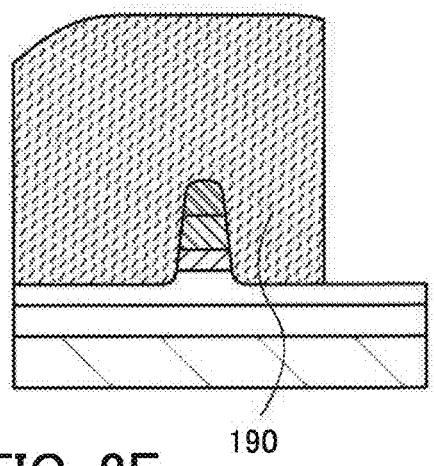

Next, as illustrated in FIGS. 2C and 2D, a sacrificial layer 190 is formed. After a film 190A to be the sacrificial layer 190 is formed as illustrated in FIGS. 1G and 1H, a resist mask 195 is formed in a manner similar to the above and unnecessary portions of the film 190A are removed, so that a sacrificial layer 190B is formed as illustrated in FIGS. 2A and 2B. Next, the sacrificial layer 190B is made slightly smaller by wet etching, whereby the sacrificial layer 190 is formed. When polycrystalline silicon is used as a material of the sacrificial layer 190, TMAH (a tetramethyl ammonium hydroxide) at 2 wt % to 40 wt %, preferably 20 wt % to 25 wt % may be used for the etching. This wet etching enables further miniaturization of the transistor.

Note that the sacrificial layer 190 is not necessarily formed from the sacrificial layer 190B, and the subsequent step may be performed with the sacrificial layer 190B used as the sacrificial layer 190. In that case, etching is performed while the resist mask 195 recedes, whereby the sacrificial layer 190 can be formed into a smaller pattern than the resist mask 195. Note that the sacrificial layer 190 preferably has a side surface substantially perpendicular to the formation surface because its shape affects the shape of a conductor 160 that is formed later.

It is acceptable as long as the etching rate of the film 190A is different from that of the conductor 140 or the like. Thus, the film 190A may be a conductor, a semiconductor, or an insulator. Furthermore, the film 190A may be an organic substance or an inorganic substance. The film 190A may be an insulator, a semiconductor, or a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Since etching selectivity can be easily obtained, a silicon film, a chromium film, a molybdenum film, a tungsten film, a zinc oxide film, or a molybdenum oxide film is preferably used. Note that the film 190A may be formed using the same conductor as the conductor 140. In that case, the film 190A is formed so as to have an etching rate higher than that of the conductor 140.

Furthermore, the film 190A may have a stacked-layer structure. For example, the film 190A may have a stacked-layer structure in which a first film to be a first sacrificial layer and a second film to be a second sacrificial layer, which have different etching characteristics, are stacked in this order. In that case, after the second film to be the second sacrificial layer is etched, the first film to be the first sacrificial layer is etched using the second sacrificial layer. For this reason, the etching rate of the first film to be the first sacrificial layer should be different from that of the conductor 140 or the like. That is, the etching rate of the second film to be the second sacrificial layer may be close to that of the conductor 140 or the like. Since the first sacrificial layer becomes thinner than the whole thickness of the designed sacrificial layer 190, a difference in shape due to the progress of etching can be reduced. Furthermore, the sacrificial layer 190 can be formed in such a manner that the second sacrificial layer is formed to have a top shape similar to that of the sacrificial layer 190B, and then the second sacrificial layer is reduced in size by wet etching or the like while the conductor 140 and the like are protected by the first sacrificial layer.

Figure 2E:
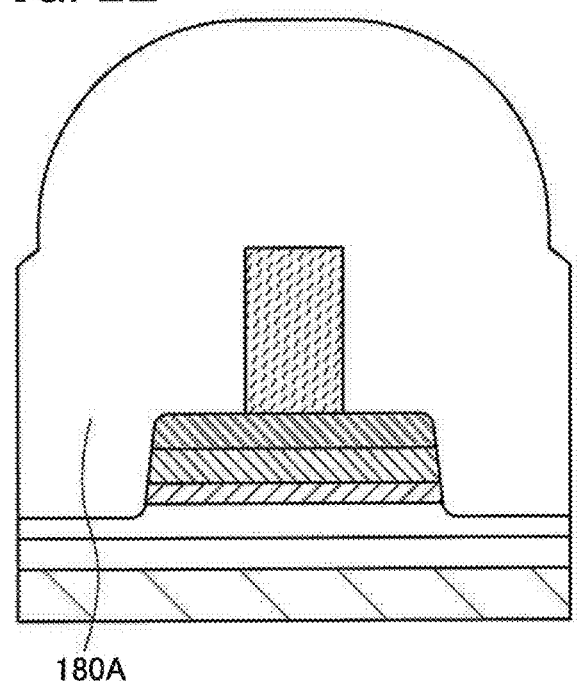
Figure 2F:
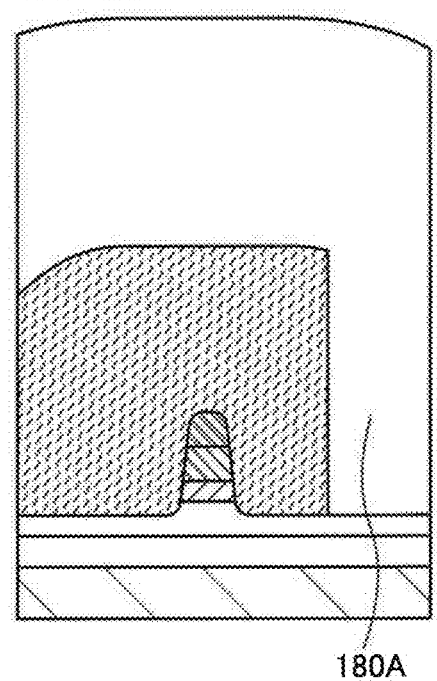

Next, an insulator 180A is formed over the conductor 140 and the sacrificial layer 190 as illustrated in FIGS. 2E and 2F. The insulator 180A is an insulator containing oxygen, such as a silicon oxide film or a silicon oxynitride film. Note that the insulator 180A may be an insulator which does not contain oxygen as a main component. For example, a silicon nitride film or the like may be used.

Note that the insulator 180A preferably contains excess oxygen. The insulator containing excess oxygen can be formed using a silicon oxide film or a silicon oxynitride film containing a large amount of oxygen as a result of film formation by a CVD method or a sputtering method under the conditions which are set as appropriate. After the silicon oxide film or a silicon oxynitride film is formed, oxygen may be added by an ion implantation method, an ion doping method, or plasma treatment.

Figure 3A:
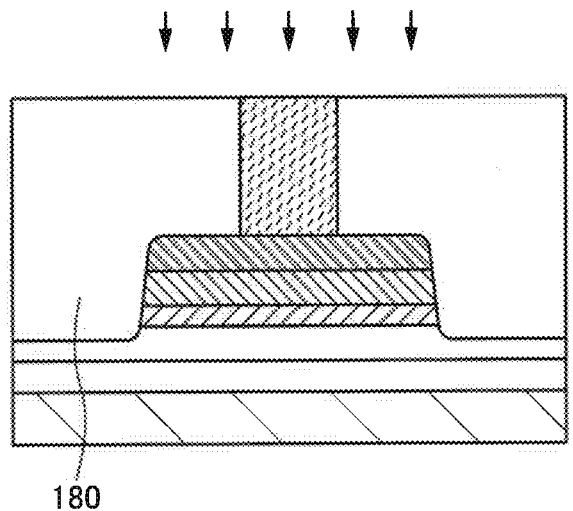
FIGS. 3A to 3F are cross-sectional views illustrating one embodiment of a manufacturing method of a semiconductor device.
Figure 3B:
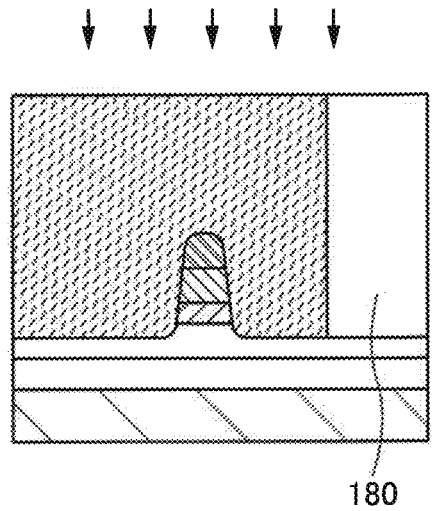

As illustrated in FIGS. 3A and 3B, part of the insulator 180A is removed to expose the sacrificial layer 190 by chemical mechanical polishing (CMP) treatment as indicated by arrows, so that an insulator 180 is formed. Here, the sacrificial layer 190 can be used as a stopper layer and the thickness of the sacrificial layer 190 is reduced in some cases. Note that the CMP treatment is performed under such a condition that the root-mean-square (RMS) roughness of a surface of the insulator 180A becomes 1 nm or less (preferably 0.5 nm or less). By the CMP treatment performed under such a condition, the planarity of a surface where a wiring and the like are formed later can be improved.

The CMP treatment is treatment for planarizing a surface of an object to be processed by a combination of chemical and mechanical actions. More specifically, the CMP process is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP treatment may be performed only once or plural times. When the CMP treatment is performed plural times, it is preferable that first polishing be performed at a high polishing rate and final polishing be performed at a low polishing rate. By polishing with different polishing rates, the planarity of the insulator 180 can be further improved.

Figure 3C:
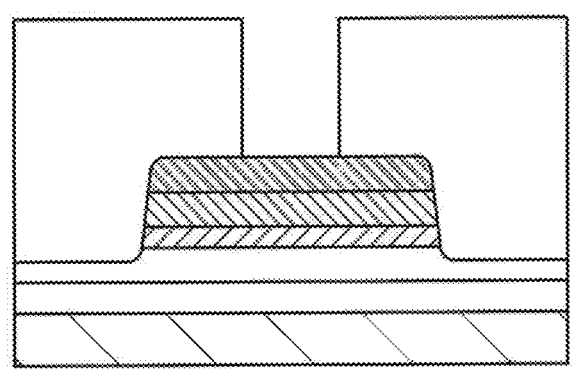
Figure 3D:
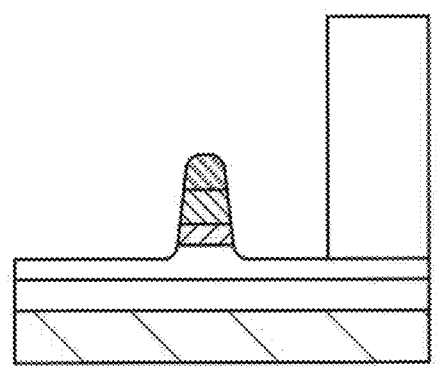

Next, the sacrificial layer 190 is selectively etched to form an opening as illustrated in FIGS. 3C and 3D. In the step of removing the sacrificial layer 190, a wet etching method is preferably used. When polycrystalline silicon is used as a material of the sacrificial layer 190, TMAH (a tetramethyl ammonium hydroxide) at 2 wt % to 40 wt %, preferably 20 wt % to 25 wt % may be used for the etching.

As the etching depth gets deep, undercut, corrosion which proceeds under a mask, occurs in some cases. In contrast, the sacrificial layer 190 embedded in the insulator 180 is removed in this step. Thus, as long as the etching rate of the insulator 180 is different from that of the sacrificial layer 190, undercut does not occur even when the etching depth is deep. Therefore, fine processing with a high aspect ratio can be performed accurately.

A wet etching method allows the etching selectivity to be increased more easily than a dry etching method. Furthermore, the wet etching method causes less damage due to etching because plasma is not used. In addition, treatment can be performed on a large number of substrates at a time, whereby an increase in productivity can be achieved. In addition, manufacturing devices and chemicals in the wet etching method are generally cheaper than those in the dry etching method, so that a manufacturing cost can be reduced.

Figure 3E:
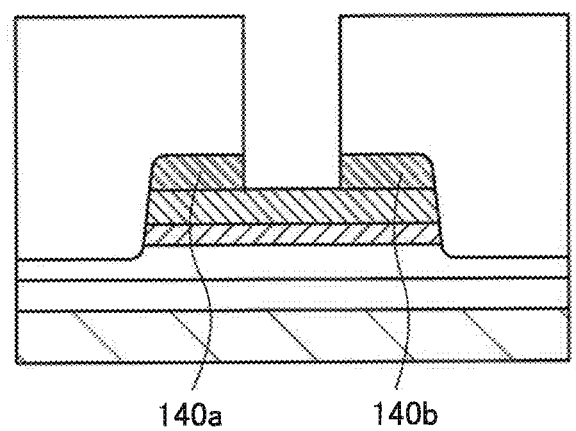
Figure 3F:
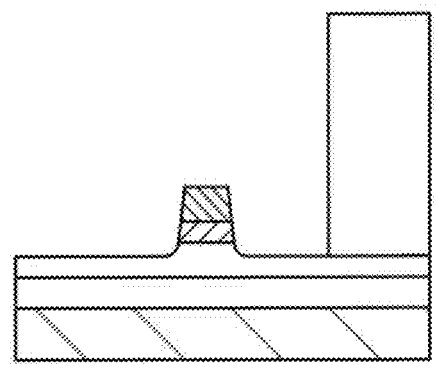

Next, part of the conductor 140 is removed with use of the insulator 180 as a mask, whereby an opening is formed at the same time as the conductor 140a and the conductor 140b as illustrated in FIGS. 3E and 3F.

Figure 4A:
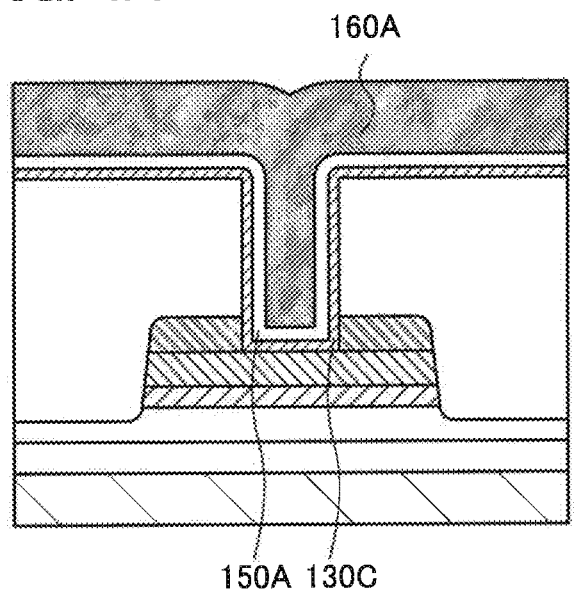
FIGS. 4A to 4D are cross-sectional views illustrating one embodiment of a manufacturing method of a semiconductor device.
Figure 4B:
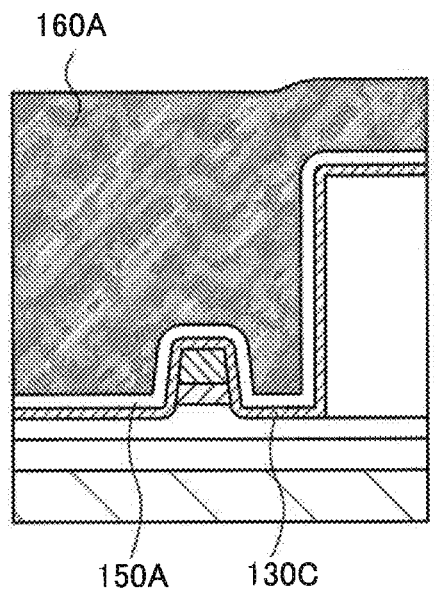

Next, as illustrated in FIGS. 4A and 4B, an oxide semiconductor 130C, an insulator 150A, and a conductor 160A are formed.

The oxide semiconductor 130C can be formed in a similar manner to that of the oxide semiconductor 130A and the oxide semiconductor 130B. Note that the thickness of the oxide semiconductor 130C is preferably as small as possible to increase the on-state current of the transistor. For example, the oxide semiconductor 130C has a region with a thickness of less than 20 nm, preferably less than or equal to 10 nm, more preferably less than or equal to 5 nm. Meanwhile, the oxide semiconductor 130C has a function of blocking entry of elements other than oxygen (such as hydrogen and silicon) included in the adjacent insulator into the oxide semiconductor 130b where a channel is formed. For this reason, it is preferable that the oxide semiconductor 130C have a certain thickness. For example, the oxide semiconductor 130C may have a region with a thickness of greater than or equal to 0.3 nm, preferably greater than or equal to 1 nm, more preferably greater than or equal to 2 nm. The oxide semiconductor 130C preferably has an oxygen blocking property to suppress outward diffusion of oxygen released from the substrate 101, or an insulator or the like between the substrate 101 and the oxide semiconductor 130b.

The insulator 150A has a thickness greater than or equal to 1 nm and less than or equal to 20 nm and can be formed by a sputtering method, an MBE method, a CVD method, a pulsed laser deposition method, an ALD method, or the like as appropriate. The insulator 150A may also be formed with a sputtering apparatus which performs film formation in the state where surfaces of a plurality of substrates are substantially perpendicular to a surface of a sputtering target. Alternatively, an MOCVD method may be employed. For example, a gallium oxide film deposited by an MOCVD method can be used as the insulator 150A.

The insulator 150A can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film. Note that the insulator 150A preferably contains oxygen in a portion in contact with the oxide semiconductor 130C. In particular, the insulator 150A preferably contains an amount of oxygen which exceeds the stoichiometric composition in the film (bulk). In this embodiment, a silicon oxynitride film formed by a CVD method is used as the insulator 150A. By using a silicon oxynitride film containing excess oxygen as the insulator 150A, oxygen can be supplied to the oxide semiconductor 130b through the oxide semiconductor 130C, leading to good characteristics. Furthermore, the insulator 150A is processed into an insulator 150 in a later step; thus formation of the insulator 150A is preferably performed in consideration of the size or the like, of the transistor that is to be formed.

Alternatively, the insulator 150A can be formed using a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate ($HfAl_xO_y$ (x>0, y>0)), or lanthanum oxide. Note that the insulator 150A may have either a single-layer structure or a stacked structure.

The conductor 160A can be formed using a sputtering method, an evaporation method, a CVD method, or the like. The conductor 160A can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor typified by polycrystalline silicon doped with an impurity element such as phosphorus, or a silicide such as a nickel silicide may be used for the conductor 160A. The conductor 160A can also be formed using a conductive material, such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added. Moreover, the conductor 160A can have a stacked structure of the above conductive material and the above metal material. For example, a 5-nm-thick titanium film, a 10-nm-thick titanium nitride film, and a 100-nm-thick tungsten film may be stacked.

Figure 4C:
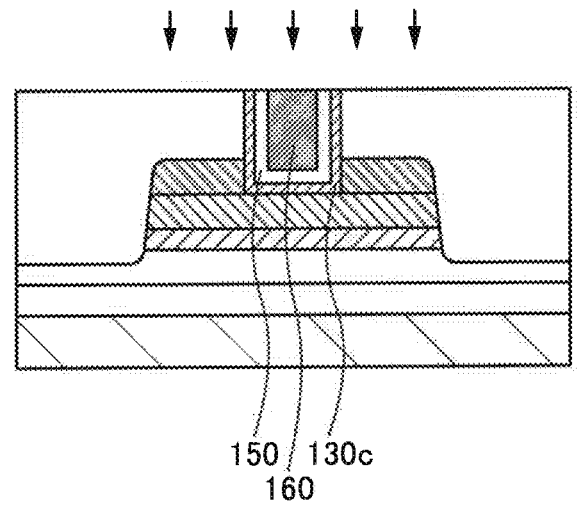
Figure 4D:
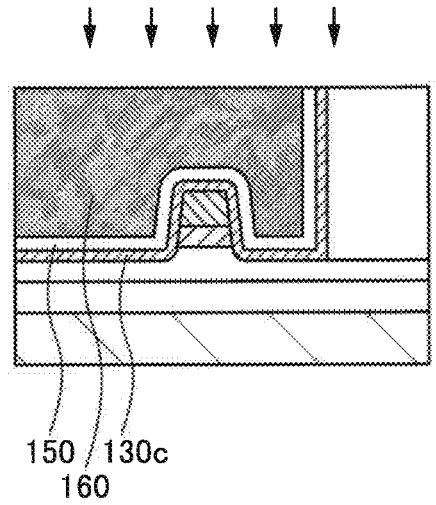

Next, part of the conductor 160A, the insulator 150A, and the oxide semiconductor 130C is removed to expose the insulator 180 by CMP treatment or the like, whereby the oxide semiconductor 130c, an insulator 150, and a conductor 160 are formed (see FIGS. 4C and 4D). Here, the insulator 180 can be used as a stopper layer and the thickness of the insulator 180 is reduced in some cases.

Note that CMP treatment may be performed only once or plural times. When CMP treatment is performed plural times, it is preferable that first polishing be performed at a high polishing rate and final polishing be performed at a low polishing rate. By performing polishing steps with different polishing rates in combination, the planarity of the polished surface can be further increased.

Figure 5A:
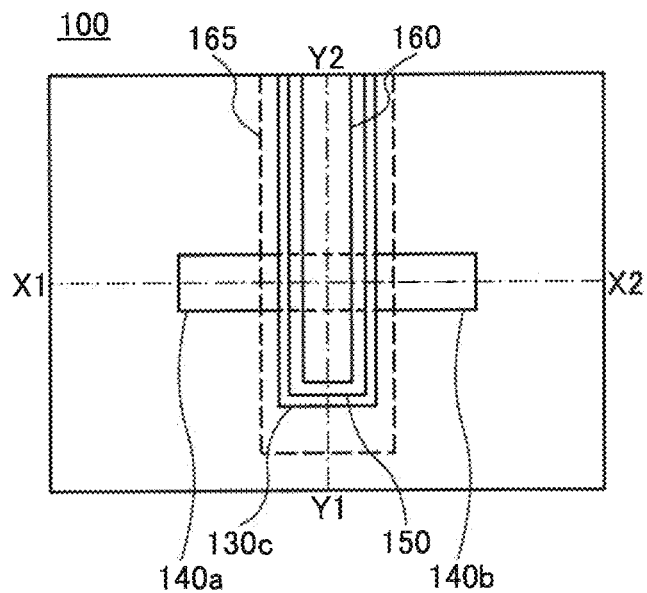
FIGS. 5A to 5C are a top view and cross-sectional views illustrating one embodiment of a semiconductor device.
Figure 5B:
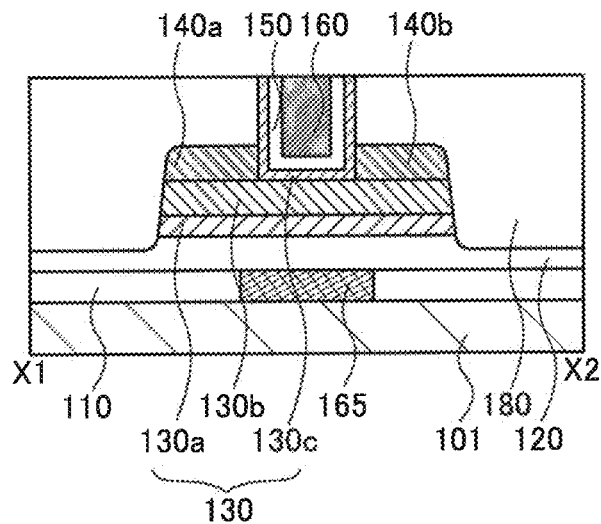
Figure 5C:
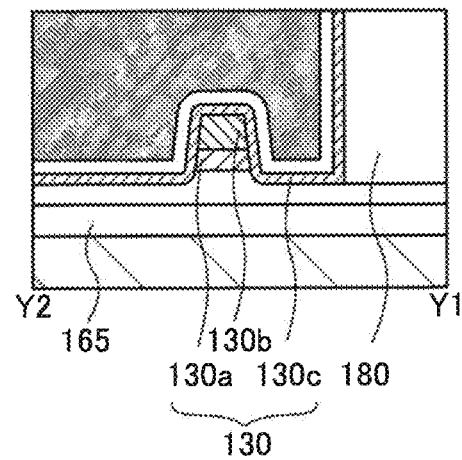

Through the above process, a transistor 100 illustrated in FIGS. 5A to 5C can be manufactured. FIG. 5A illustrates an example of a top view of the transistor 100. FIG. 5B is a cross-sectional view taken along dashed-dotted line X1-X2 in FIG. 5A, and FIG. 5C is a cross-sectional view take along dashed-dotted line Y1-Y2 in FIG. 5A. Note that the transistor 100 may include a conductor 165 as illustrated in FIGS. 5A to 5C. The conductor 165 can be provided in such a manner that the conductor 165 is formed over the substrate 101, the insulator 110 is formed thereon, and then part of the insulator 110 is removed to expose the conductor 165 by CMP treatment or the like. Since the difference in height due to the conductor 165 is reduced by performing CMP treatment, a shape defect of the transistor 100 is reduced and the reliability can be improved.

In the transistor 100, an oxide semiconductor 130 includes the oxide semiconductor 130a, the oxide semiconductor 130b, and the oxide semiconductor 130c. The oxide semiconductor 130b serves as a channel formation region. The conductor 140a and the conductor 140b serve as a source electrode and a drain electrode. The insulator 150 serves as a gate insulator. The conductor 160 serves as a first gate electrode. The conductor 165 serves as a second gate electrode.

In this embodiment, the transistor 100 having a miniaturized structure can be manufactured. Since the transistor 100 has a structure in which the conductor 140a and the conductor 140b hardly overlap with the conductor 160, the parasitic capacitance generated between the conductor 160 and the conductors 140a and 140b can be reduced. That is, the operation frequency of the transistor 100 is high. In addition, the insulator 150 serving as a gate insulator and the conductor 160 serving as a gate electrode are formed in the opening formed using the sacrificial layer 190, whereby variation in channel lengths between transistors formed in the same process can be reduced.

Furthermore, the width of the conductor 160 which is formed can be thinner than that of the sacrificial layer 190. Therefore, the gate electrode can be formed more stably than the case where a gate electrode with the same width is directly formed by a lithography method. Although a gate electrode with a too small width is broken in some cases, for example, the gate electrode of the transistor of one embodiment of the present invention is less likely to be broken. Also, the thickness of the conductor 160 serving as a gate electrode can be large. Specifically, the thickness of the conductor 160 can be greater than or equal to twice, preferably greater than or equal to three times, or further preferably greater than or equal to 4 times the width of the conductor 160. By making the thickness of the conductor 160 large, the resistance of the conductor 160 can be lowered and the operation speed of the transistor can be improved.

Thus, a miniaturized transistor having stable electrical characteristics and a high operation speed can be provided. Further, with use of the transistor, a highly integrated semiconductor device in which variation between the transistors is small can be provided.

The structures, the methods, and the like described in this embodiment can be combined as appropriate with any of the structures, the methods, and the like described in the other embodiments.

Embodiment 2

<Modification Example 1 of Semiconductor Device>

In this embodiment, modification examples of the transistor 100 will be described with reference to FIGS. 6A to 6F, FIGS. 7A to 7F, FIGS. 8A to 8F, FIGS. 9A to 9C, and FIGS. 10A to 10C. An example of a method for manufacturing the semiconductor device in this embodiment is described with reference to FIGS. 6A to 6F, FIGS. 7A to 7F, FIGS. 8A to 8F, and FIGS. 9A to 9D. Note that the transistor 100 in Embodiment 1 can be referred to for components denoted by the same reference numerals as those in the transistor 100.

Figure 6A:
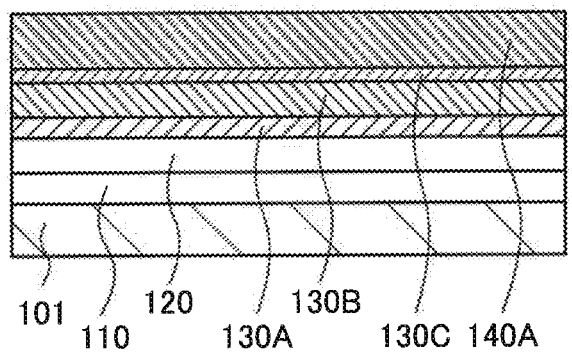
FIGS. 6A to 6F are cross-sectional views illustrating one embodiment of a manufacturing method of a semiconductor device.
Figure 6B:
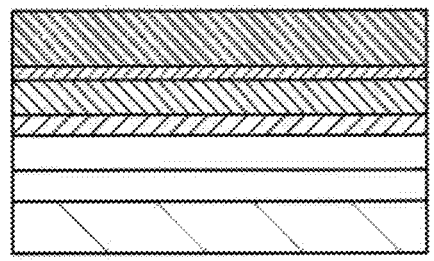

First, as illustrated in FIGS. 6A and 6B, the insulator 110, the insulator 120, the oxide semiconductor 130A, the oxide semiconductor 130B, the oxide semiconductor 130C, and the conductor 140A are formed over the substrate 101.

Figure 6C:
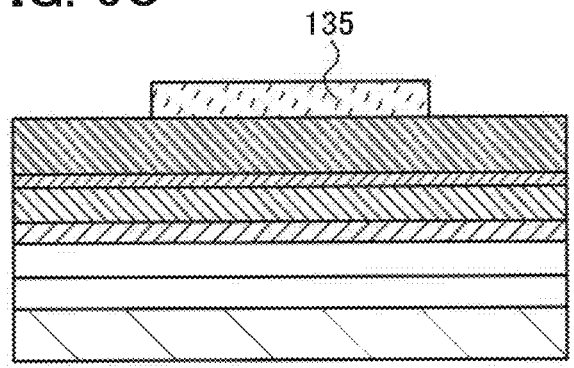
Figure 6D:
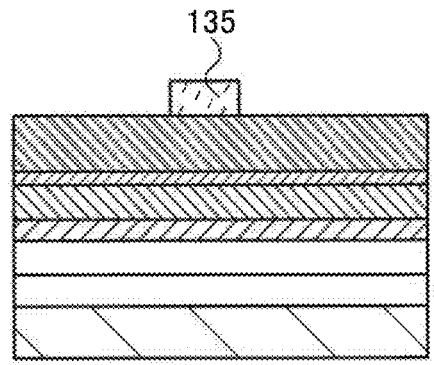
Figure 6E:
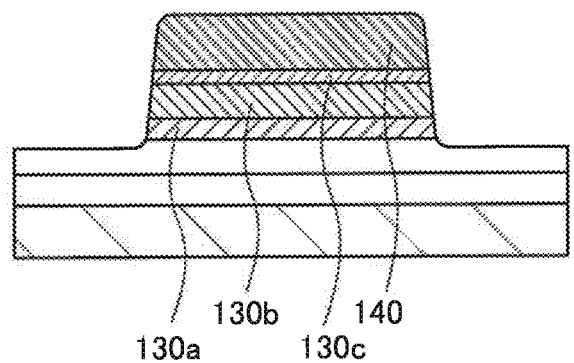
Figure 6F:
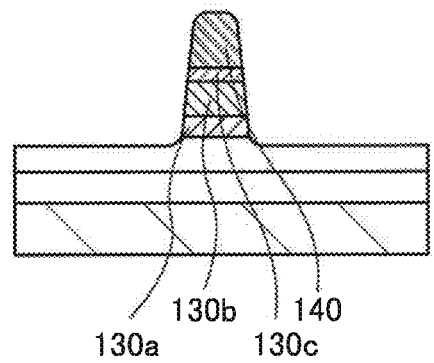

Next, as illustrated in FIGS. 6C and 6D, the resist mask 135 is formed over the conductor 140A by a lithography method or the like, and unnecessary portions of the oxide semiconductor 130A, the oxide semiconductor 130B, the oxide semiconductor 130C, and the conductor 140A are removed. After that, the resist mask 135 is removed, so that the oxide semiconductor 130a, the oxide semiconductor 130b, the oxide semiconductor 130c, and the conductor 140 having an island-shape illustrated in FIGS. 6E and 6F can be formed.

Figure 7A:
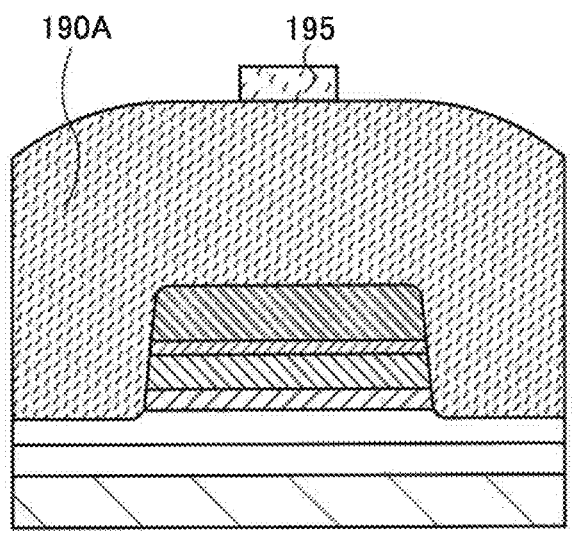
FIGS. 7A to 7F are cross-sectional views illustrating one embodiment of a manufacturing method of a semiconductor device.
Figure 7B:
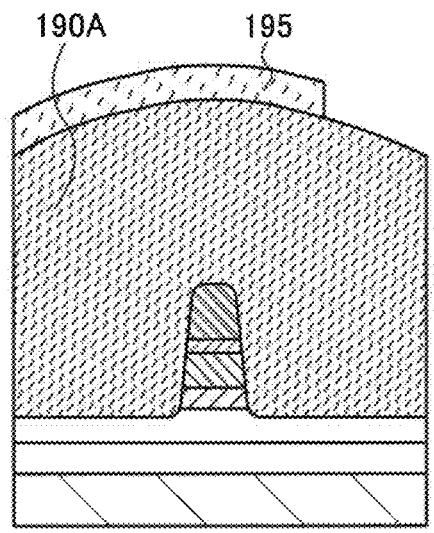
Figure 7C:
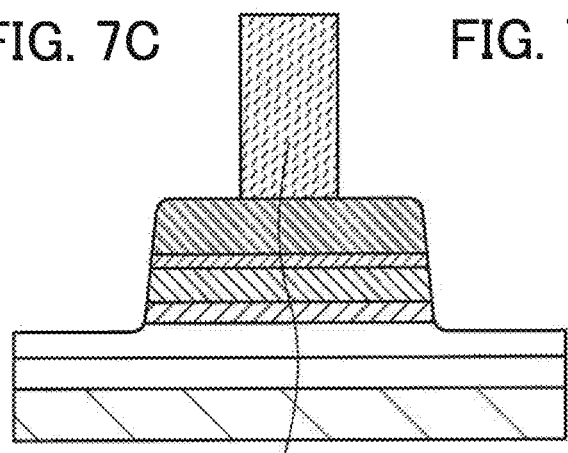
Figure 7D:
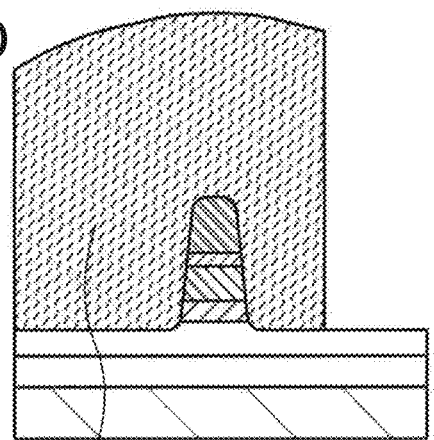

Next, as illustrated in FIGS. 7C and 7D, the sacrificial layer 190 is formed. After the film 190A to be the sacrificial layer 190 is formed as illustrated in FIGS. 7A and 7B, the resist mask 195 is formed in a manner similar to the above and unnecessary portions of the film 190A are removed, so that the sacrificial layer 190 is formed. Note that the sacrificial layer 190 preferably has a side surface substantially perpendicular to the formation surface because its shape affects the shape of a conductor 160 that is formed later.

Figure 7E:
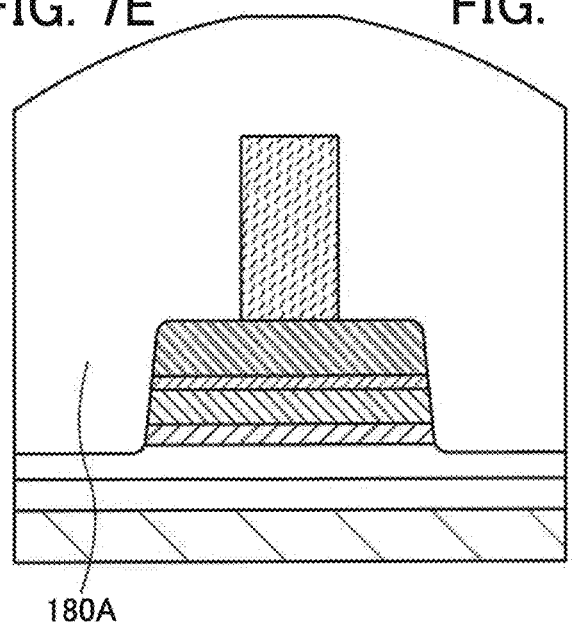
Figure 7F:
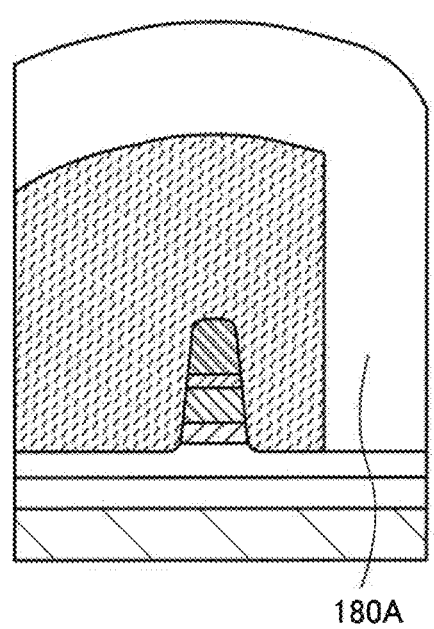
Figure 8A:
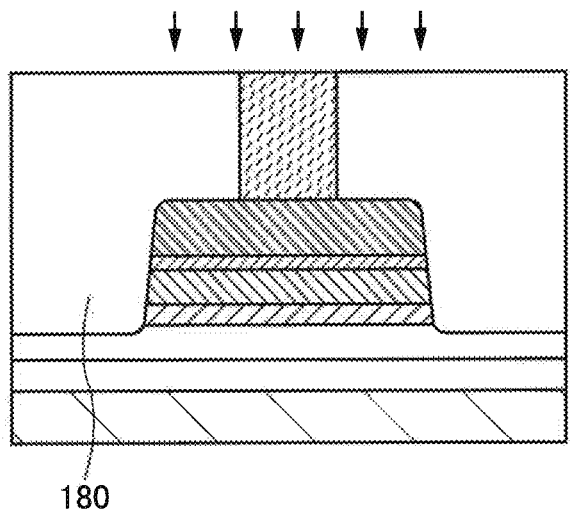
FIGS. 8A to 8F are cross-sectional views illustrating one embodiment of a manufacturing method of a semiconductor device.
Figure 8B:
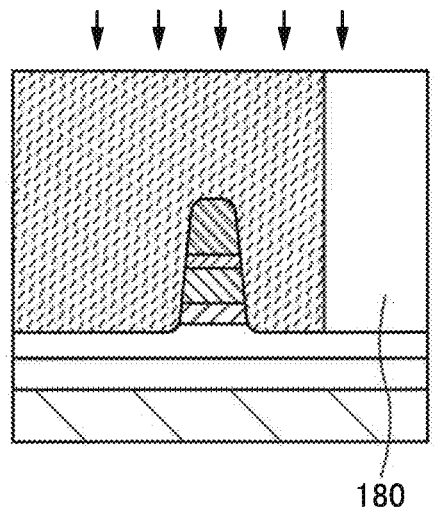

Next, the insulator 180A is formed over the conductor 140 and the sacrificial layer 190 as illustrated in FIGS. 7E and 7F. Then, as illustrated in FIGS. 8A and 8B, part of the insulator 180A is removed to expose the sacrificial layer 190 by CMP treatment or the like, so that the insulator 180 is formed. Note that the CMP treatment may be performed only once or plural times. When the CMP treatment is performed plural times, it is preferable that first polishing be performed at a high polishing rate and final polishing be performed at a low polishing rate. By polishing with different polishing rates, the planarity of the insulator 180 can be further improved.

Figure 8C:
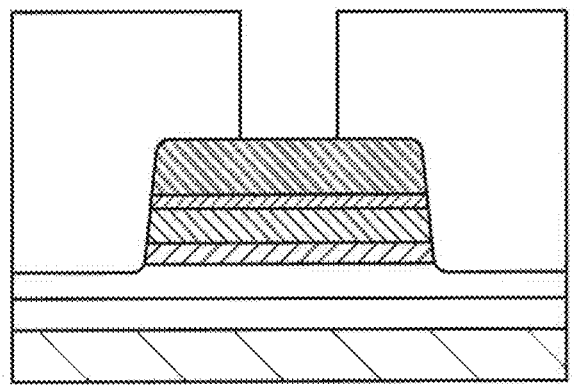
Figure 8D:
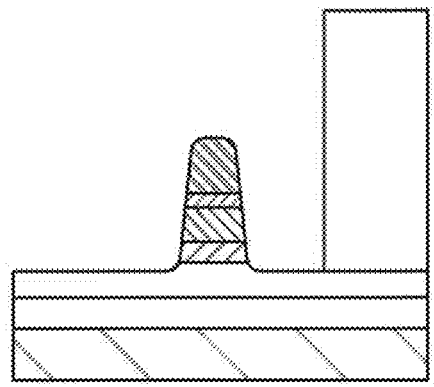

Next, the sacrificial layer 190 is selectively etched to form an opening as illustrated in FIGS. 8C and 8D. In the step of removing the sacrificial layer 190, a wet etching method is preferably used.

Figure 8E:
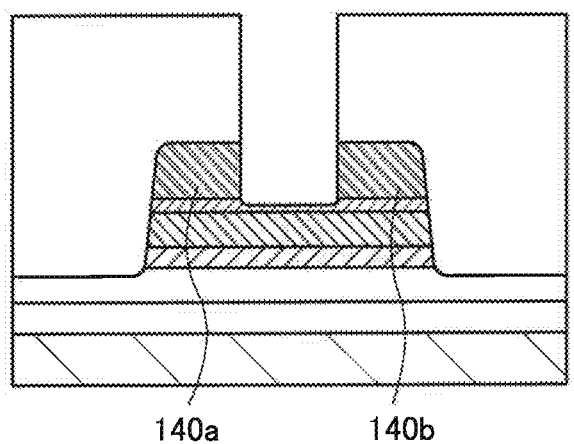
Figure 8F:
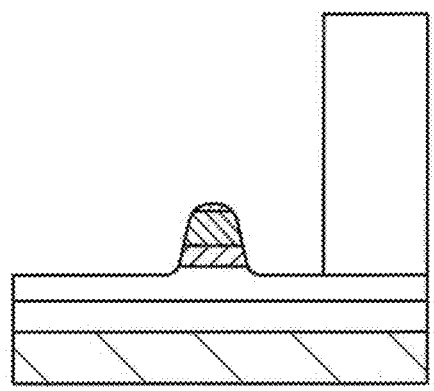

Next, part of the conductor 140 is removed with use of the insulator 180 as a mask, whereby the conductor 140a, the conductor 140b, and an opening are formed as illustrated in FIGS. 8E and 8F. In the structure of the transistor in this embodiment, the oxide semiconductor 130c is formed between the conductor 140 and the oxide semiconductor 130b. With such a structure, the oxide semiconductor 130b can be protected by the oxide semiconductor 130c in the step of removing the conductor 140. The oxide semiconductor 130b serves as a channel formation region. Therefore, a highly reliable transistor can be obtained by protecting the surface of the channel formation region.

Figure 9A:
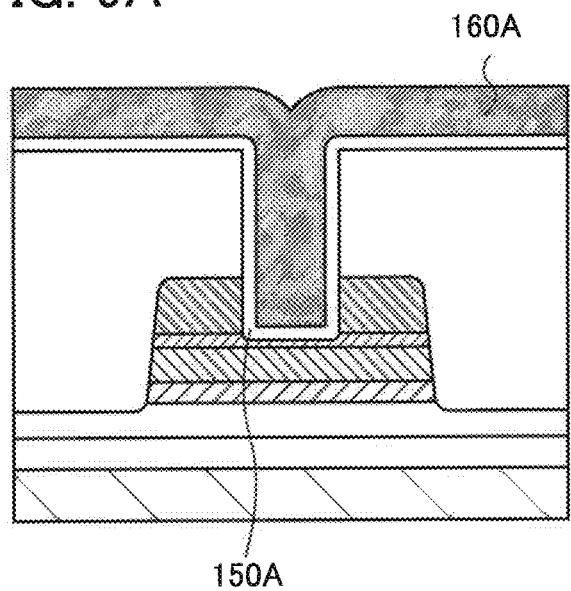
FIGS. 9A to 9D are cross-sectional views illustrating one embodiment of a manufacturing method of a semiconductor device.
Figure 9B:
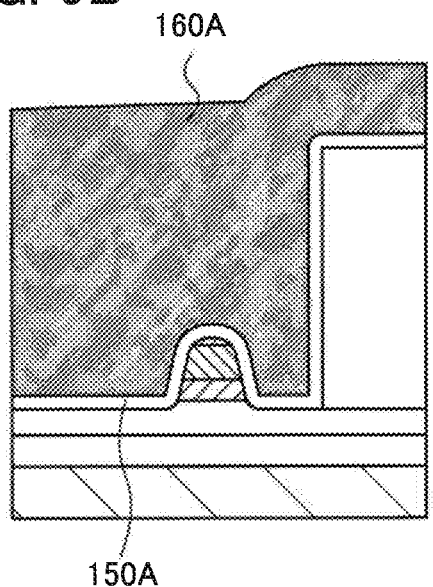

Next, as illustrated in FIGS. 9A and 9B, the insulator 150A and the conductor 160A are formed.

Figure 9C:
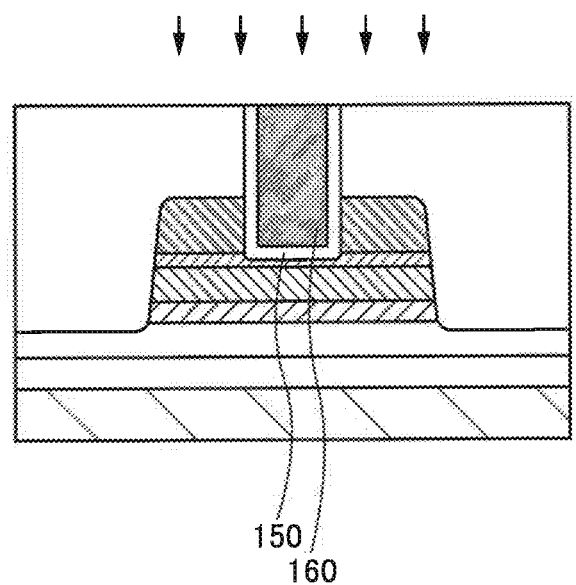
Figure 9D:
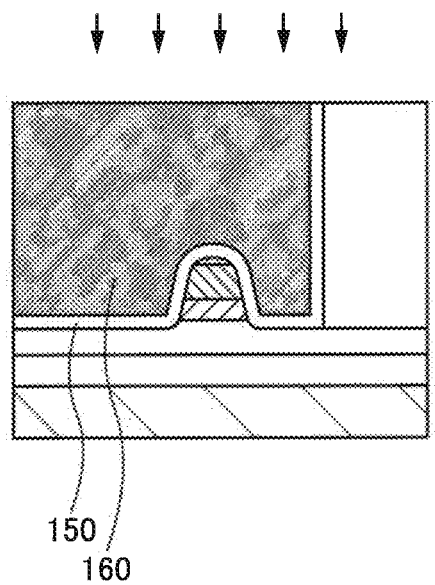

Next, part of the conductor 160A and the insulator 150A is removed to expose the insulator 180 by CMP treatment to form the insulator 150 and the conductor 160 (see FIGS. 9C and 9D). Here, the insulator 180 can be used as a stopper layer and the thickness of the insulator 180 is reduced in some cases.

Figure 10A:
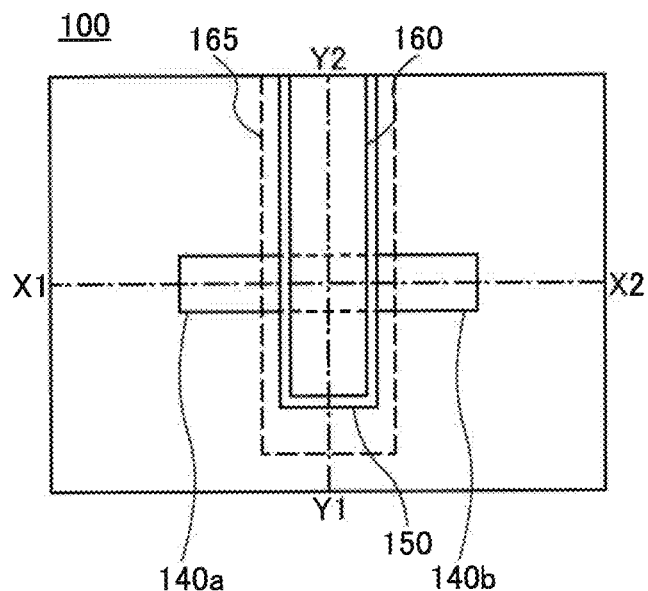
FIGS. 10A to 10C are a top view and cross-sectional views illustrating one embodiment of a semiconductor device.
Figure 10B:
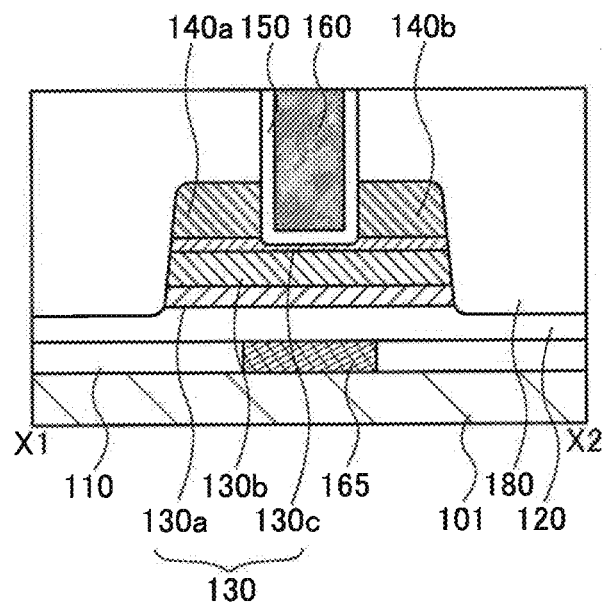
Figure 10C:
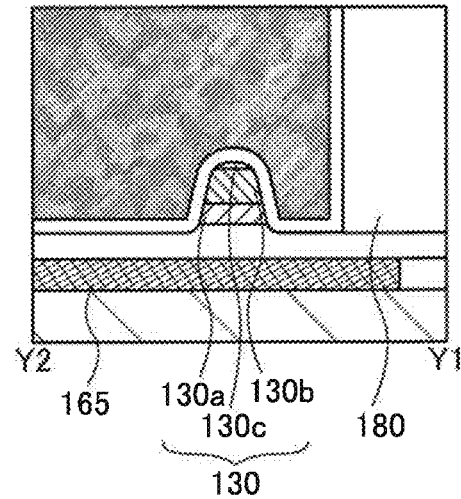

Through the above process, the transistor 100 in FIGS. 10A to 10C can be manufactured. FIG. 10A illustrates an example of a top view of the transistor 100. FIG. 10B is a cross-sectional view taken along dashed-dotted line X1-X2 in FIG. 10A, and FIG. 10C is a cross-sectional view take along dashed-dotted line Y1-Y2 in FIG. 10A. Note that the transistor 100 may include the conductor 165 as illustrated in FIGS. 10A to 10C.

In the transistor 100, the oxide semiconductor 130b serves as a channel formation region. The conductor 140a and the conductor 140b serve as a source electrode and a drain electrode. The insulator 150 serves as a gate insulator. The conductor 160 serves as a first gate electrode. The conductor 165 serves as a second gate electrode.

In this embodiment, the transistor 100 having a miniaturized structure can be manufactured. Since the transistor 100 has a structure in which the conductor 140a and the conductor 140b hardly overlap with the conductor 160, the parasitic capacitance generated between the conductor 160 and the conductors 140a and 140b can be reduced. That is, the operation frequency of the transistor 100 is high. The insulator 150 serving as a gate insulator and the conductor 160 serving as a gate electrode are formed in the opening formed using the sacrificial layer 190, whereby variation in channel lengths among transistors formed in the same step can be reduced.

Furthermore, the width of the conductor 160 which is formed can be thinner than that of the sacrificial layer 190. Therefore, the gate electrode can be formed more stably than the case where a gate electrode with the same width is directly formed by a lithography method. Although a gate electrode is broken in some cases when the width of the gate electrode is too small, for example, the gate electrode of one embodiment of the present invention is less likely to be broken. Similarly, the thickness of the conductor 160 serving as a gate electrode can be large. Specifically, the thickness of the conductor 160 can be greater than or equal to twice, preferably greater than or equal to three times, or further preferably greater than or equal to 4 times the width of the conductor 160. By making the thickness of the conductor 160 large, the resistance of the conductor 160 can be lowered and the operation speed of the transistor can be improved.

Since the oxide semiconductor 130c is not formed in an opening in the insulator 180 in this embodiment, the region in which the insulator 150 and the conductor 160 are embedded can be secured even when the opening formed using the sacrificial layer 190 is more miniaturized.

Thus, a miniaturized transistor having stable electrical characteristics and a high operation speed can be provided. Further, with use of the transistor, a highly integrated semiconductor device in which variation between the transistors is small can be provided.

The structures, the methods, and the like described in this embodiment can be combined as appropriate with any of the structures, the methods, and the like described in the other embodiments.

Embodiment 3

<Modification Example 2 of Semiconductor Device>

In this embodiment, modification examples of the transistor 100 will be described with reference to FIGS. 11A to 11H, FIGS. 12A to 12F, FIGS. 13A to 13F, FIGS. 14A to 14F, and FIGS. 15A to 15C. An example of a method for manufacturing the semiconductor device in this embodiment is described with reference to FIGS. 11A to 11H, FIGS. 12A to 12F, FIGS. 13A to 13F, FIGS. 14A to 14F, and FIGS. 15A to 15C. Note that the components having a function similar to that of the transistor 100 in Embodiment 1 are denoted by the same reference numerals as those in the transistor 100 in Embodiment 1, and the transistor in Embodiment 1 can be referred to.

Figure 11A:
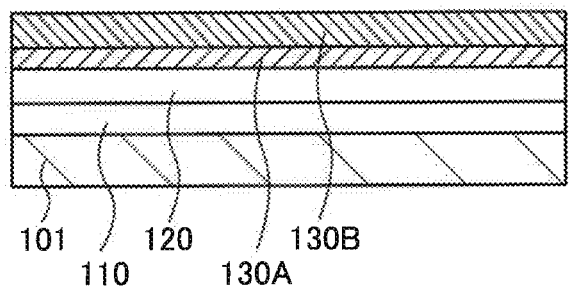
FIGS. 11A to 11H are cross-sectional views illustrating one embodiment of a manufacturing method of a semiconductor device.
Figure 11B:
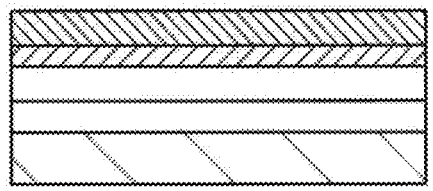

First, as illustrated in FIGS. 11A and 11B, the insulator 110, the insulator 120, the oxide semiconductor 130A, and the oxide semiconductor 130B are formed over the substrate 101.

Figure 11C:
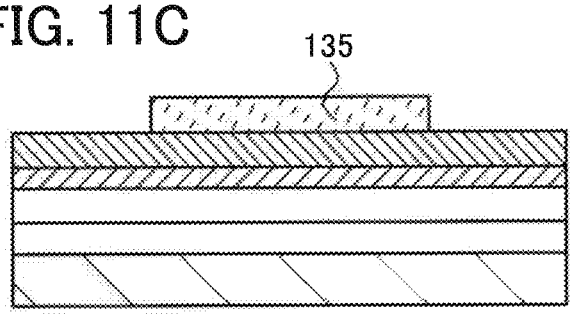
Figure 11D:
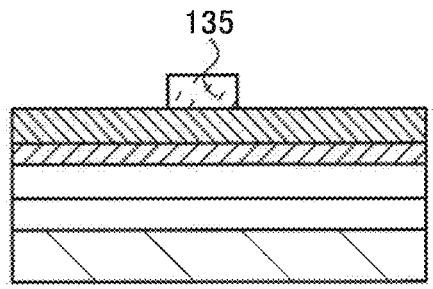
Figure 11E:
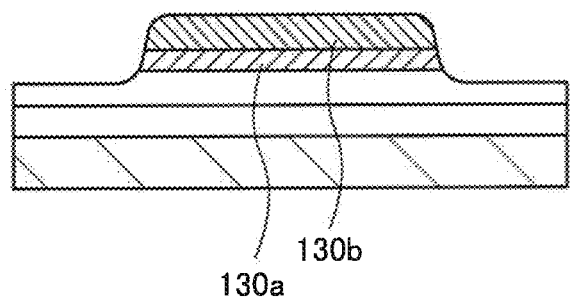
Figure 11F:
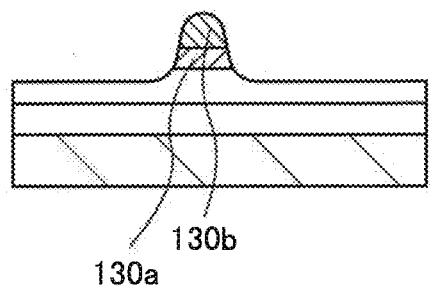

Next, as illustrated in FIGS. 11C and 11D, the resist mask 135 is formed over the oxide semiconductor 130B by a lithography method or the like, and unnecessary portions of the oxide semiconductor 130A and the oxide semiconductor 130B are removed. After that, the resist mask 135 is removed, whereby the oxide semiconductor 130a and the oxide semiconductor 130b having an island-shape illustrated in FIGS. 11E and 11F can be formed.

Figure 11G:
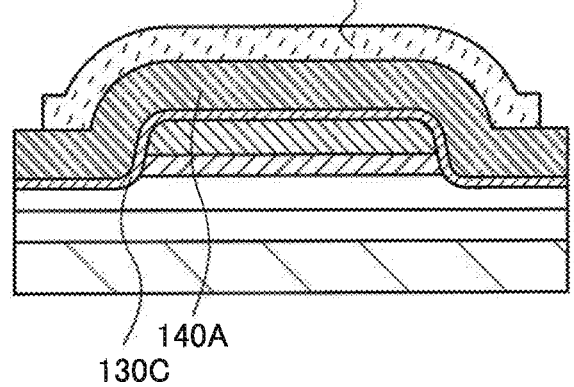
Figure 11H:
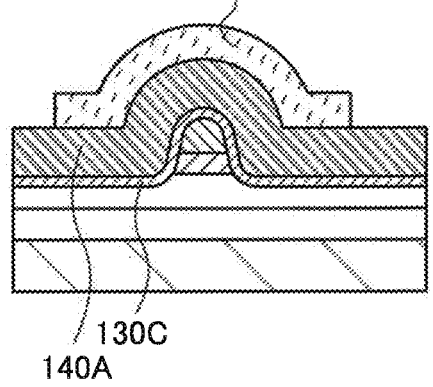
Figure 12A:
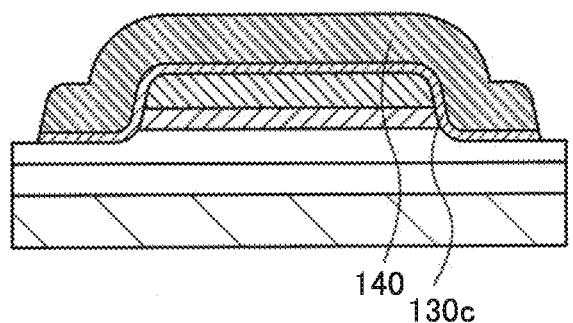
FIGS. 12A to 12F are cross-sectional views illustrating one embodiment of a manufacturing method of a semiconductor device.
Figure 12B:
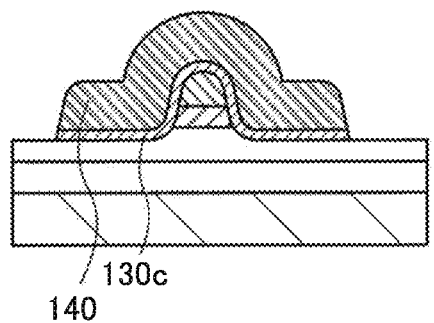

Next, as illustrated in FIGS. 11G and 11H, after the oxide semiconductor 130C is formed and the conductor 140A is formed over the oxide semiconductor 130C, a resist mask 145 is formed over the conductor 140A by a lithography method or the like. Next, as illustrated in FIGS. 12A and 12B, unnecessary portions of the oxide semiconductor 130C and the conductor 140A are removed, so that the oxide semiconductor 130c and the conductor 140 are formed.

Figure 12C:
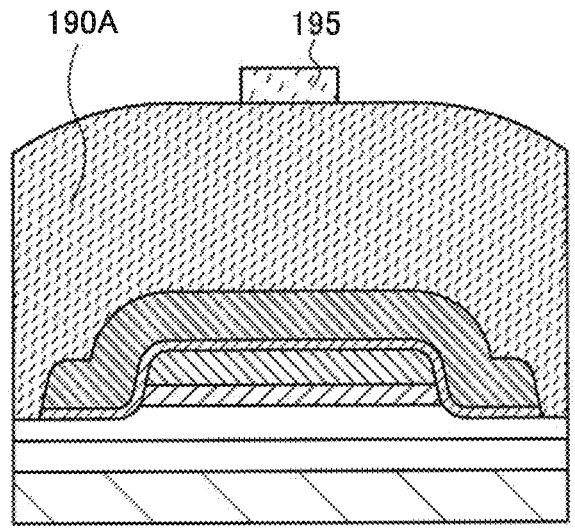
Figure 12D:
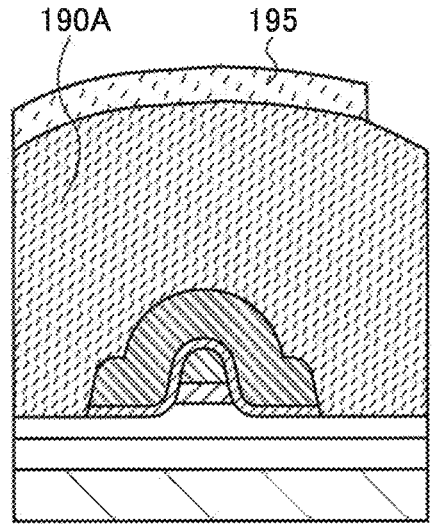
Figure 12E:
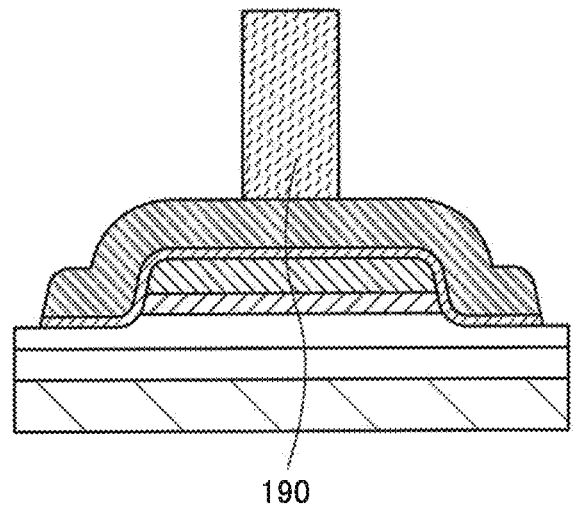
Figure 12F:
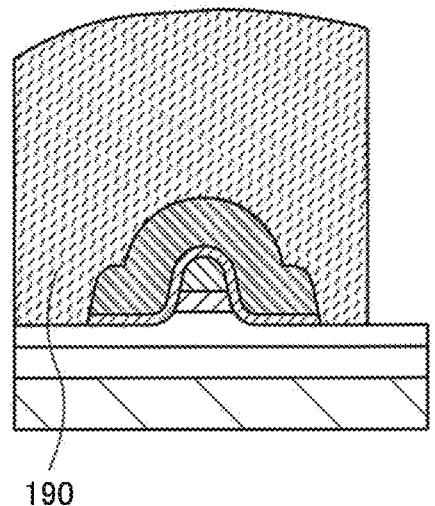

Next, as illustrated in FIGS. 12E and 12F, the sacrificial layer 190 is formed. After the film 190A to be the sacrificial layer 190 is formed as illustrated in FIGS. 12C and 12D, the resist mask 195 is formed in a manner similar to the above and unnecessary portions of the film 190A are removed, so that the sacrificial layer 190 is formed. Note that the sacrificial layer 190 preferably has a side surface substantially perpendicular to the formation surface because its shape affects the shape of a conductor 160 that is formed later.

Next, the insulator 180A is formed over the conductor 140 and the sacrificial layer 190 as illustrated in FIGS. 13A and 13B. Then, as illustrated in FIGS. 13C and 13D, part of the insulator 180A is removed to expose the sacrificial layer 190 by CMP treatment or the like, so that the insulator 180 is formed. Note that the CMP treatment may be performed only once or plural times. When the CMP treatment is performed plural times, it is preferable that first polishing be performed at a high polishing rate and final polishing be performed at a low polishing rate. By polishing with different polishing rates, the planarity of the insulator 180 can be further improved.

Next, the sacrificial layer 190 is selectively etched to form an opening as illustrated in FIGS. 13E and 13F. In the step of removing the sacrificial layer 190, a wet etching method is preferably used.

In the structure of the transistor in this embodiment, a region where a channel is formed in the oxide semiconductor 130b is covered with the oxide semiconductor 130a and the oxide semiconductor 130c. With such a structure, the oxide semiconductor 130b can be protected by the oxide semiconductor 130c in the step of removing the sacrificial layer 190.

Figure 14A:
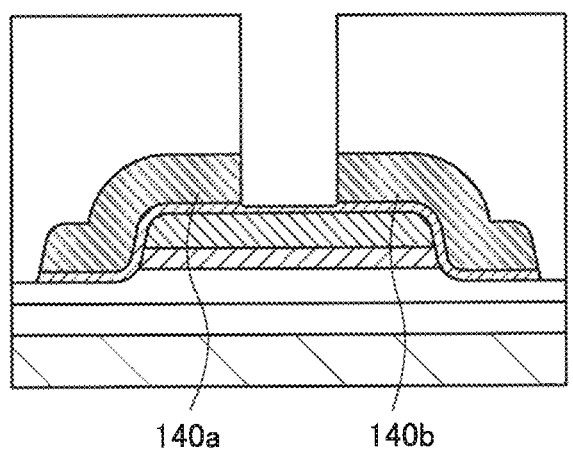
FIGS. 14A to 14F are cross-sectional views illustrating one embodiment of a manufacturing method of a semiconductor device.
Figure 14B:
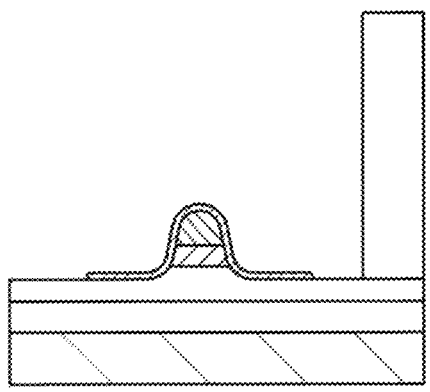

Next, part of the conductor 140 is removed with use of the insulator 180 as a mask, whereby the conductor 140a, the conductor 140b, and an opening are formed as illustrated in FIGS. 14A and 14B. In the structure of the transistor in this embodiment, the oxide semiconductor 130c is formed between the conductor 140 and the oxide semiconductor 130b. With such a structure, the oxide semiconductor 130b can be protected by the oxide semiconductor 130c in the step of removing the conductor 140.

Figure 14C:
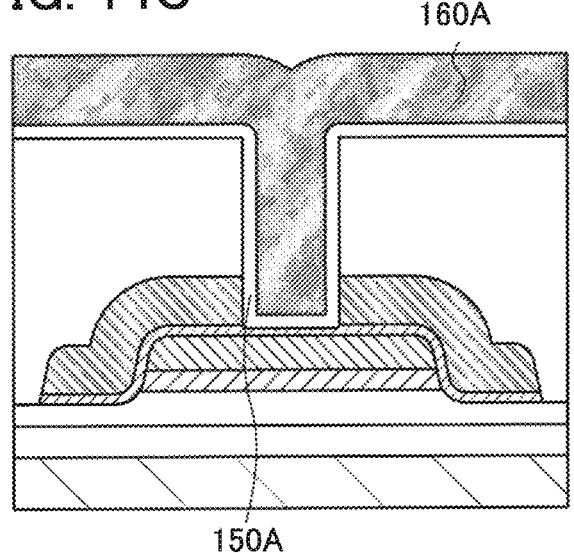
Figure 14D:
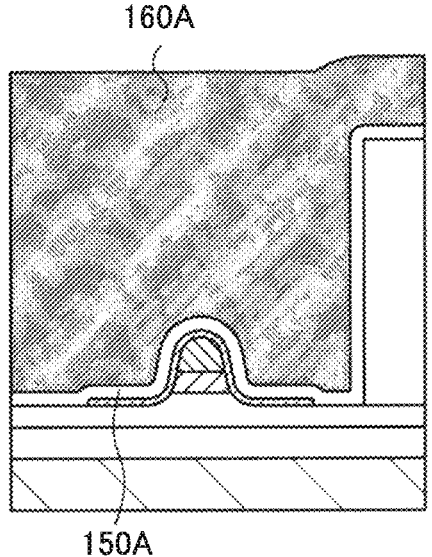

Next, as illustrated in FIGS. 14C and 14D, the insulator 150A and the conductor 160A are formed.

Figure 14E:
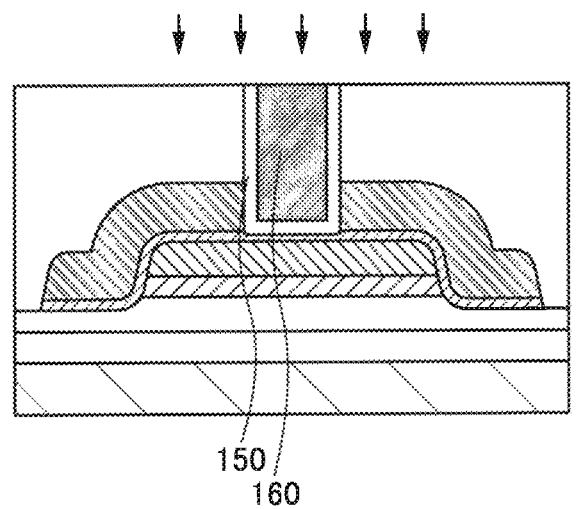
Figure 14F:
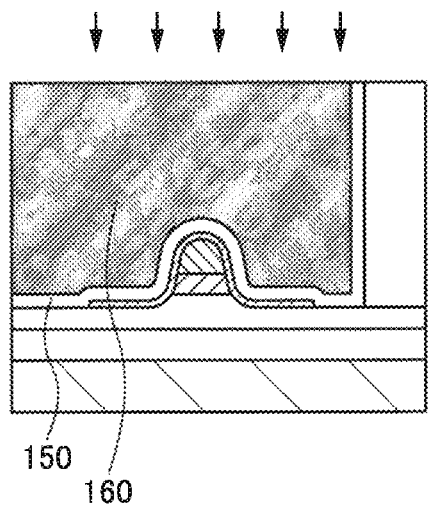

Next, part of the conductor 160A and the insulator 150A is removed to expose the insulator 180 by CMP treatment to form the insulator 150 and the conductor 160 (see FIGS. 14E and 14F). Here, the insulator 180 can be used as a stopper layer and the thickness of the insulator 180 is reduced in some cases.

Figure 15A:
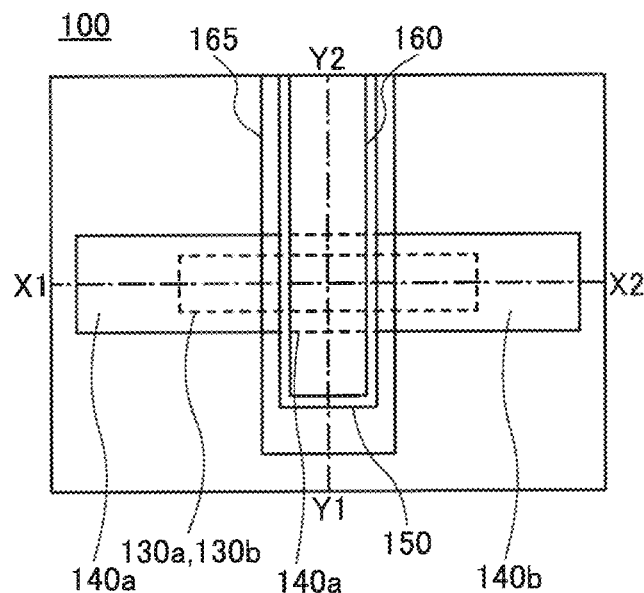
FIGS. 15A to 15C are a top view and cross-sectional views illustrating one embodiment of a semiconductor device.
Figure 15B:
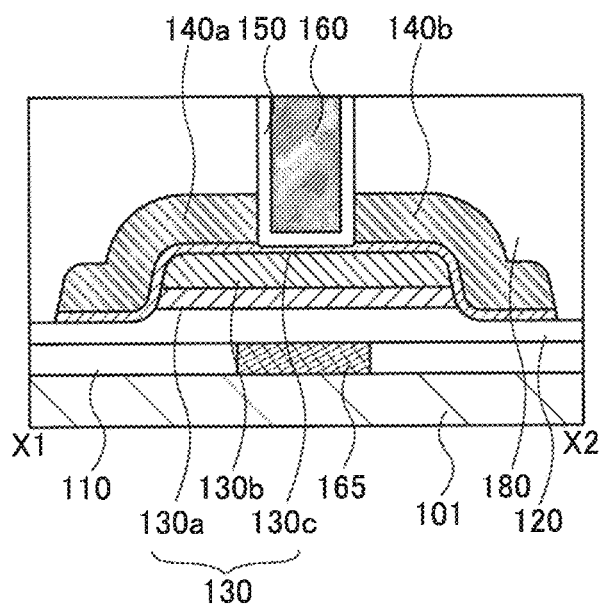
Figure 15C:
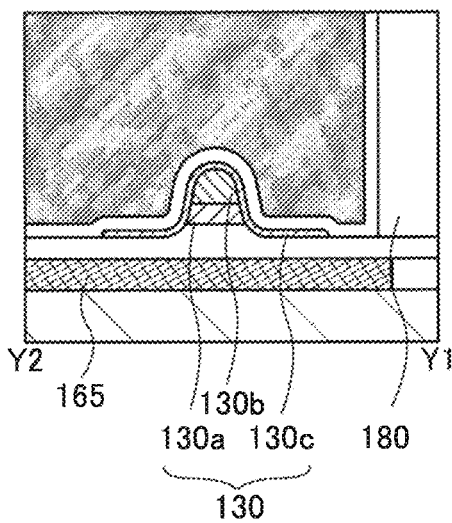

Through the above process, the transistor 100 in FIGS. 15A to 15C can be manufactured. FIG. 15A illustrates an example of a top view of the transistor 100. FIG. 15B is a cross-sectional view taken along dashed-dotted line X1-X2 in FIG. 15A, and FIG. 15C is a cross-sectional view take along dashed-dotted line Y1-Y2 in FIG. 15A. Note that the transistor 100 may include the conductor 165 as illustrated in FIGS. 15A to 15C.

In the transistor 100, the oxide semiconductor 130b serves as a channel formation region. The conductor 140a and the conductor 140b serve as a source electrode and a drain electrode. The insulator 150 serves as a gate insulator. The conductor 160 serves as a first gate electrode. The conductor 165 serves as a second gate electrode.

In this embodiment, the transistor 100 having a miniaturized structure can be manufactured. Since the transistor 100 has a structure in which the conductor 140a and the conductor 140b hardly overlap with the conductor 160, the parasitic capacitance generated between the conductor 160 and the conductors 140a and 140b can be reduced. That is, the operation frequency of the transistor 100 is high. The insulator 150 serving as a gate insulator and the conductor 160 serving as a gate electrode are formed in the opening formed using the sacrificial layer 190, whereby variation in channel lengths among transistors formed in the same step can be reduced.

Furthermore, the width of the conductor 160 which is formed can be thinner than that of the sacrificial layer 190. Therefore, the gate electrode can be formed more stably than the case where a gate electrode with the same width is directly formed by a lithography method. Although a gate electrode is broken in some cases when the width of the gate electrode is too small, for example, the gate electrode of one embodiment of the present invention is less likely to be broken. Similarly, the thickness of the conductor 160 serving as a gate electrode can be large. Specifically, the thickness of the conductor 160 can be greater than or equal to twice, preferably greater than or equal to three times, or further preferably greater than or equal to 4 times the width of the conductor 160. By making the thickness of the conductor 160 large, the resistance of the conductor 160 can be lowered and the operation speed of the transistor can be improved.

Since the oxide semiconductor 130c is not formed in an opening in this embodiment, the region in which the insulator 150 and the conductor 160 are embedded can be secured even when the opening formed using the sacrificial layer 190 is more miniaturized.

Thus, a miniaturized transistor having stable electrical characteristics and a high operation speed can be provided. Further, with use of the transistor, a highly integrated semiconductor device in which variation between the transistors is small can be provided.

The structures, the methods, and the like described in this embodiment can be combined as appropriate with any of the structures, the methods, and the like described in the other embodiments.

Embodiment 4

<Modification Example 3 of Semiconductor Device>

In this embodiment, modification examples of the transistor 100 will be described with reference to FIGS. 16A to 16H, FIGS. 17A to 17F, FIGS. 18A to 18F, FIGS. 19A and 19B, and FIGS. 20A to 20C. An example of a method for manufacturing the semiconductor device in this embodiment is described with reference to FIGS. 16A to 16H, FIGS. 17A to 17F, FIGS. 18A to 18F, FIGS. 19A and 19B, and FIGS. 20A to 20C. Note that the structure having a function similar to that of the transistor 100 in Embodiment 1 is denoted by the same reference numerals in the transistor 100, and the transistor in Embodiment 1 can be referred to.

Figure 16A:
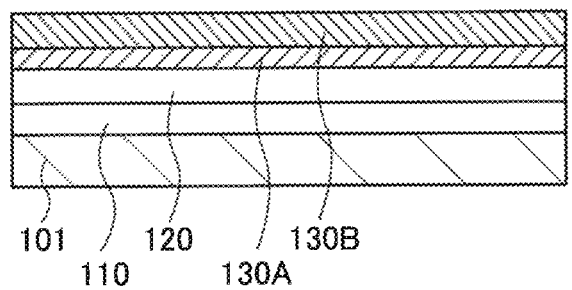
FIGS. 16A to 16H are cross-sectional views each illustrating one embodiment of a semiconductor device.
Figure 16B:
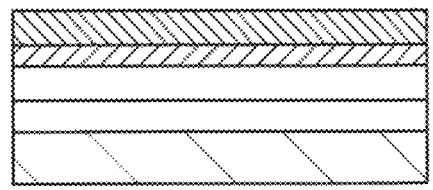

First, as illustrated in FIGS. 16A and 16B, the insulator 110, the insulator 120, the oxide semiconductor 130A, and the oxide semiconductor 130B are formed over the substrate 101.

Figure 16C:
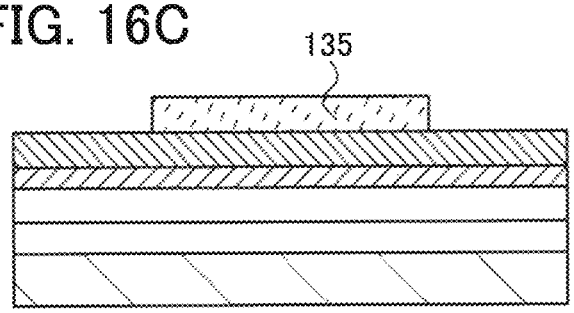
Figure 16D:
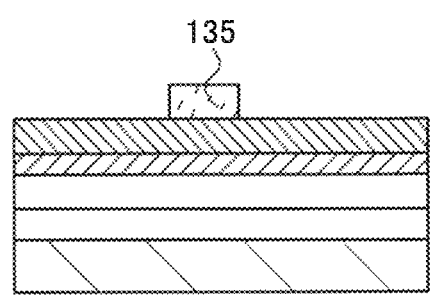
Figure 16E:
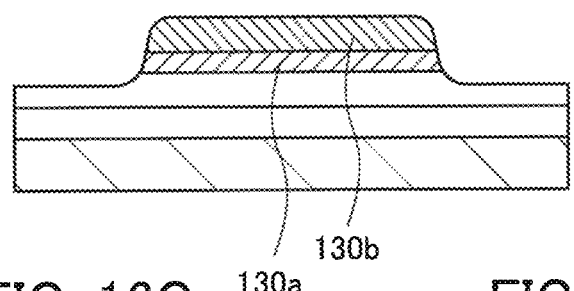
Figure 16F:
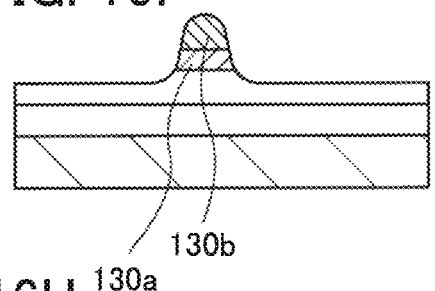

Next, as illustrated in FIGS. 16C and 16D, the resist mask 135 is formed over the oxide semiconductor 130B by a lithography method or the like, and unnecessary portions of the oxide semiconductor 130A and the oxide semiconductor 130B are removed. After that, the resist mask 135 is removed, whereby the oxide semiconductor 130a and the oxide semiconductor 130b having an island-shape illustrated in FIGS. 16E and 16F can be formed.

Figure 16G:
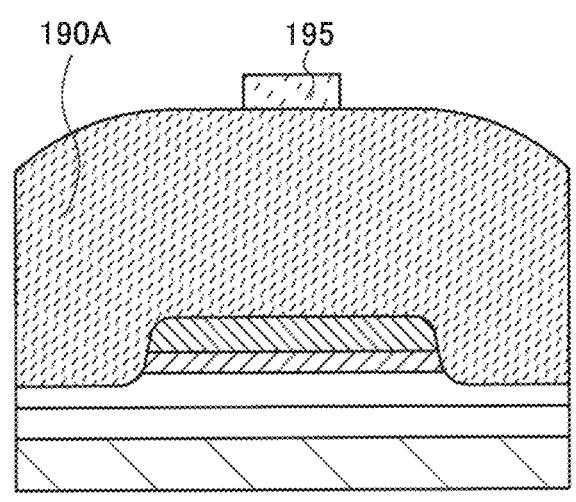
Figure 16H:
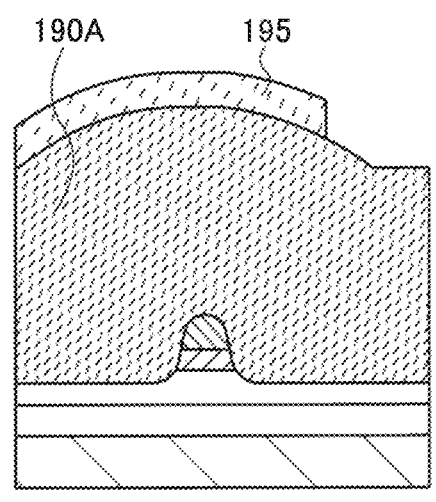
Figure 17A:
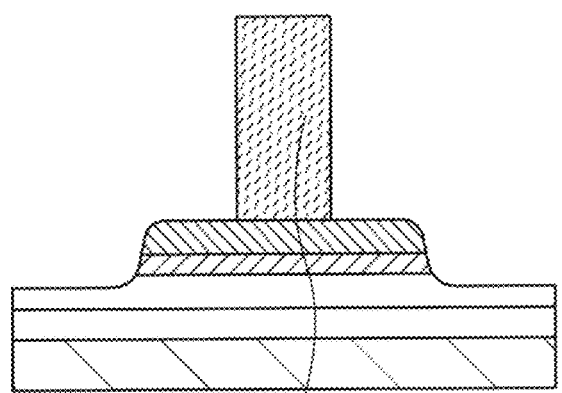
FIGS. 17A to 17F are cross-sectional views illustrating one embodiment of a manufacturing method of a semiconductor device.
Figure 17B:
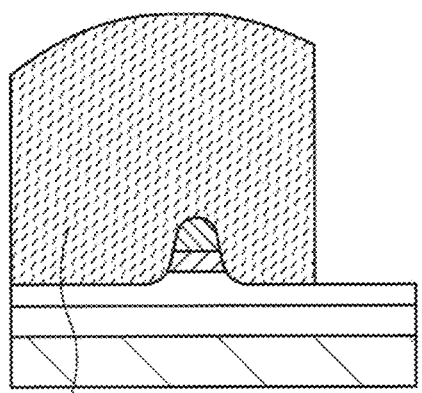

Next, as illustrated in FIGS. 17A and 17B, the sacrificial layer 190 is formed. After the film 190A to be the sacrificial layer 190 is formed as illustrated in FIGS. 16G and 16H, the resist mask 195 is formed in a manner similar to the above and unnecessary portions of the film 190A are removed, so that the sacrificial layer 190 is formed. Note that the sacrificial layer 190 preferably has a side surface substantially perpendicular to the formation surface because its shape affects the shape of a conductor 160 that is formed later.

Figure 17C:
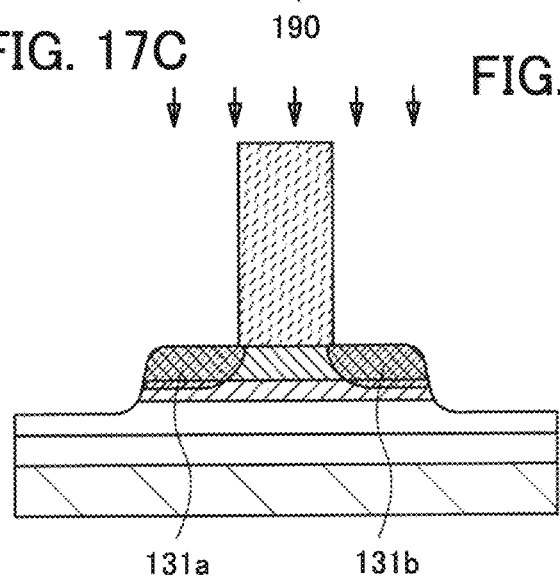
Figure 17D:
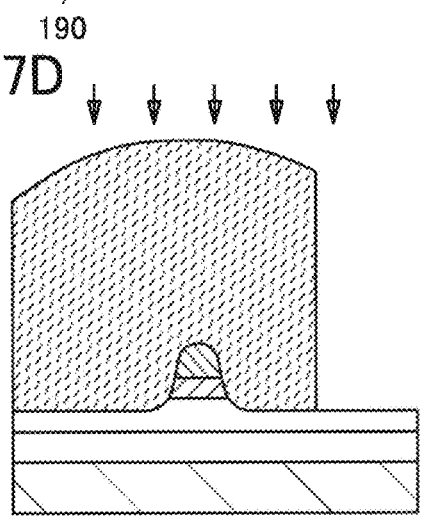

Next, regions 131a and 131b to be a source region and a drain region are formed as illustrated in FIGS. 17C and 17D. The oxide semiconductor 130b is doped with impurities such as boron, phosphorus, or argon using the sacrificial layer 190 as a mask, for example, whereby the resistance of the oxide semiconductor 130b is reduced and the regions 131a and 131b can be formed. Furthermore, the on-state characteristics of the transistor can be improved by adding impurities to the region in the oxide semiconductor 130b overlapping with the sacrificial layer 190. Note that a low-resistance region may also be formed in the oxide semiconductor 130a at this time.

Furthermore, the resistance can be further reduced by diffusing hydrogen from a film containing hydrogen such as a silicon nitride film in contact with the region 131a and the region 131b to part of the oxide semiconductor 130b. By using a film containing hydrogen such as a silicon nitride film as the insulator 180A, part of the oxide semiconductor 130b (in this case, at least regions 131a and 131b) may be in contact with the film containing hydrogen such as a silicon nitride film. Alternatively, the insulator 180A may be formed after the film containing hydrogen such as a silicon nitride film is formed. The region 131a and the region 131b can be formed by employing one of the structure in which the impurities are added and the structure in which the film containing hydrogen is formed.

Alternatively, for example, the region 131a and the region 131b can be formed in such a manner that a metal layer is formed in contact with the oxide semiconductor 130b and the sacrificial layer 190 and the metal layer is removed. Oxygen vacancies are formed in a region of the oxide semiconductor that is in contact with the metal layer, and hydrogen contained in the oxide semiconductor enters the oxygen vacancies, whereby the region is changed to an n-type region. The n-type region serves as a source region or a drain region, resulting in a decrease in the contact resistance between the oxide semiconductor and the source electrode or the drain electrode. Accordingly, the formation of the n-type region increases the mobility and on-state current of the transistor 100, achieving the high-speed operation of a semiconductor device using the transistor 100.

Note that oxygen can be extracted when a metal layer is formed by a sputtering method or the like, and in order to extract more oxygen, heating treatment may be performed after the metal layer is formed. The n-type region is more likely to be formed by forming the metal layer with use of a conductive material which is easily bonded to oxygen. Examples of such a conductive material include Al, Cr, Cu, Ta, Ti, Mo, and W.

A film containing hydrogen such as a silicon nitride film may be formed in contact with the region 131a and the region 131b after the metal layer is removed, and hydrogen may be diffused to part of the oxide semiconductor 130b.

Figure 17E:
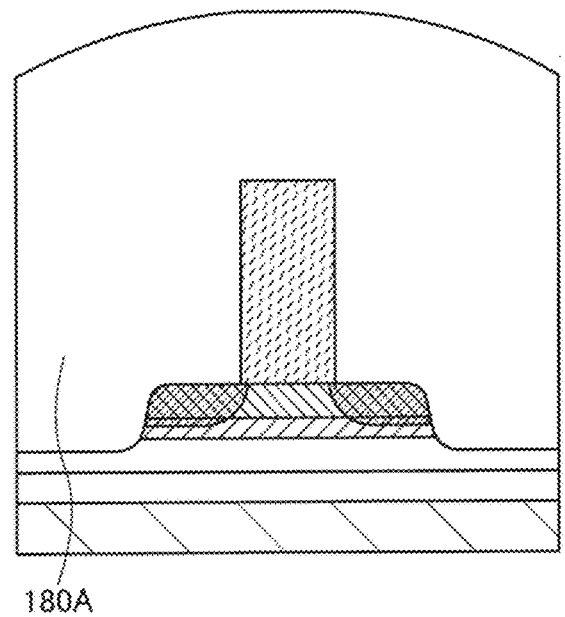
Figure 17F:
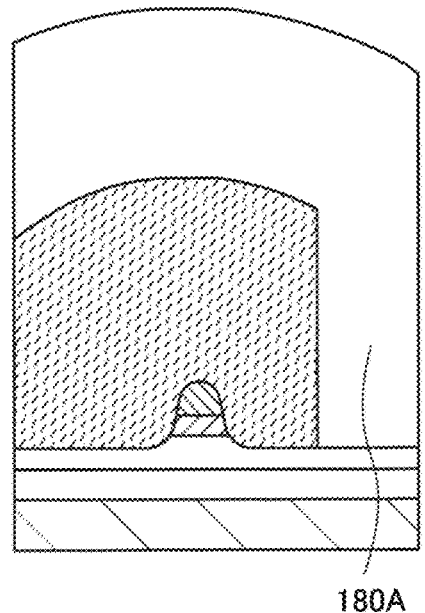
Figure 18A:
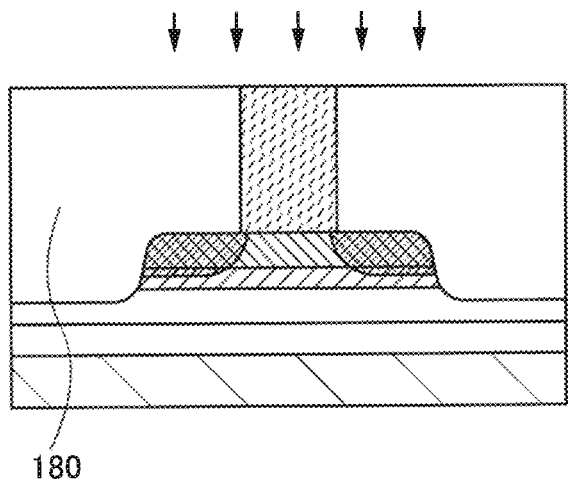
FIGS. 18A to 18F are cross-sectional views illustrating one embodiment of a manufacturing method of a semiconductor device.
Figure 18B:
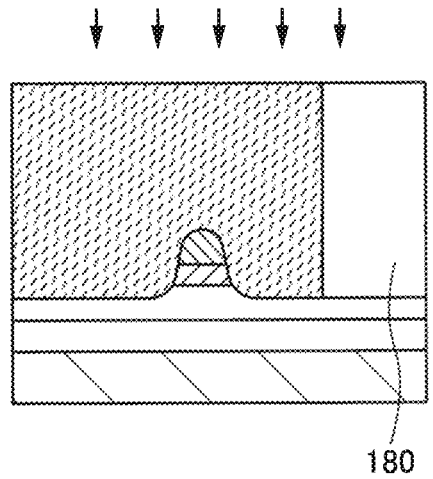

Next, the insulator 180A is formed over the oxide semiconductor 130b and the sacrificial layer 190 as illustrated in FIGS. 17E and 17F. Then, as illustrated in FIGS. 18A and 18B, part of the insulator 180A is removed to expose the sacrificial layer 190 by CMP treatment or the like, so that the insulator 180 is formed. Note that the CMP treatment may be performed only once or plural times. When the CMP treatment is performed plural times, it is preferable that first polishing be performed at a high polishing rate and final polishing be performed at a low polishing rate. By polishing with different polishing rates, the planarity of the insulator 180 can be further improved.

Figure 18C:
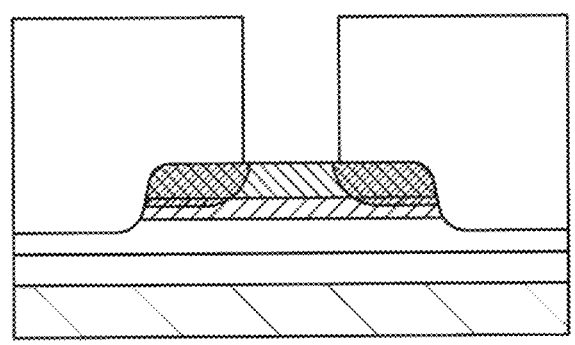
Figure 18D:
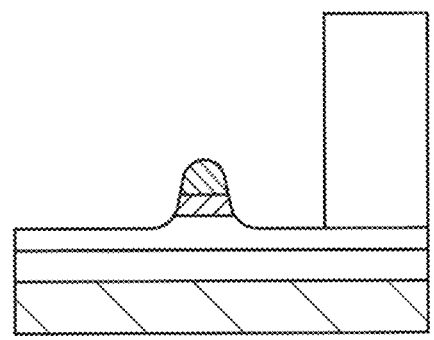

Next, the sacrificial layer 190 is selectively etched to form an opening as illustrated in FIGS. 18C and 18D. In the step of removing the sacrificial layer 190, a wet etching method is preferably used.

Figure 18E:
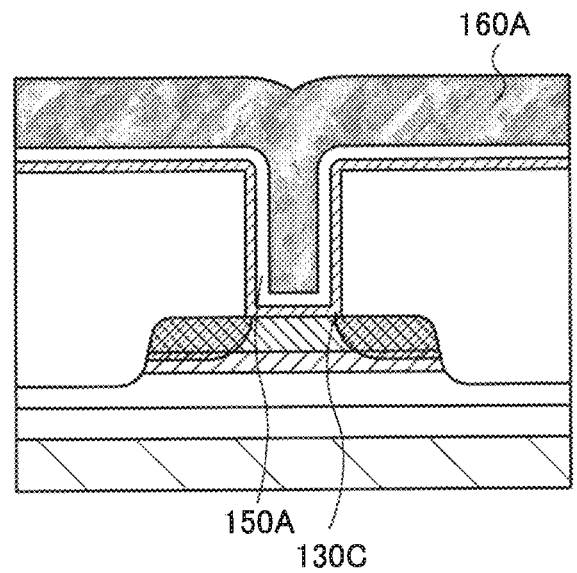
Figure 18F:
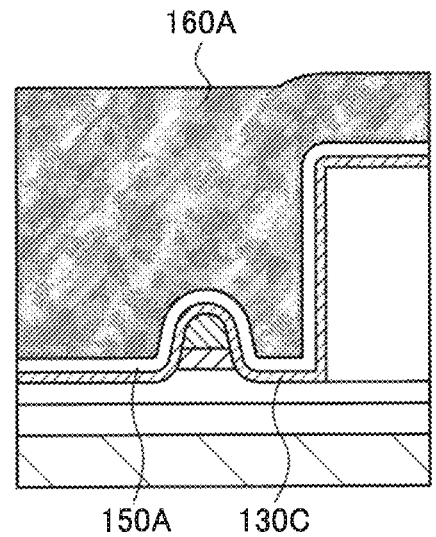

Next, as illustrated in FIGS. 18E and 18F, the oxide semiconductor 130C, the insulator 150A, and the conductor 160A are formed.

Figure 19A:
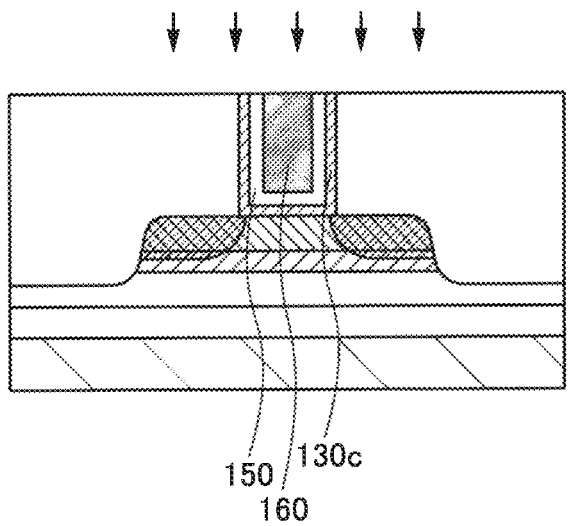
FIGS. 19A and 19B are cross-sectional views illustrating one embodiment of a manufacturing method of a semiconductor device.
Figure 19B:
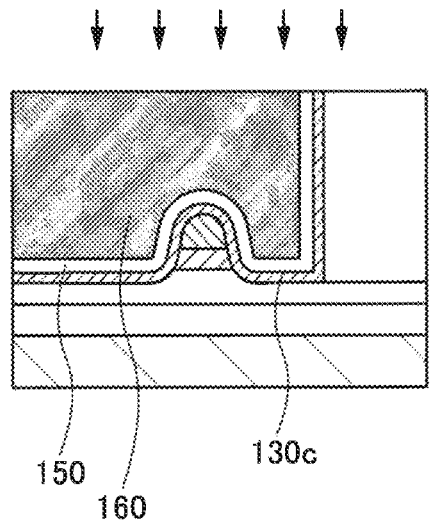

Next, part of the oxide semiconductor 130C, the conductor 160A, and the insulator 150A is removed to expose the insulator 180 by CMP treatment to form the oxide semiconductor 130c, the insulator 150, and the conductor 160 (see FIGS. 19A and 19B). Here, the insulator 180 can be used as a stopper layer and the thickness of the insulator 180 is reduced in some cases.

Figure 20A:
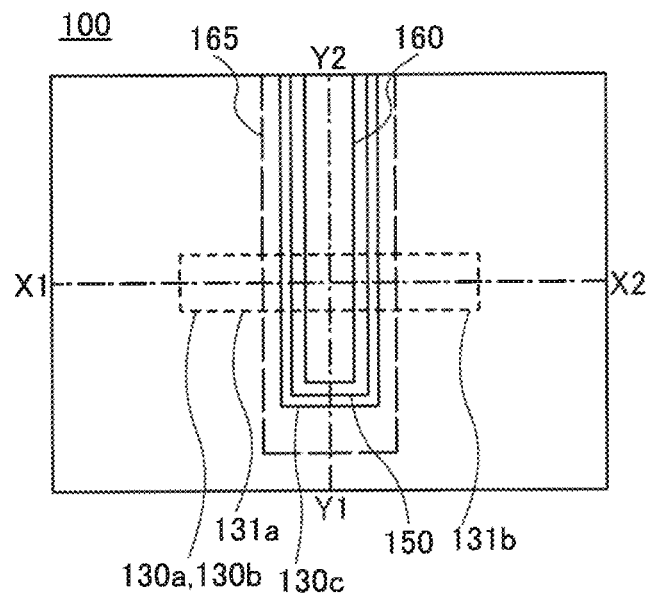
FIGS. 20A to 20C are a top view and cross-sectional views illustrating one embodiment of a semiconductor device.
Figure 20B:
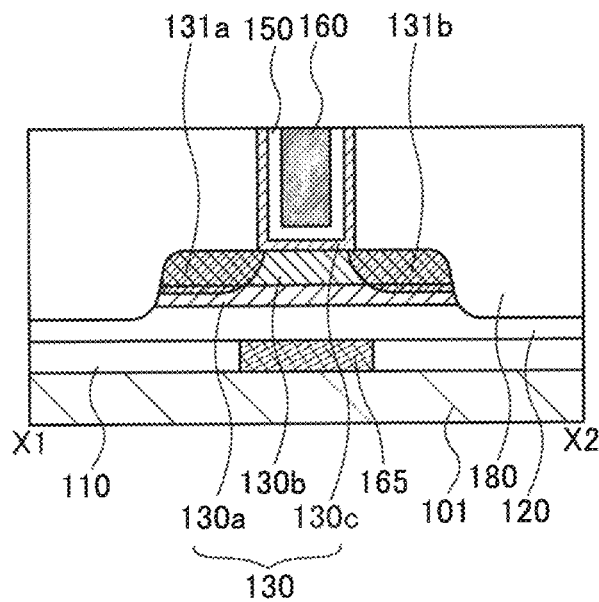
Figure 20C:
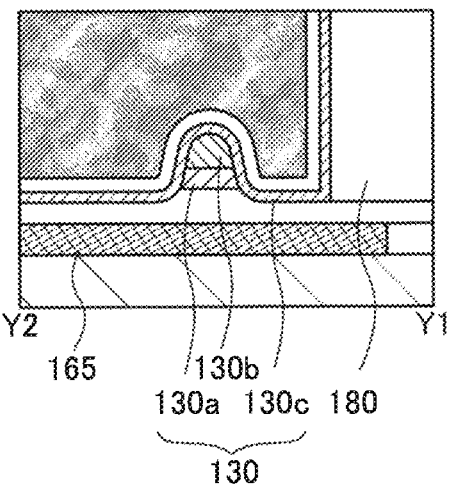

Through the above process, the transistor 100 in FIGS. 20A to 20C can be manufactured. FIG. 20A illustrates an example of a top view of the transistor 100. FIG. 20B is a cross-sectional view taken along dashed-dotted line X1-X2 in FIG. 20A, and FIG. 20C is a cross-sectional view take along dashed-dotted line Y1-Y2 in FIG. 20A. Note that the transistor 100 may include the conductor 165 as illustrated in FIGS. 20A to 20C.

In the transistor 100, the oxide semiconductor 130b serves as a channel formation region. The region 131a and the region 131b serve as a source region and a drain region. The insulator 150 serves as a gate insulator. The conductor 160 serves as a first gate electrode. The conductor 165 serves as a second gate electrode.

In this embodiment, the transistor 100 having a miniaturized structure can be manufactured. Since the transistor 100 has a structure in which the region 131a and the region 131b hardly overlap with the conductor 160, the parasitic capacitance generated between the conductor 160 and the regions 131a and 131b can be reduced. That is, the operation frequency of the transistor 100 is high. The insulator 150 serving as a gate insulator and the conductor 160 serving as a gate electrode are formed in the opening formed using the sacrificial layer 190, whereby variation in channel lengths among transistors formed in the same step can be reduced.

Furthermore, the width of the conductor 160 which is formed can be thinner than that of the sacrificial layer 190. Therefore, the gate electrode can be formed more stably than the case where a gate electrode with the same width is directly formed by a lithography method. Although a gate electrode is broken in some cases when the width of the gate electrode is too small, for example, the gate electrode of one embodiment of the present invention is less likely to be broken. Similarly, the thickness of the conductor 160 serving as a gate electrode can be large. Specifically, the thickness of the conductor 160 can be greater than or equal to twice, preferably greater than or equal to three times, or further preferably greater than or equal to 4 times the width of the conductor 160. By making the thickness of the conductor 160 large, the resistance of the conductor 160 can be lowered and the operation speed of the transistor can be improved.

Thus, a miniaturized transistor having stable electrical characteristics and a high operation speed can be provided. Further, with use of the transistor, a highly integrated semiconductor device in which variation between the transistors is small can be provided.

The structures, the methods, and the like described in this embodiment can be combined as appropriate with any of the structures, the methods, and the like described in the other embodiments.

Embodiment 5

<Modification Example 4 of Semiconductor Device>

In this embodiment, modification examples of the transistor 100 will be described with reference to FIGS. 21A to 21H, FIGS. 22A to 22F, FIGS. 23A to 23F, FIGS. 24A to 24D, and FIGS. 25A to 25C. An example of a method for manufacturing the semiconductor device in this embodiment is described with reference to FIGS. 21A to 21H, FIGS. 22A to 22F, FIGS. 23A to 23F, FIGS. 24A to 24D, and FIGS. 25A to 25C. Note that the structure having a function similar to that of the transistor 100 in Embodiment 1 is denoted by the same reference numerals in transistor 100 in Embodiment 1, and the transistor in Embodiment 1 can be referred to.

Figure 21A:
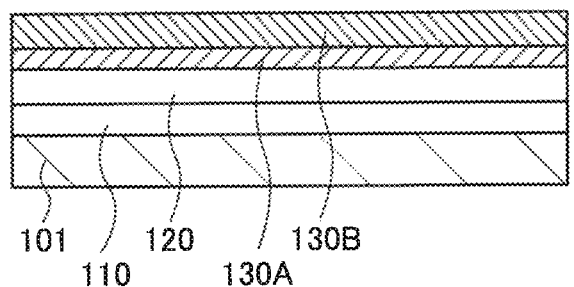
FIGS. 21A to 21H are cross-sectional views illustrating one embodiment of a manufacturing method of a semiconductor device.
Figure 21B:
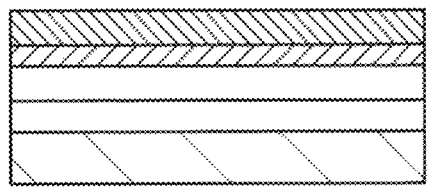

First, as illustrated in FIGS. 21A and 21B, the insulator 110, the insulator 120, the oxide semiconductor 130A, the oxide semiconductor 130B are formed over the substrate 101.

Figure 21C:
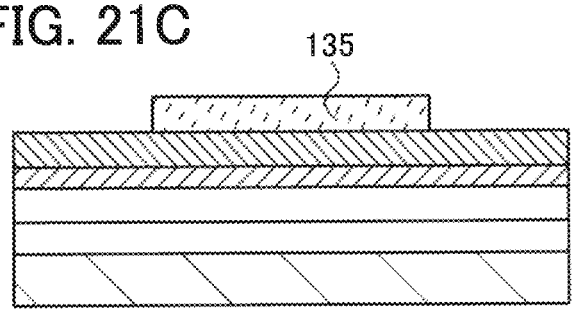
Figure 21D:
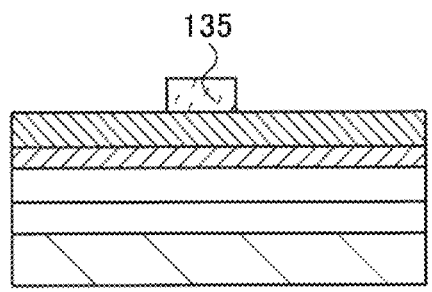
Figure 21E:
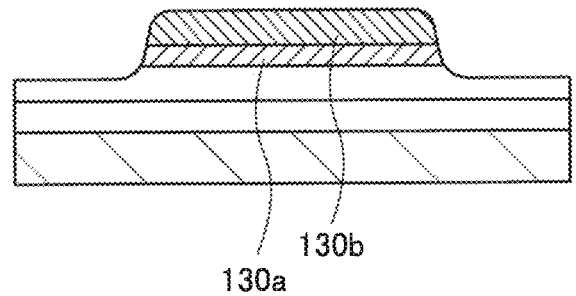
Figure 21F:
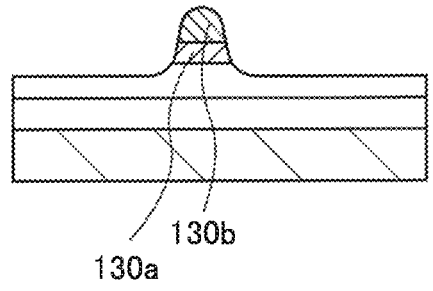

Next, as illustrated in FIGS. 21C and 21D, the resist mask 135 is formed over the oxide semiconductor 130B by a lithography method or the like, and unnecessary portions of the oxide semiconductor 130A and the oxide semiconductor 130B are removed. After that, the resist mask 135 is removed, whereby the oxide semiconductor 130a and the oxide semiconductor 130b having an island-shape illustrated in FIGS. 21E and 21F can be formed.

Figure 21G:
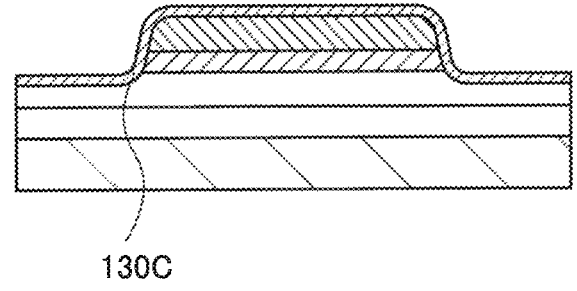
Figure 21H:
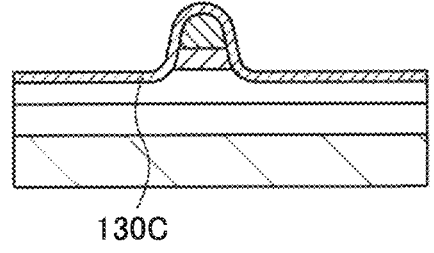
Figure 22A:
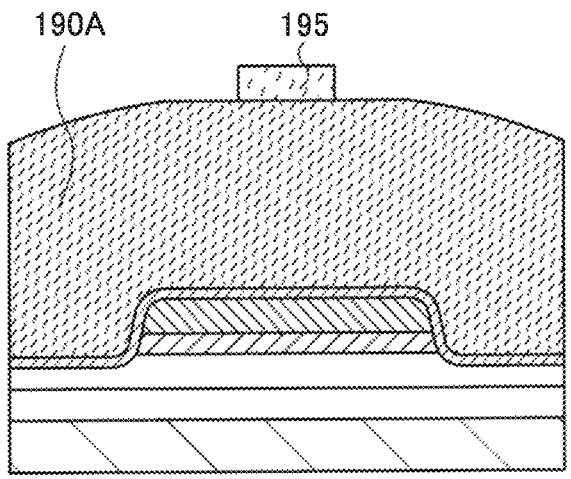
FIGS. 22A to 22F are cross-sectional views illustrating one embodiment of a manufacturing method of a semiconductor device.
Figure 22B:
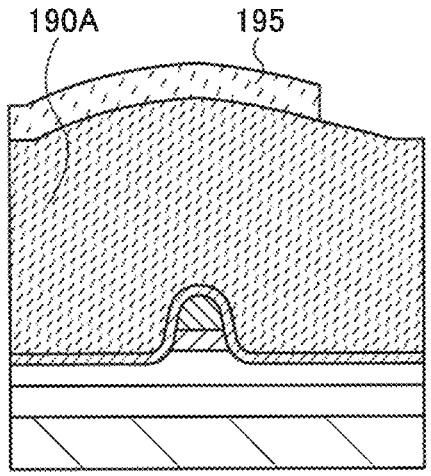
Figure 22C:
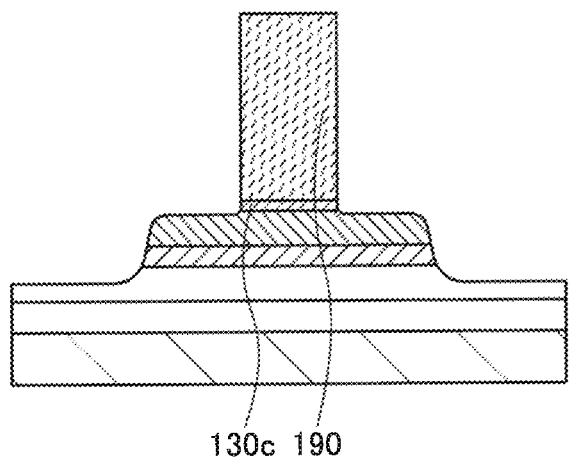
Figure 22D:
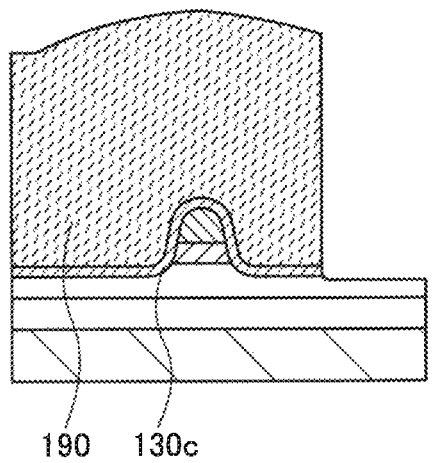

Next, as illustrated in FIGS. 21G and 21H, the oxide semiconductor 130C is formed over the oxide semiconductor 130a and the oxide semiconductor 130b having an island shape. Next, as illustrated in FIGS. 22A and 22B, the film 190A to be the sacrificial layer 190 are formed. After that, the resist mask 195 is formed in a manner similar to the above and unnecessary portions of the film 190A and the oxide semiconductor 130C are removed, whereby the sacrificial layer 190 and the oxide semiconductor 130c are formed (see FIGS. 22C and 22D). The sacrificial layer 190 preferably has a shape in which a side surface is substantially perpendicular to the formation surface because the shape affects the shape of a conductor 160 that is formed later.

Figure 22E:
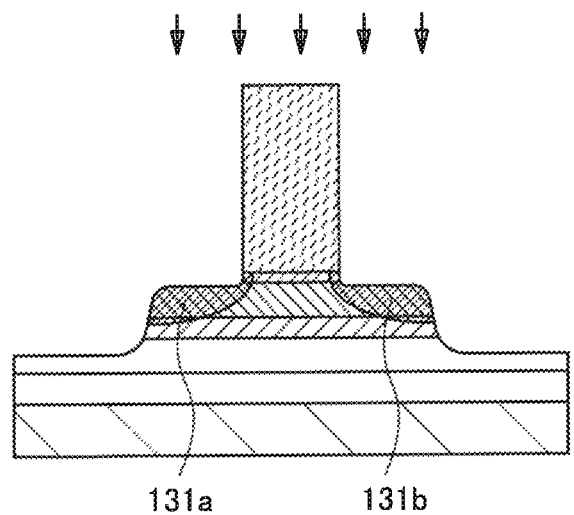
Figure 22F:
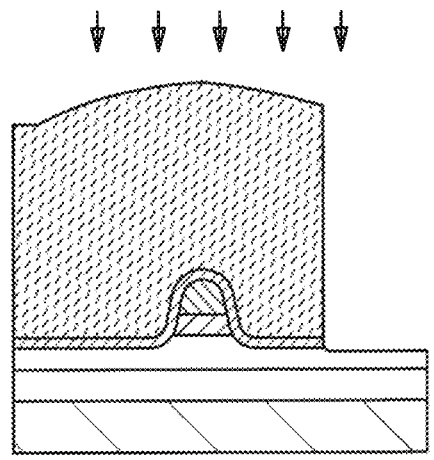

Next, the regions 131a and 131b to be a source region and a drain region are formed as illustrated in FIGS. 22E and 22F in a manner similar to the above.

Figure 23A:
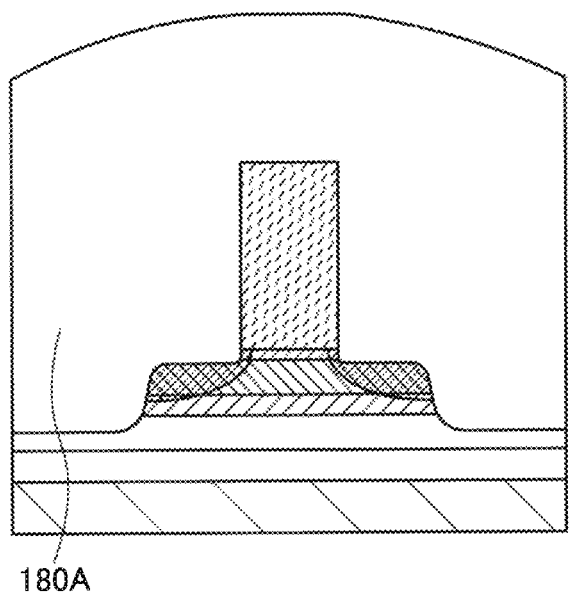
FIGS. 23A to 23F are cross-sectional views illustrating one embodiment of a manufacturing method of a semiconductor device.
Figure 23B:
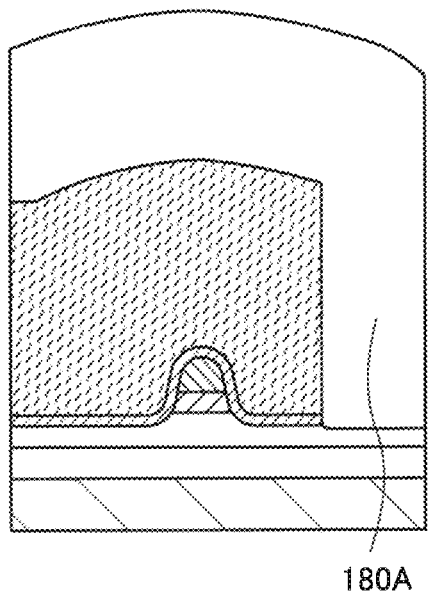
Figure 23C:
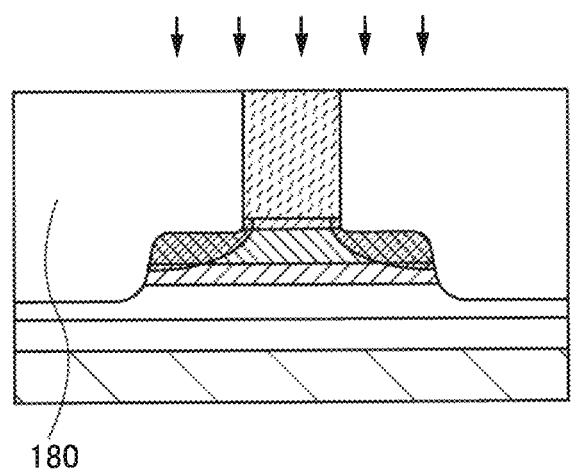
Figure 23D:
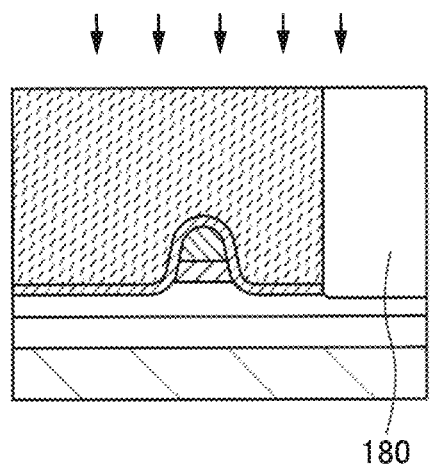

Next, the insulator 180A is formed over the oxide semiconductor 130b and the sacrificial layer 190 as illustrated in FIGS. 23A and 23B. Then, as illustrated in FIGS. 23C and 23D, part of the insulator 180A is removed to expose the sacrificial layer 190 by CMP treatment or the like, so that the insulator 180 is formed. Note that the CMP treatment may be performed only once or plural times. When the CMP treatment is performed plural times, it is preferable that first polishing be performed at a high polishing rate and final polishing be performed at a low polishing rate. By polishing with different polishing rates, the planarity of the insulator 180 can be further improved.

Figure 23E:
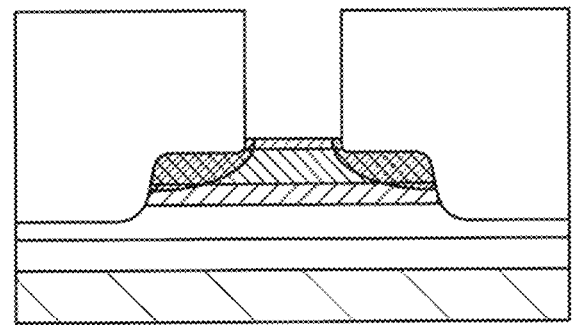
Figure 23F:
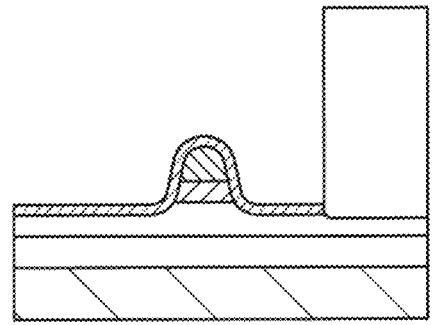

Next, the sacrificial layer 190 is selectively etched to form an opening as illustrated in FIGS. 23E and 23F. In the step of removing the sacrificial layer 190, a wet etching method is preferably used.

In the structure of the transistor in this embodiment, a region where a channel is formed in the oxide semiconductor 130b is covered with the oxide semiconductor 130a and the oxide semiconductor 130c. With such a structure, the oxide semiconductor 130b can be protected by the oxide semiconductor 130c in the step of removing the sacrificial layer 190.

Next, as illustrated in FIGS. 24A and 24B, the insulator 150A and the conductor 160A are formed.

Next, part of the conductor 160A and the insulator 150A is removed to expose the insulator 180 by CMP treatment to form the insulator 150 and the conductor 160 (see FIGS. 24C and 24D). Here, the insulator 180 can be used as a stopper layer and the thickness of the insulator 180 is reduced in some cases.

Figure 25A:
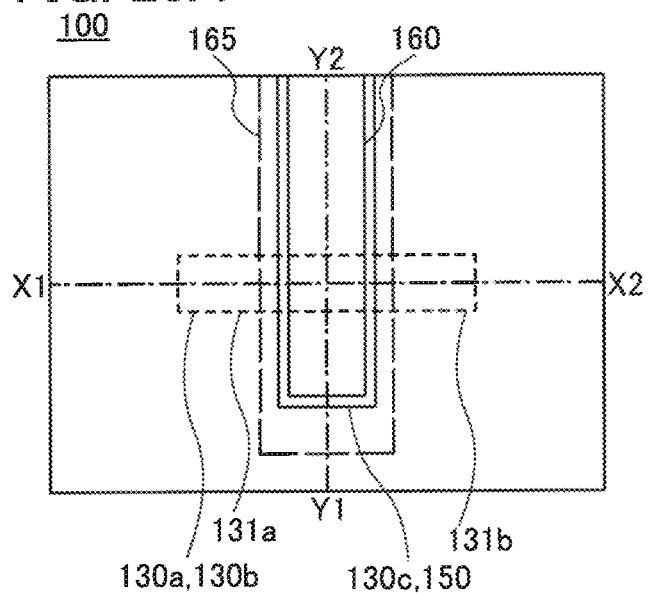
FIGS. 25A to 25C are a top view and cross-sectional views illustrating one embodiment of a semiconductor device.
Figure 25B:
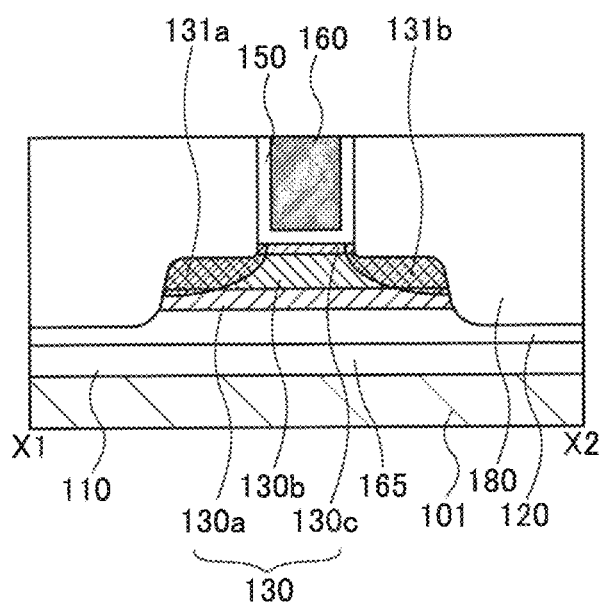
Figure 25C:
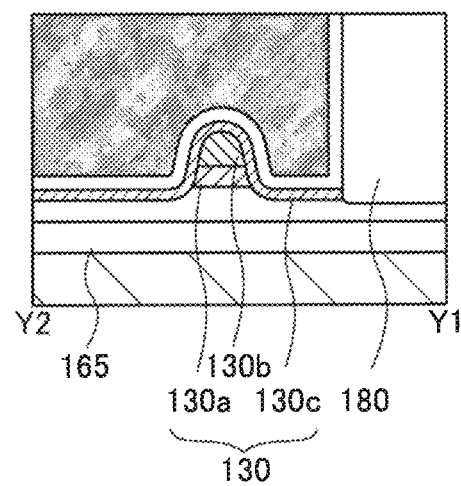

Through the above process, the transistor 100 in FIGS. 25A to 25C can be manufactured. FIG. 25A illustrates an example of a top view of the transistor 100. FIG. 25B is a cross-sectional view taken along dashed-dotted line X1-X2 in FIG. 25A, and FIG. 25C is a cross-sectional view take along dashed-dotted line Y1-Y2 in FIG. 25A. Note that the transistor 100 may include the conductor 165 as illustrated in FIGS. 25A to 25C.

In the transistor 100, the oxide semiconductor 130b serves as a channel formation region. The region 131a and the region 131b serve as a source electrode and a drain electrode. The insulator 150 serves as a gate insulator. The conductor 160 serves as a first gate electrode. The conductor 165 serves as a second gate electrode.

In this embodiment, the transistor 100 having a miniaturized structure can be manufactured. Since the transistor 100 has a structure in which the region 131a and the region 131b hardly overlap with the conductor 160, the parasitic capacitance generated between the conductor 160 and the regions 131a and 131b can be reduced. That is, the operation frequency of the transistor 100 is high. The insulator 150 serving as a gate insulator and the conductor 160 serving as a gate electrode are formed in the opening formed using the sacrificial layer 190, whereby variation in channel lengths among transistors formed in the same step can be reduced.

Furthermore, the width of the conductor 160 which is formed can be thinner than that of the sacrificial layer 190. Therefore, the gate electrode can be formed more stably than the case where a gate electrode with the same width is directly formed by a lithography method. Although a gate electrode is broken in some cases when the width of the gate electrode is too small, for example, the gate electrode of one embodiment of the present invention is less likely to be broken. Similarly, the thickness of the conductor 160 serving as a gate electrode can be large. Specifically, the thickness of the conductor 160 can be greater than or equal to twice, preferably greater than or equal to three times, or further preferably greater than or equal to 4 times the width of the conductor 160. By making the thickness of the conductor 160 large, the resistance of the conductor 160 can be lowered and the operation speed of the transistor can be improved.

Since the oxide semiconductor 130c is not formed in an opening in this embodiment, the region in which the insulator 150 and the conductor 160 are embedded can be secured even when the opening formed using the sacrificial layer 190 is more miniaturized.

Thus, a miniaturized transistor having stable electrical characteristics and a high operation speed can be provided. Further, with use of the transistor, a highly integrated semiconductor device in which variation between the transistors is small can be provided.

The structures, the methods, and the like described in this embodiment can be combined as appropriate with any of the structures, the methods, and the like described in the other embodiments.

Embodiment 6

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 27A:
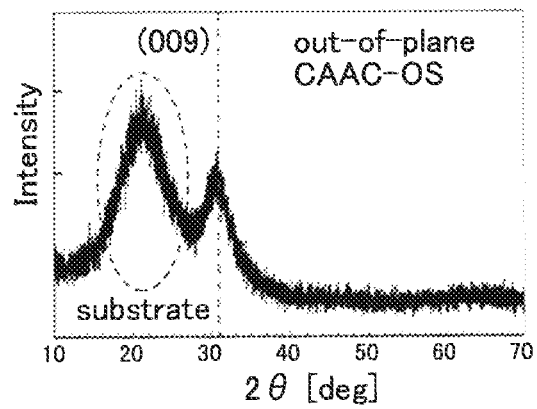
FIGS. 27A to 27E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 27A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°.

The peak at a 2θ of around 36° is derived from a crystal structure that is classified into the space group Fd-3m; thus, this peak is preferably not exhibited in a CAAC-OS.

Figure 27D:
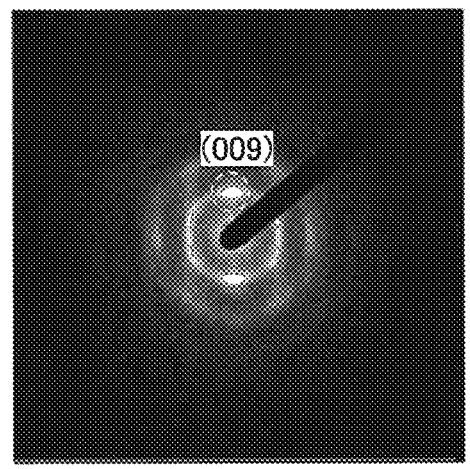
Figure 27B:
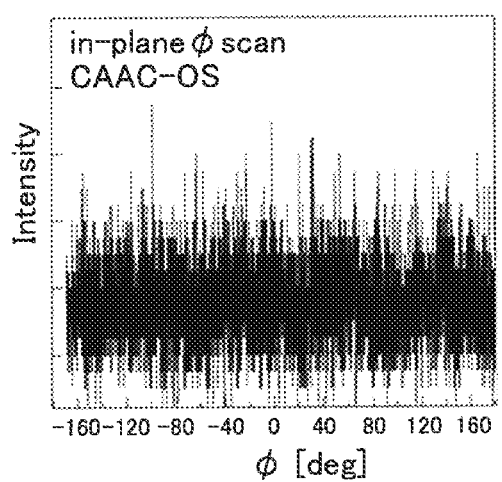
Figure 27E:
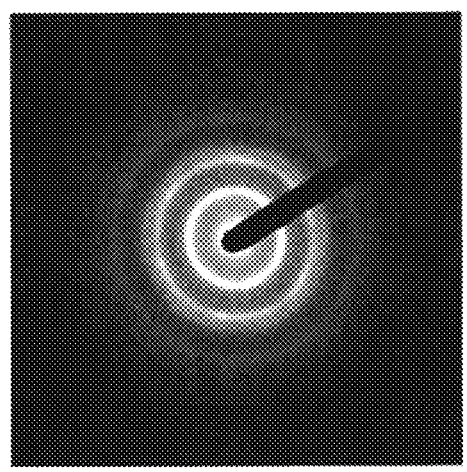
Figure 27C:
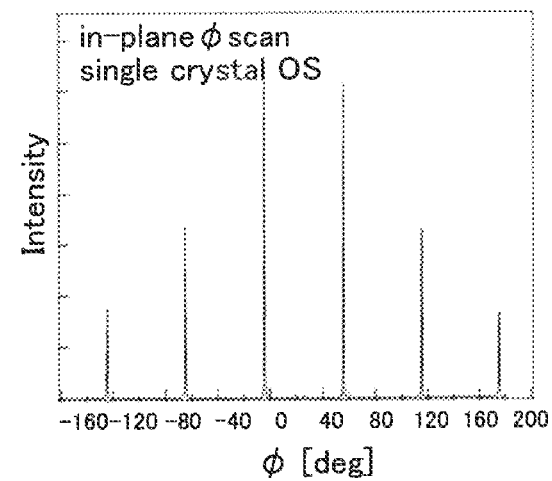

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 27B, a peak is not clearly observed. In contrast, in the case where single crystal InGaZnO$_4$ is subjected to φ scan with 2θ fixed at around 56°, as shown in FIG. 27C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 27D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 27E shows a diffraction pattern obtained in such a manner that an electron beam with a probe diameter of 300 nm is incident on the same sample in a direction perpendicular to the sample surface. As shown in FIG. 27E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 27E is considered to be derived from the (010) plane, the (100) plane, and the like of the InGaZnO$_4$ crystal. The second ring in FIG. 27E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 28A:
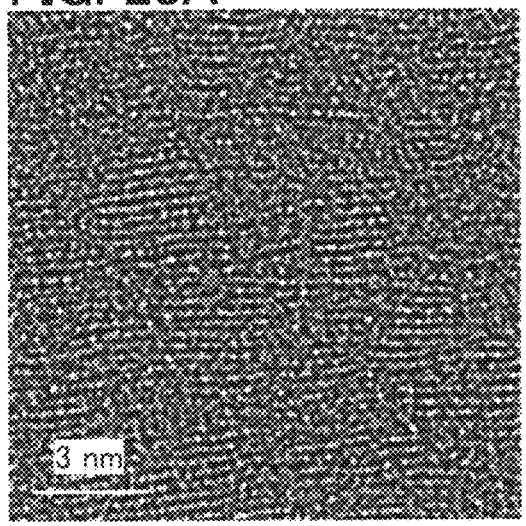
FIGS. 28A to 28E show a cross-sectional TEM image and plan-view TEM images of a CAAC-OS and images obtained through analysis thereof.

FIG. 28A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 28A shows pellets in which metal atoms are arranged in a layered manner. FIG. 28A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 28D:
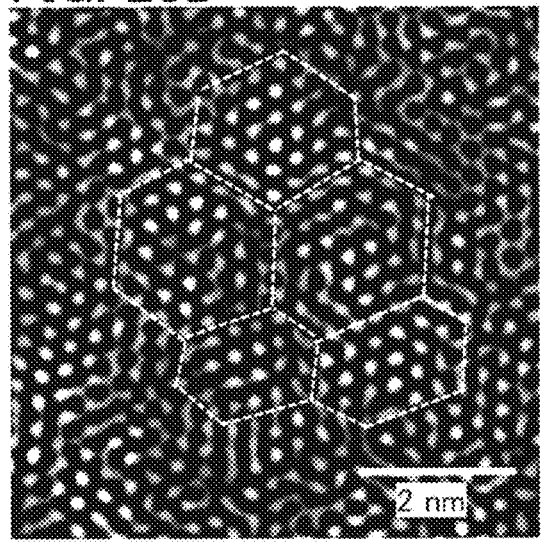
Figure 28B:
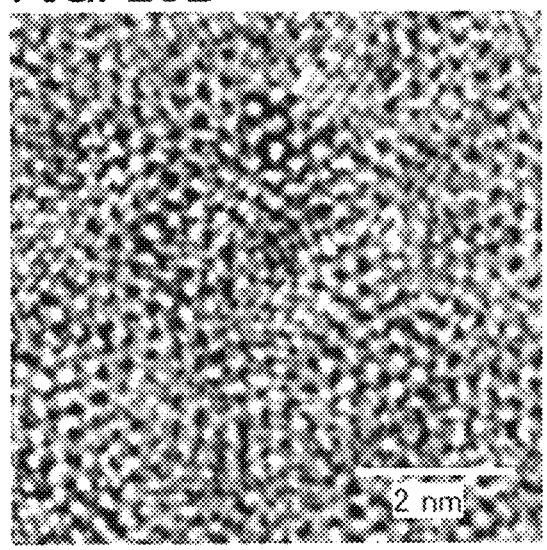
Figure 28E:
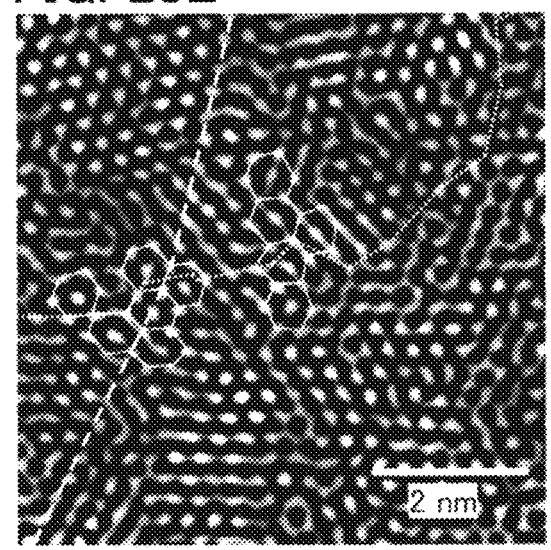
Figure 28C:
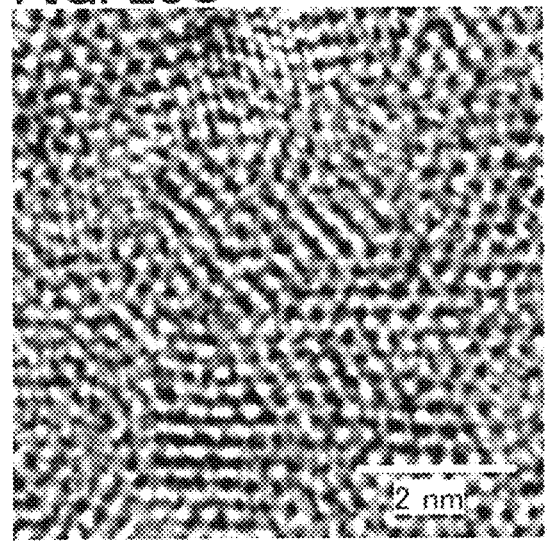

FIGS. 28B and 28C show Cs-corrected high-resolution TEM images of a plane of the CAAC-OS observed from a direction substantially perpendicular to the sample surface. FIGS. 28D and 28E are images obtained through image processing of FIGS. 28B and 28C. The method of image processing is as follows. The image in FIG. 28B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 28D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 28E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon can be formed. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with a low carrier density; specifically, lower than $8 \times 10^{11}/cm^3$, preferably lower than $1 \times 10^{11}/cm^3$, and further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 29A:
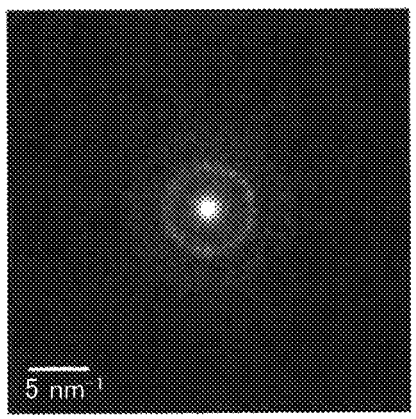
FIGS. 29A to 29D show electron diffraction patterns and a cross-sectional TEM image of an nc-OS.

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 29A is observed. FIG. 29B shows a diffraction pattern obtained when an electron beam with a probe diameter of 1 nm is incident on the same sample. As shown in FIG. 29B, a plurality of spots are observed in a ring-like region. In other words, ordering in an nc-OS is not observed with an electron beam with a probe diameter of 50 nm but is observed with an electron beam with a probe diameter of 1 nm.

Figure 29C:
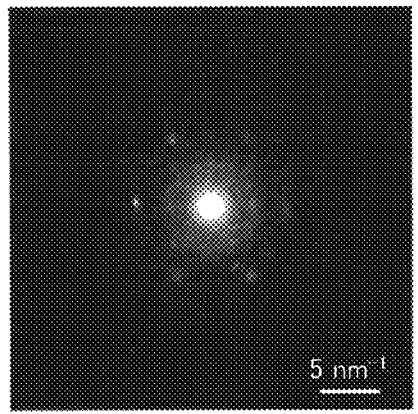
Figure 29B:
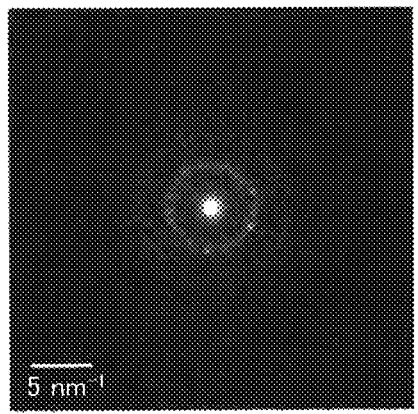

Furthermore, an electron diffraction pattern in which spots are arranged in an approximately hexagonal shape is observed in some cases as shown in FIG. 29C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 29D:
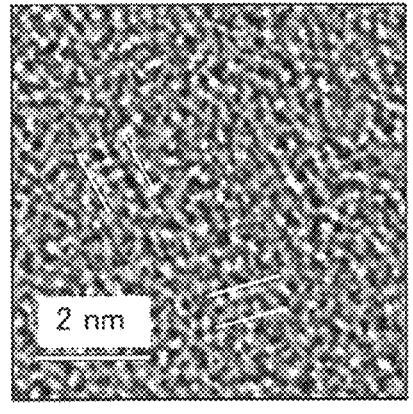

FIG. 29D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 29D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 30A:
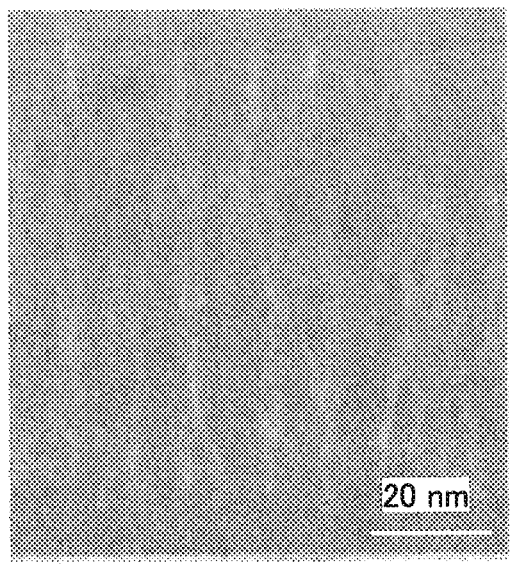
FIGS. 30A and 30B show cross-sectional TEM images of an a-like OS.
Figure 30B:
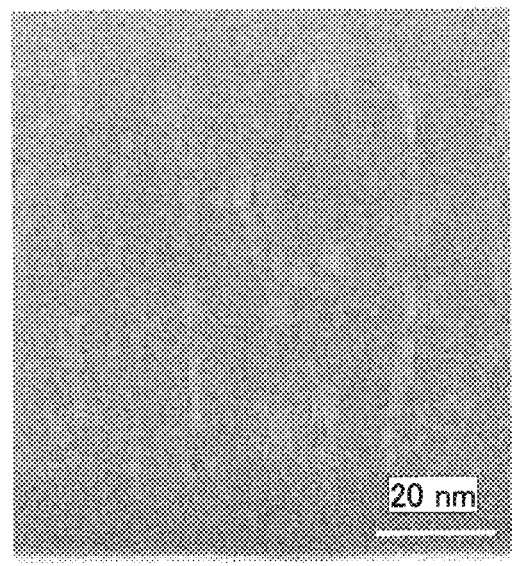

FIGS. 30A and 30B are high-resolution cross-sectional TEM images of an a-like OS. FIG. 30A is the high-resolution cross-sectional TEM image of the a-like OS at the start of the electron irradiation. FIG. 30B is the high-resolution cross-sectional TEM image of a-like OS after the electron ($e^-$) irradiation at $4.3 \times 10^8$ $e^-/nm^2$. FIGS. 30A and 30B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 31:
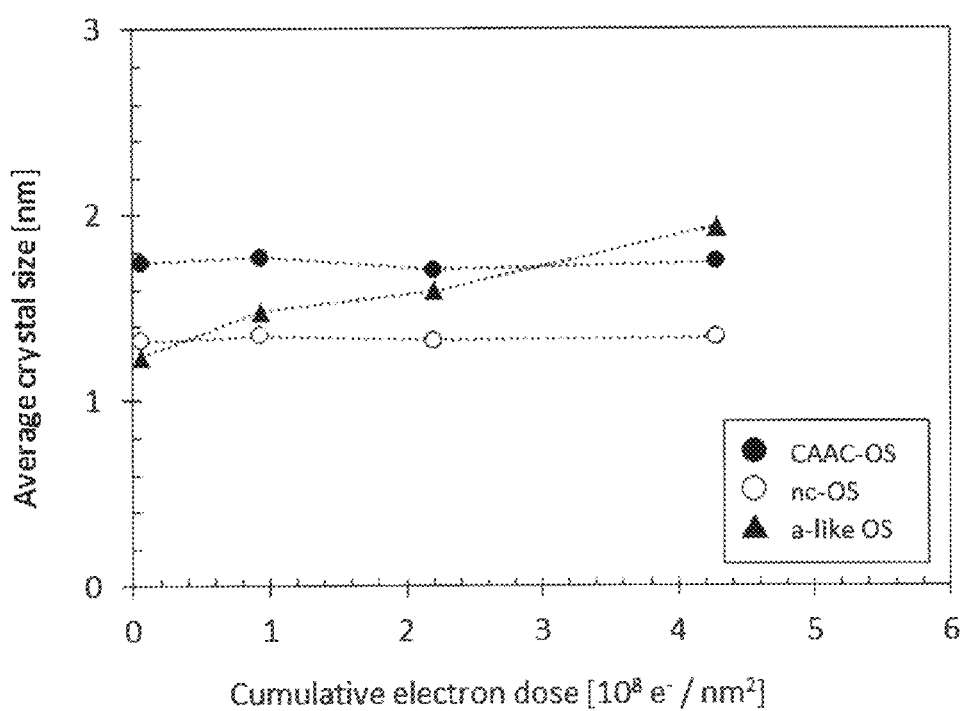
FIG. 31 shows a change in crystal part of an In—Ga—Zn oxide induced by electron irradiation.

FIG. 31 shows change in the average size of crystal parts (at 22 points to 30 points) in each sample. Note that the crystal part size corresponds to the length of a lattice fringe. FIG. 31 indicates that the crystal part size in the a-like OS increases with an increase in the cumulative electron dose in obtaining TEM images, for example. As shown in FIG. 31, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 31, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Embodiment 7

Figure 32A:
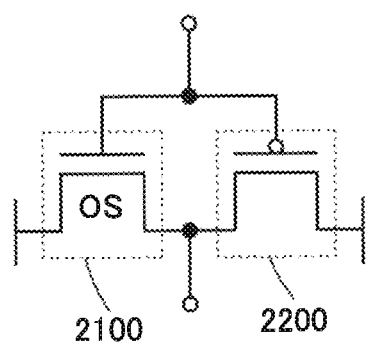
FIGS. 32A and 32B are circuit diagrams each illustrating a semiconductor device of one embodiment of the present invention.

In this embodiment, an example of a circuit of a semiconductor device including a transistor or the like of one embodiment of the present invention is described.
<CMOS Inverter>
A circuit diagram in FIG. 32A shows a configuration of a so-called CMOS inverter in which a p-channel transistor 2200 and an n-channel transistor 2100 are connected to each other in series and in which gates of them are connected to each other.

Figure 33:
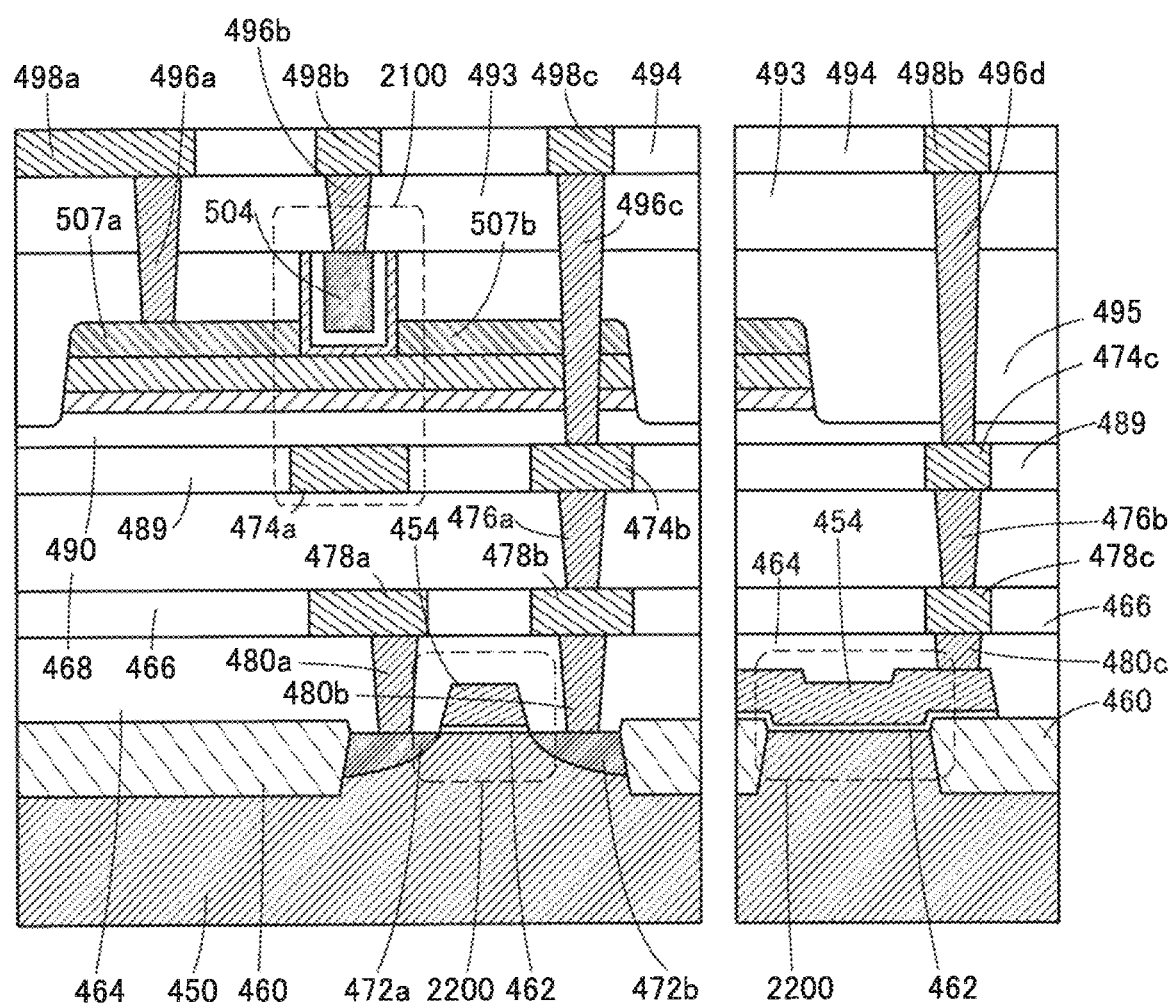
FIG. 33 is a cross-sectional view illustrating a semiconductor device of one embodiment of the present invention.

<Structure 1 of Semiconductor Device>
FIG. 33 is a cross-sectional view of the semiconductor device of FIG. 32A. The semiconductor device shown in FIG. 33 includes the transistor 2200 and the transistor 2100. The transistor 2100 is placed above the transistor 2200. Any of the transistors described in the above embodiments can be used as the transistor 2100. Therefore, the description regarding the above-mentioned transistors is referred to for the transistor 2100 as appropriate.

The transistor 2200 shown in FIG. 33 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 33 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 492, an insulator 493, an insulator 494, and an insulator 495.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 165 in the above embodiment and thus, the description of the conductor 165 can be referred to for details about the conductor 474a.

The insulator 490 includes an opening reaching the conductor 474b. Note that the insulator 490 corresponds to the insulator 120 in the above embodiment and thus, the description of the insulator 120 can be referred to for details about the insulator 490.

The insulator 495 includes an opening reaching the conductor 474b through a conductor 507b that is one of a source and a drain of the transistor 2100, an opening reaching a conductor 507a that is the other of the source and the drain of the transistor 2100, an opening reaching the conductor 504 that is the gate electrode of the transistor 2100, and an opening reaching the conductor 474c. Note that the insulator 495 corresponds to the insulator 180 in the above embodiment and thus, the description of the insulator 180 can be referred to for details about the insulator 495.

The insulator 493 includes an opening reaching the conductor 474b through the conductor 507b that is the one of the source and the drain of the transistor 2100, an opening reaching the conductor 507a that is the other of the source and the drain of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 34:
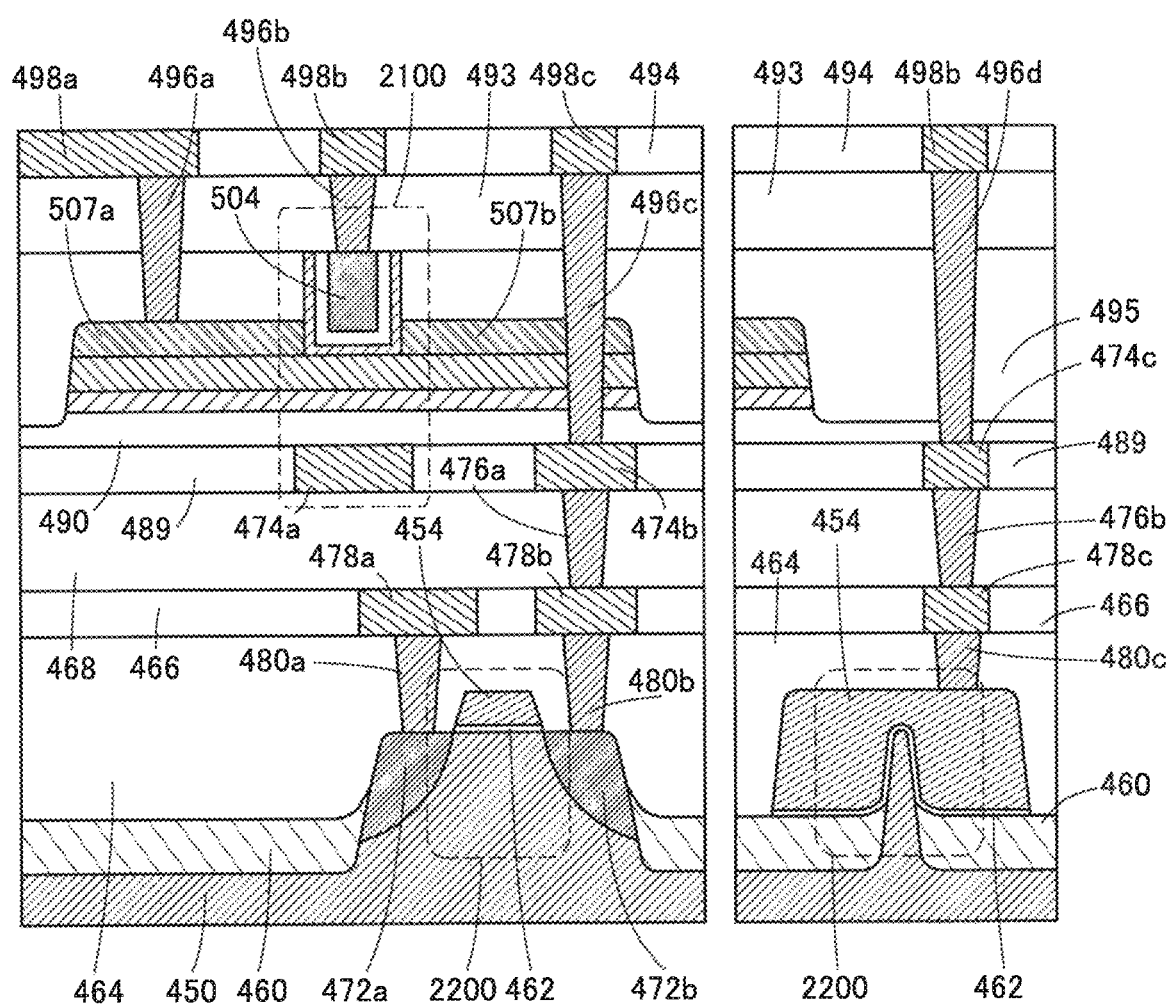
FIG. 34 is a cross-sectional view illustrating a semiconductor device of one embodiment of the present invention.

Note that a semiconductor device in FIG. 34 is the same as the semiconductor device in FIG. 33 except the structure of the transistor 2200. Therefore, the description of the semiconductor device in FIG. 33 is referred to for the semiconductor device in FIG. 34. In the semiconductor device in FIG. 34, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 35:
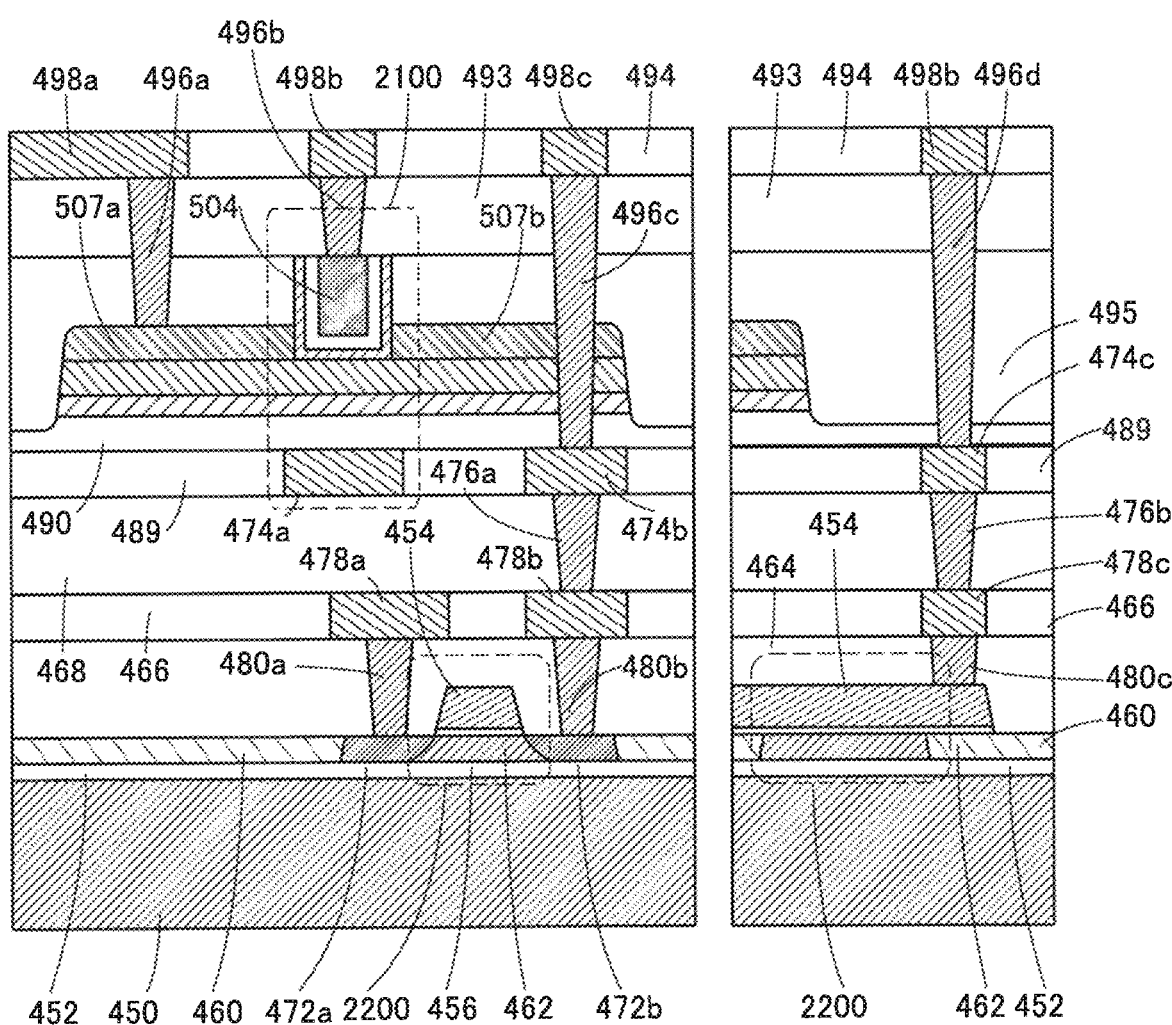
FIG. 35 is a cross-sectional view illustrating a semiconductor device of one embodiment of the present invention.

Note that a semiconductor device in FIG. 35 is the same as the semiconductor device in FIG. 33 except the structure of the transistor 2200. Therefore, the description of the semiconductor device in FIG. 33 is referred to for the semiconductor device in FIG. 35. Specifically, in the semiconductor device in FIG. 35, the transistor 2200 is formed in the semiconductor substrate 450 that is an SOI substrate. In the structure in FIG. 35, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 33, FIG. 34, and FIG. 35, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 32B:
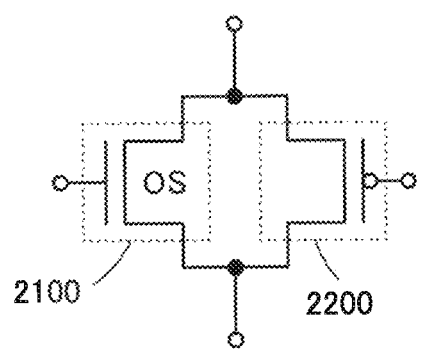

A circuit diagram in FIG. 32B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 36A:
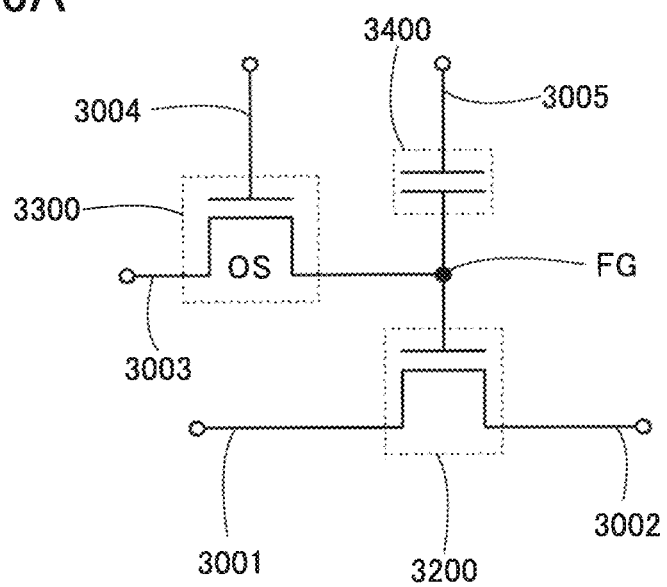
FIGS. 36A and 36B are circuit diagrams each illustrating a memory device of one embodiment of the present invention.
Figure 36B:
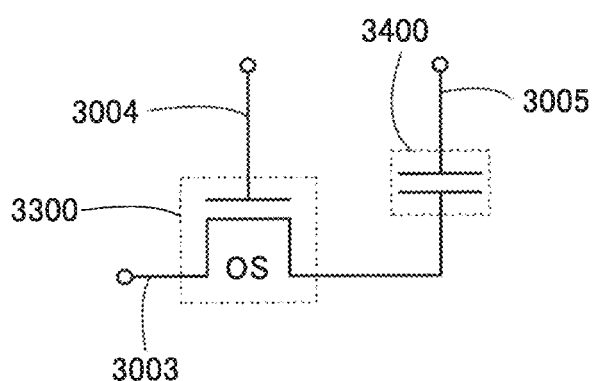

An example of a semiconductor device (memory device) which includes the transistor of one embodiment of the present invention, which can retain stored data even when not powered, and which has an unlimited number of write cycles is shown in FIGS. 36A and 36B.

The semiconductor device illustrated in FIG. 36A includes a transistor 3200 using a first semiconductor, a transistor 3300 using a second semiconductor, and a capacitor 3400. Note that a transistor similar to the above-described transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 36A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 36A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed, for example. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure 1 of Memory Device>

Figure 37:
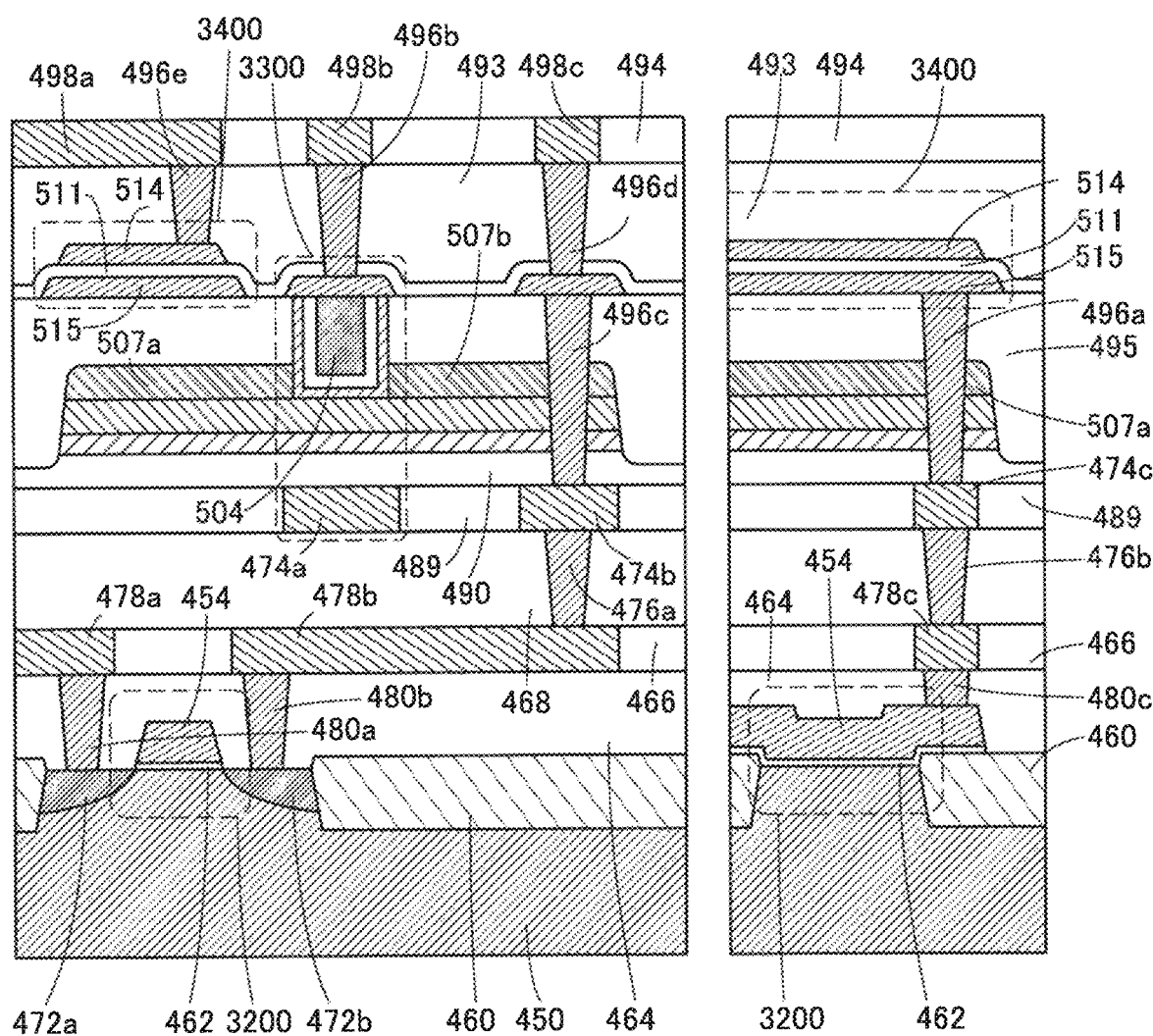
FIG. 37 is a cross-sectional view illustrating a semiconductor device of one embodiment of the present invention.

FIG. 37 is a cross-sectional view of the semiconductor device of FIG. 36A. The semiconductor device shown in FIG. 37 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 33 is referred to.

Note that although the transistor 2200 is illustrated as a p-channel transistor in FIG. 33, the transistor 3200 may be an n-channel transistor.

The transistor 2200 illustrated in FIG. 37 is a transistor using a semiconductor substrate 450. The transistor 2200 includes a region 472a in the semiconductor substrate 450, a region 472b in the semiconductor substrate 450, an insulator 462, and a conductor 454.

The semiconductor device illustrated in FIG. 37 includes insulators 464, 466, and 468, conductors 480a, 480b, 480c, 478a, 478b, 478c, 476a, 476b, 474a, 474b, 474c, 496a, 496b, 496c, 496d, 498a, 498b, and 498c, and the insulators 489, 490, 492, 493, 494, and 495.

The insulator 464 is provided over the transistor 3200. The insulator 466 is provided over the insulator 464. The insulator 468 is provided over the insulator 466. The insulator 489 is provided over the insulator 468. The transistor 2100 is provided over the insulator 489. The insulator 493 is provided over the transistor 2100. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with the channel formation region of the transistor 3300, an opening reaching the conductor 476a, and an opening reaching the conductor 476b. In the openings, the conductor 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 504 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 490 includes an opening reaching the conductor 474b and an opening reaching the conductor 474c.

Furthermore, the insulator 495 includes an opening reaching the conductor 474b through a conductor 507b which is one of a source and a drain of the transistor 3300, and an opening reaching the conductor 474c through the conductor 507a which is one of a source and a drain of the transistor 3300. In the openings, the conductor 496a and the conductor 496c are embedded. Note that in some cases, an opening provided in a component of the transistor 3300 or the like is positioned between openings provided in other components.

The insulator 493 includes an opening reaching the conductor 514 which is one of electrodes of the capacitor 3400, an opening reaching a conductor that is in contact with the conductor 496c connected to the conductor 507b which is the other of a source and the drain of the transistor 3300, and an opening reaching a gate of the transistor 3300. In the openings, the conductor 496e, the conductor 496d, and the conductor 496b are embedded.

The insulator 494 includes an opening reaching the conductor 496b, an opening reaching the conductor 496d, and an opening reaching the conductor 496e. In the openings, the conductor 498a, the conductor 498b, and the conductor 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 507b that is one of a source and a drain of the transistor 3300 through the conductor 480b, the conductor 478b, the conductor 476a, the conductor 474b, and the conductor 496c. The conductor 454 that is the gate electrode of the transistor 3200 is electrically connected to the conductor 507a that is the other of the source and the drain of the transistor 3300 through the conductor 480c, the conductor 478c, the conductor 476b, the conductor 474c, and the conductor 496d.

The capacitor 3400 includes a conductor 515, the conductor 514, and the insulator 511.

For the structures of other components, the description of FIG. 33 and the like can be referred to as appropriate.

Figure 38:
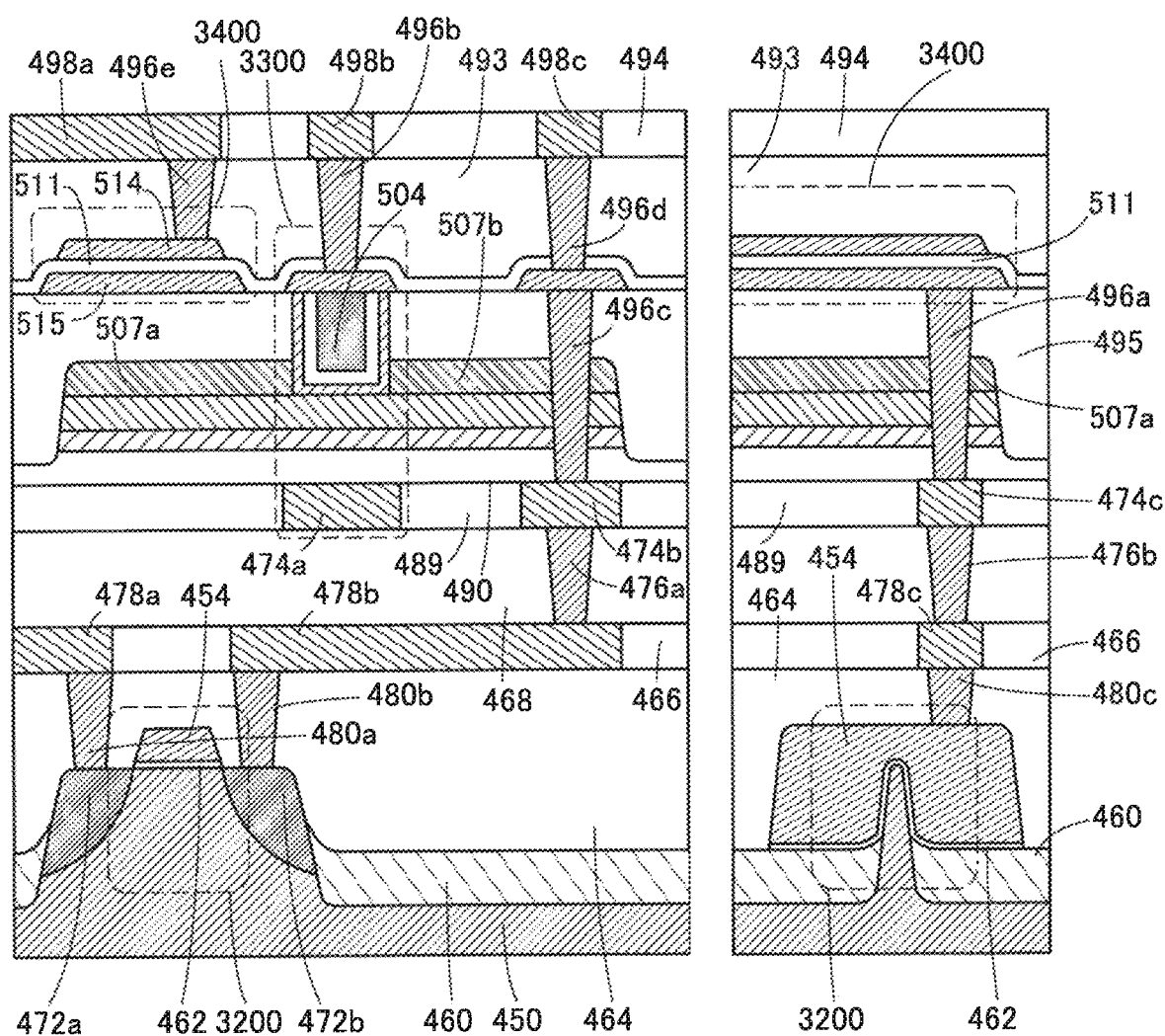
FIG. 38 is a cross-sectional view illustrating a semiconductor device of one embodiment of the present invention.

A semiconductor device in FIG. 38 is the same as the semiconductor device in FIG. 37 except the structure of the transistor 3200. Therefore, the description of the semiconductor device in FIG. 37 is referred to for the semiconductor device in FIG. 38. Specifically, in the semiconductor device in FIG. 38, the transistor 3200 is a Fin-type transistor. For the Fin-type transistor 3200, the description of the transistor 2200 in FIG. 34 is referred to. Note that although the transistor 2200 is illustrated as a p-channel transistor in FIG. 34, the transistor 3200 may be an n-channel transistor.

Figure 39:
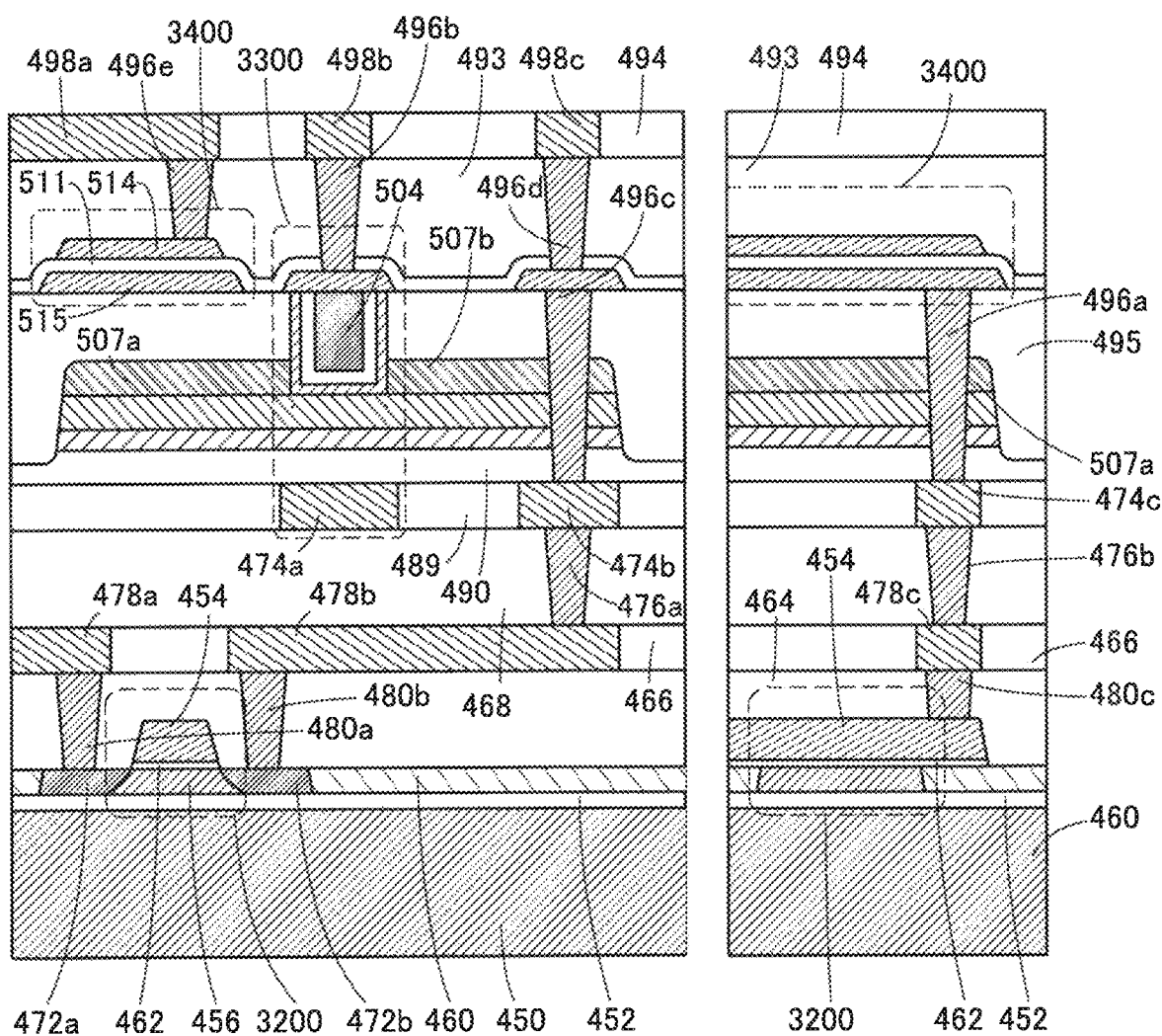
FIG. 39 is a cross-sectional view illustrating a semiconductor device of one embodiment of the present invention.

A semiconductor device in FIG. 39 is the same as the semiconductor device in FIG. 37 except a structure of the transistor 3200. Therefore, the description of the semiconductor device in FIG. 37 is referred to for the semiconductor device in FIG. 39. Specifically, in the semiconductor device in FIG. 39, the transistor 3200 is provided in the semiconductor substrate 450 that is an SOI substrate. For the transistor 3200, which is provided in the semiconductor substrate 450 that is an SOI substrate, the description of the transistor 2200 in FIG. 35 is referred to. Note that although the transistor 2200 is illustrated as a p-channel transistor in FIG. 35, the transistor 3200 may be an n-channel transistor.

<Memory Device 2>

The semiconductor device in FIG. 36B is different from the semiconductor device in FIG. 36A in that the transistor 3200 is not provided. Also in this case, data can be written and retained in a manner similar to that of the semiconductor device in FIG. 36A.

Reading of data in the semiconductor device in FIG. 36B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$)) is higher than the potential of the third wiring 3003 in the case of retaining the potential $V_0$ ($=(C_B \times V_{B0} + C \times V_0)/(C_B + C)$)).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 36A is described with reference to a circuit diagram in FIG. 40.

Figure 40:
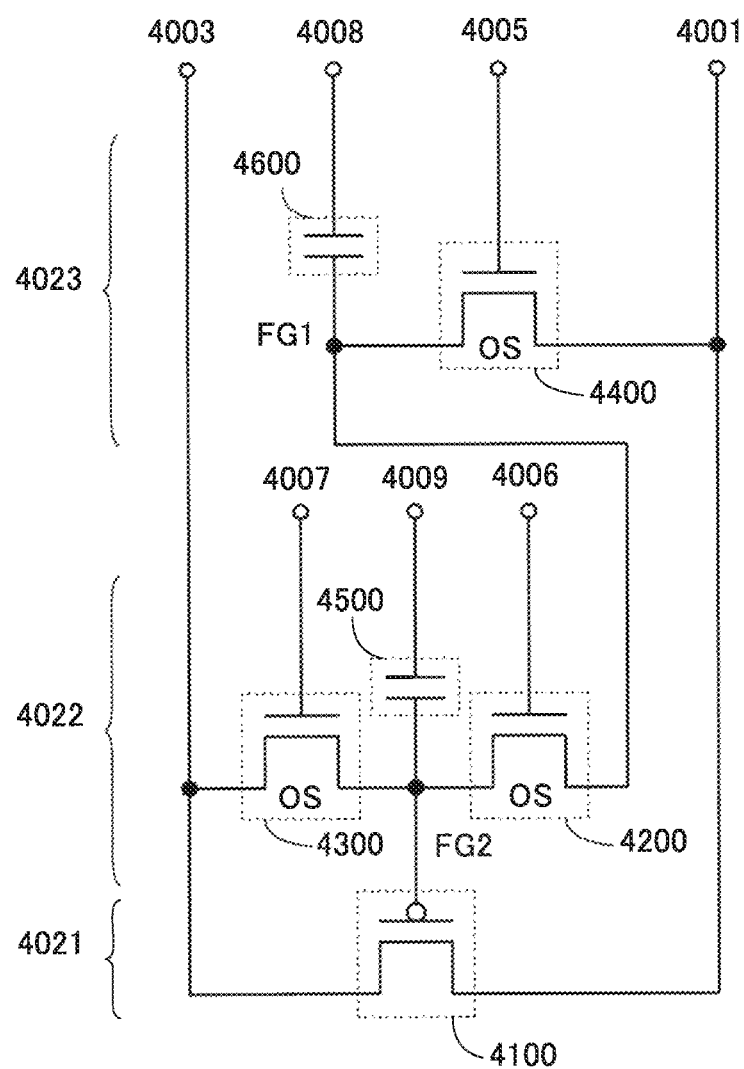
FIG. 40 is a circuit diagram illustrating a semiconductor device of one embodiment of the present invention.

The semiconductor device illustrated in FIG. 40 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 40, a plurality of semiconductor devices in FIG. 40 are provided in a matrix. The semiconductor devices in FIG. 40 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 40, the transistor 4100 may be an n-channel transistor.

The semiconductor device in FIG. 40 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 40, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 40 preferably includes, as illustrated in FIG. 40, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 40 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, VD' supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 40, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 40 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 40, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability becomes excellent.

Figure 41:
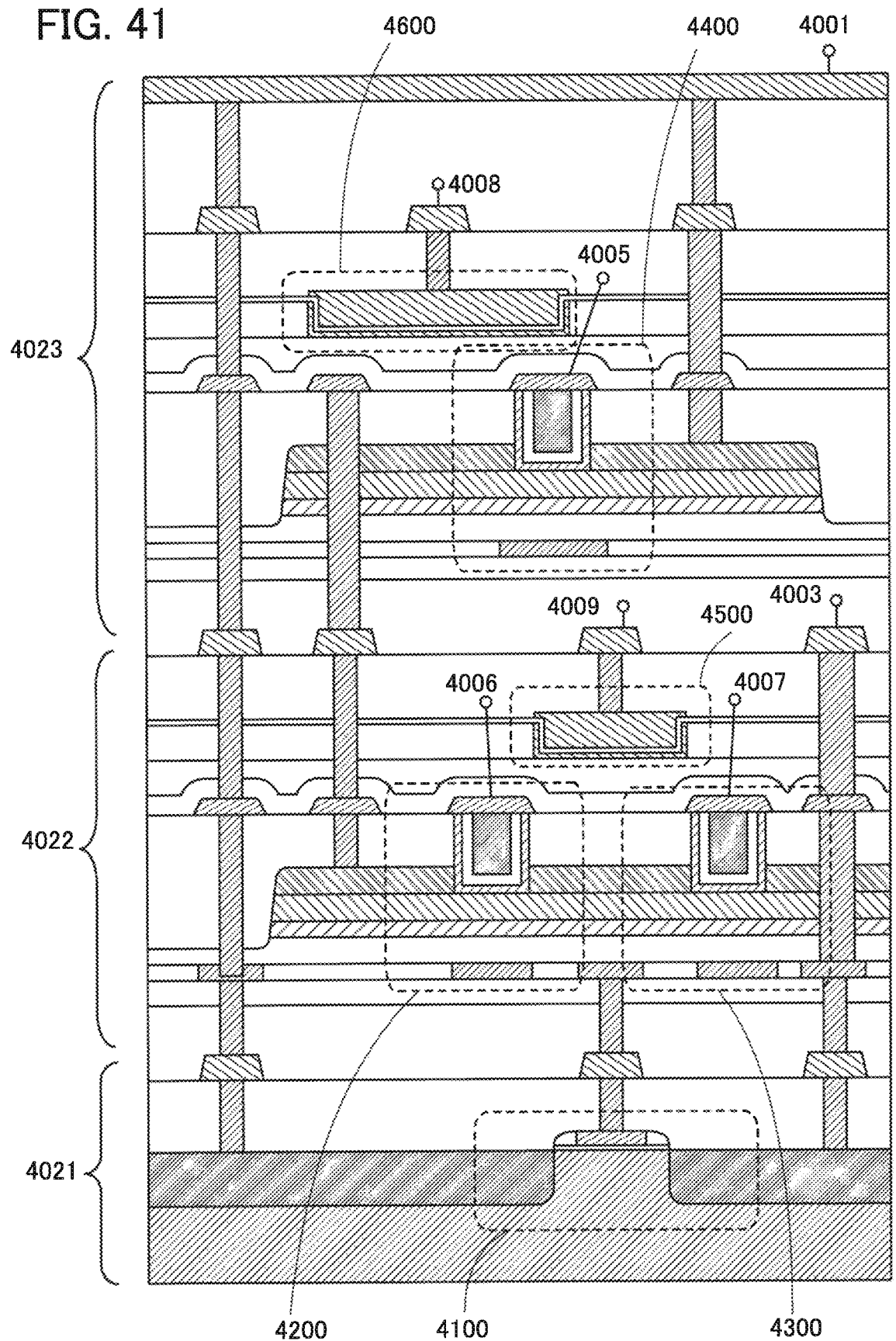
FIG. 41 is a cross-sectional view illustrating a semiconductor device of one embodiment of the present invention.

FIG. 41 is a cross-sectional view of a semiconductor device that corresponds to FIG. 40. The semiconductor device illustrated in FIG. 41 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200 to 4400, and the description of the transistor 3200 can be referred to for the transistor 4100. The description made with reference to FIG. 37 can be appropriately referred to for other wirings, other insulators, and the like.

Note that the capacitors 4500 and 4600 in FIG. 41 are formed by including the conductive layers each having a trench-like shape, while the conductive layer of the capacitor 3400 in the semiconductor device in FIG. 37 is parallel to the substrate. With this structure, a larger capacity can be obtained without increasing the occupation area.

<FPGA>

One embodiment of the present invention can also be applied to an LSI such as a field programmable gate array (FPGA).

Figure 42A:
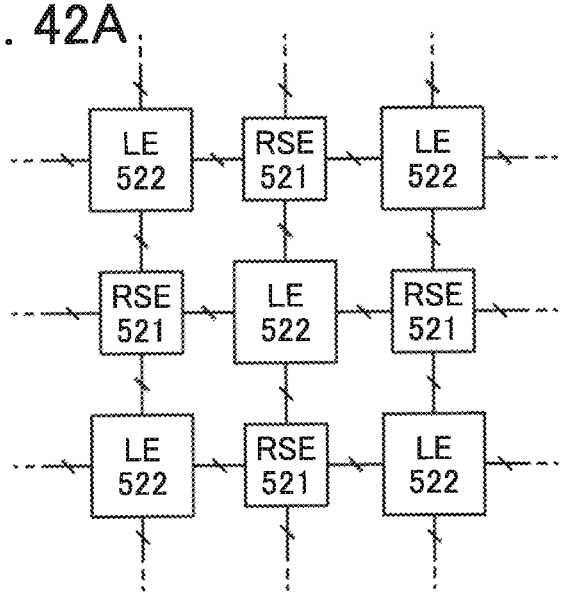
FIGS. 42A to 42E are circuit diagrams illustrating a semiconductor device of one embodiment of the present invention.

FIG. 42A illustrates an example of a block diagram of an FPGA. The FPGA includes a routing switch element 521 and a logic element 522. The logic element 522 can switch functions of a logic circuit, such as a combination circuit or a sequential circuit, in accordance with configuration data stored in a configuration memory.

Figure 42B:
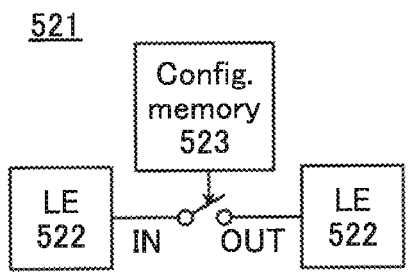

FIG. 42B is a schematic view illustrating a function of the routing switch element 521. The routing switch element 521 can switch a connection between the logic elements 522 in accordance with configuration data stored in a configuration memory 523. Note that although FIG. 42B illustrates one switch which switches connection between a terminal IN and a terminal OUT, in an actual FPGA, a plurality of switches are provided between a plurality of the logic elements 522.

Figure 42C:
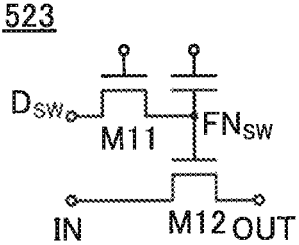

FIG. 42C illustrates an example of a configuration of a circuit serving as the configuration memory 523. The configuration memory 523 includes a transistor M11 that is an OS transistor and a transistor M12 that is a silicon transistor. Configuration data $D_{SW}$ is supplied to a node $FN_{SW}$ through the transistor M11. The potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 42D:
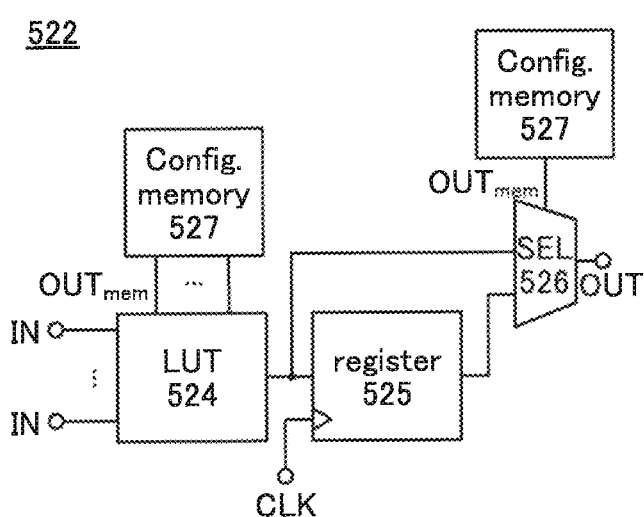

FIG. 42D is a schematic view illustrating a function of the logic element 522. The logic element 522 can switch a potential of a terminal $OUT_{mem}$ in accordance with configuration data stored in a configuration memory 527. A lookup table 524 can switch functions of a combination circuit that processes a signal of the terminal IN in accordance with the potential of the terminal $OUT_{mem}$. The logic element 522 includes a register 525 that is a sequential circuit and a selector 526 that switches signals of the terminal OUT. The selector 526 can select to output a signal of the lookup table 524 or to output a signal of the register 525 in accordance with the potential of the terminal $OUT_{mem}$, which is output from the configuration memory 527.

Figure 42E:
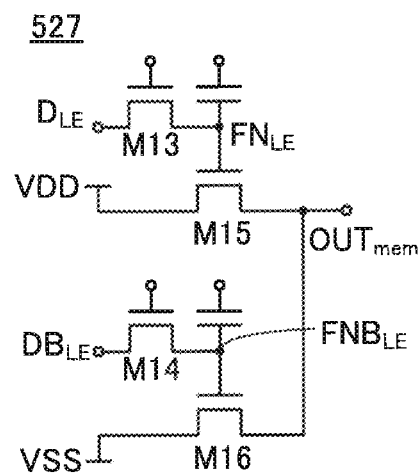

FIG. 42E illustrates an example of a configuration of a circuit serving as the configuration memory 527. The configuration memory 527 includes a transistor M13, a transistor M14, a transistor M15, and a transistor M16. The transistors M13 and M14 are OS transistors. The transistors M15 and M16 are silicon transistors. Configuration data $D_{LE}$ is supplied to a node $FN_{LE}$ through the transistor M13. Configuration data $DB_{LE}$ is supplied to a node $FNB_{LE}$ through the transistor M14. The configuration data $DB_{LE}$ corresponds to a potential of the configuration data $D_{LE}$ whose logic is inverted. The potential of the configuration data $D_{LE}$ and the potential of the configuration data $DB_{LE}$ can be retained by turning off the transistor M13 and the transistor M14, respectively. The on and off states of one of the transistors M15 and M16 are switched in accordance with the retained potential of the configuration data $D_{LE}$ or the configuration data $DB_{LE}$, so that a potential VDD or a potential VSS can be supplied to the terminal $OUT_{mem}$.

For the configuration illustrated in FIGS. 42A to 42E, any of the structures described in this embodiment can be used. For example, silicon transistors are used as the transistors M12, M15, and M16, and OS transistors are used as the transistors M11, M13, and M14. In this case, a wiring for connecting the Si transistors each provided in a lower layer to each other can be formed with a low-resistance conductive material. Therefore, a circuit with high access speed and low power consumption can be obtained.

The structure described in this embodiment can be used in appropriate combination with the structure described in any of the other embodiments.

Embodiment 8

In this embodiment, an example of an imaging device including the transistor or the like of one embodiment of the present invention will be described.

<Configuration of Imaging Device>

Figure 43A:
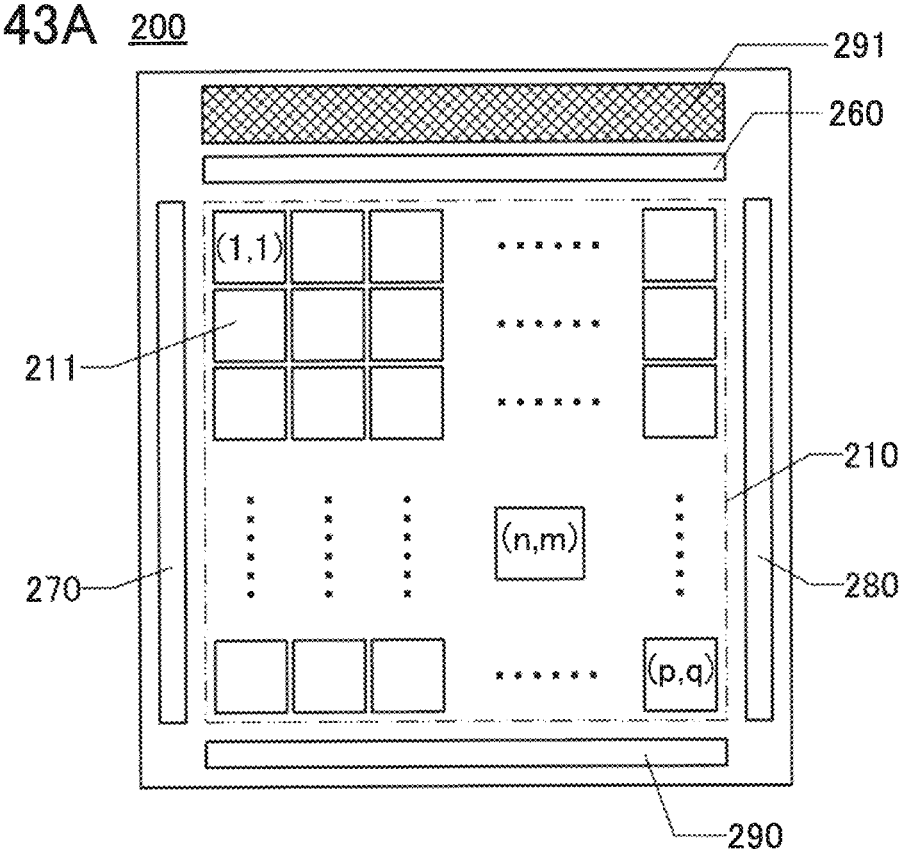
FIGS. 43A and 43B are each a top view of a semiconductor device according to one embodiment of the present invention.

FIG. 43A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 43B:
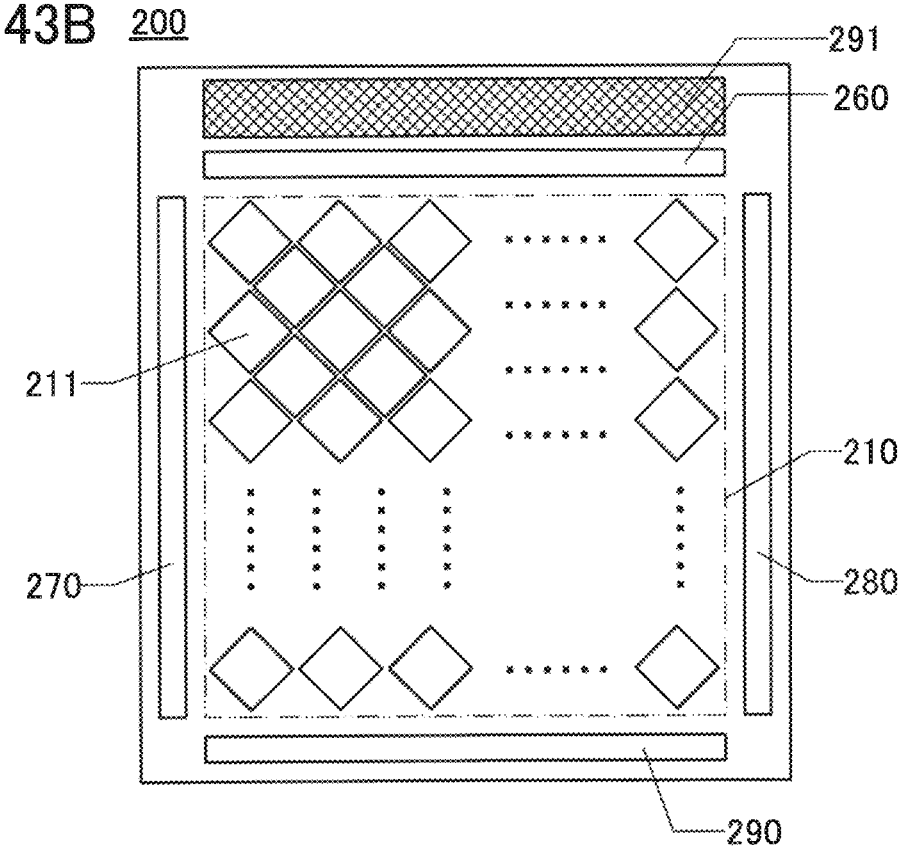

As illustrated in FIG. 43B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 44A:
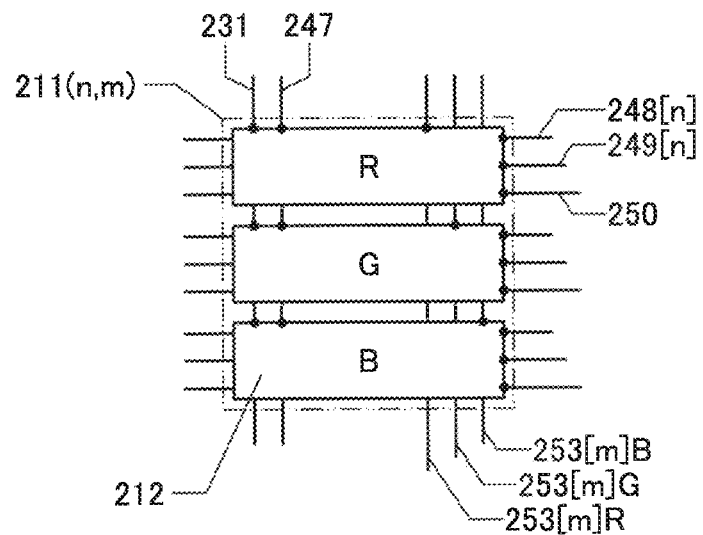
FIGS. 44A and 44B are block diagrams illustrating a semiconductor device according to one embodiment of the present invention.

FIG. 44A is a top view showing an example of the pixel 211 with which a color image is obtained. The pixel 211 illustrated in FIG. 44A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 44A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 44B:
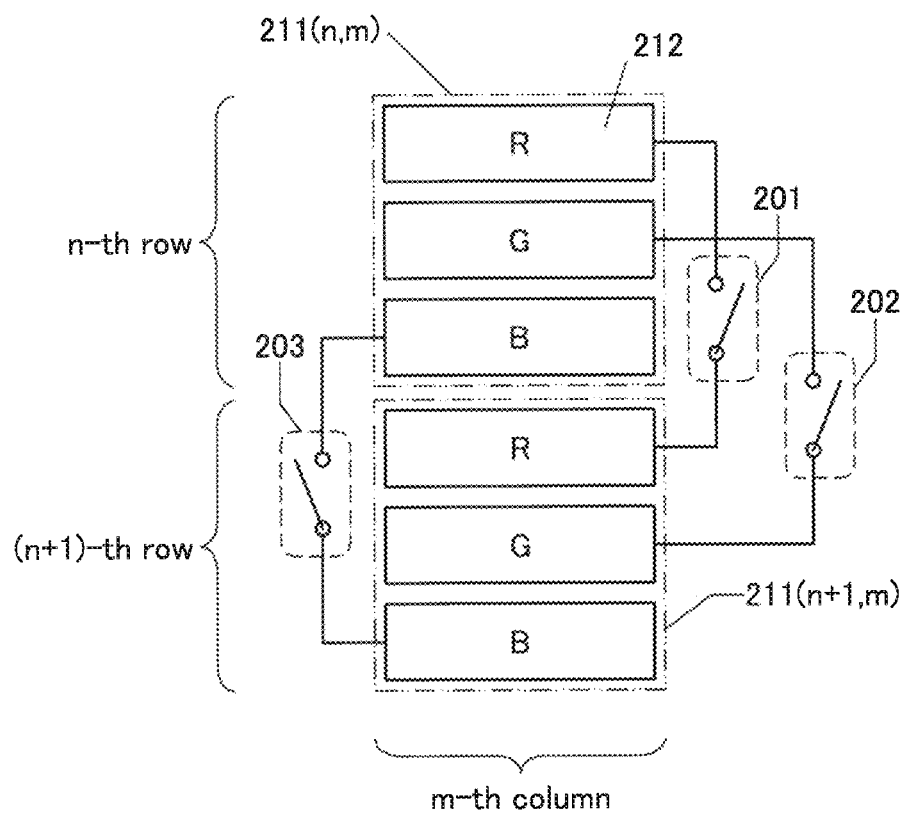

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 44B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 44B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 44A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 45A and 45B. With the lens 255, the photoelectric conversion element can receive incident light efficiently. Specifically, as illustrated in FIG. 45A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed double-dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 45B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 45A:
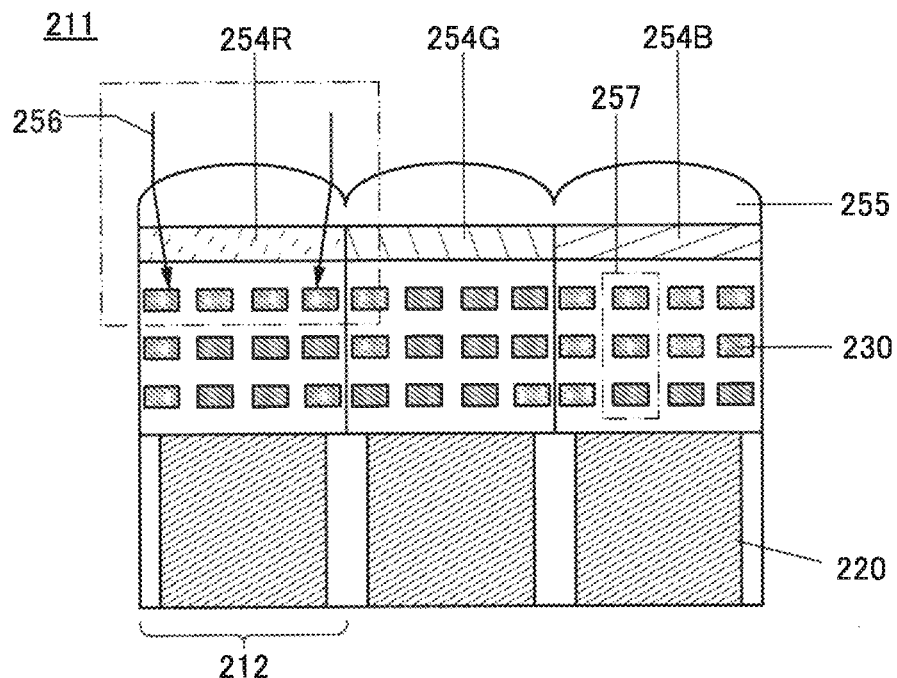
FIGS. 45A and 45B are each a cross-sectional view illustrating a semiconductor device according to one embodiment of the present invention.
Figure 45B:
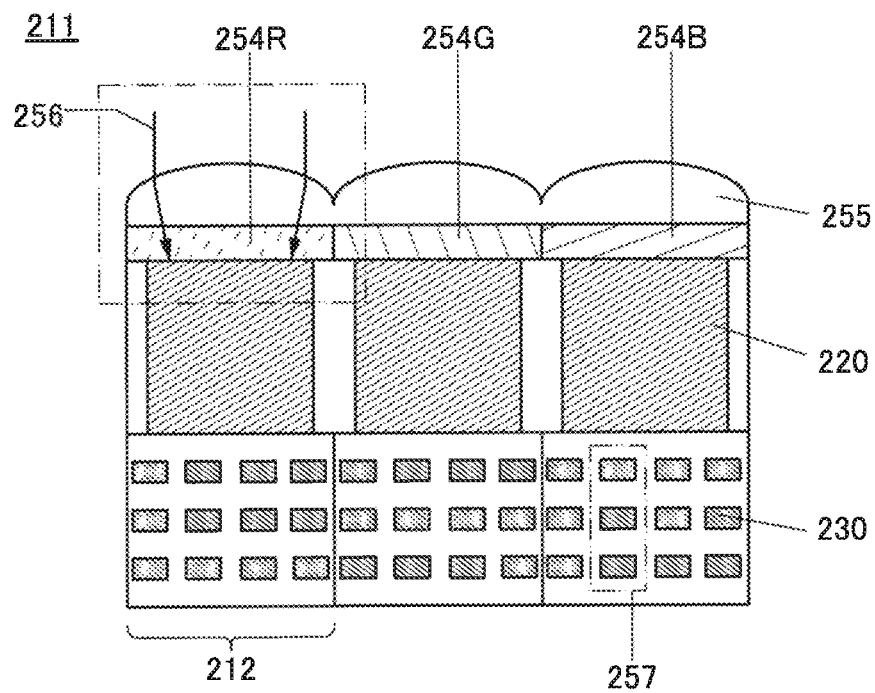

As the photoelectric conversion element 220 illustrated in FIGS. 45A and 45B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 44A and 44B.

<Configuration Example 2 of Pixel>

An example of a pixel including a transistor using silicon and a transistor using an oxide semiconductor will be described below.

Figure 46A:
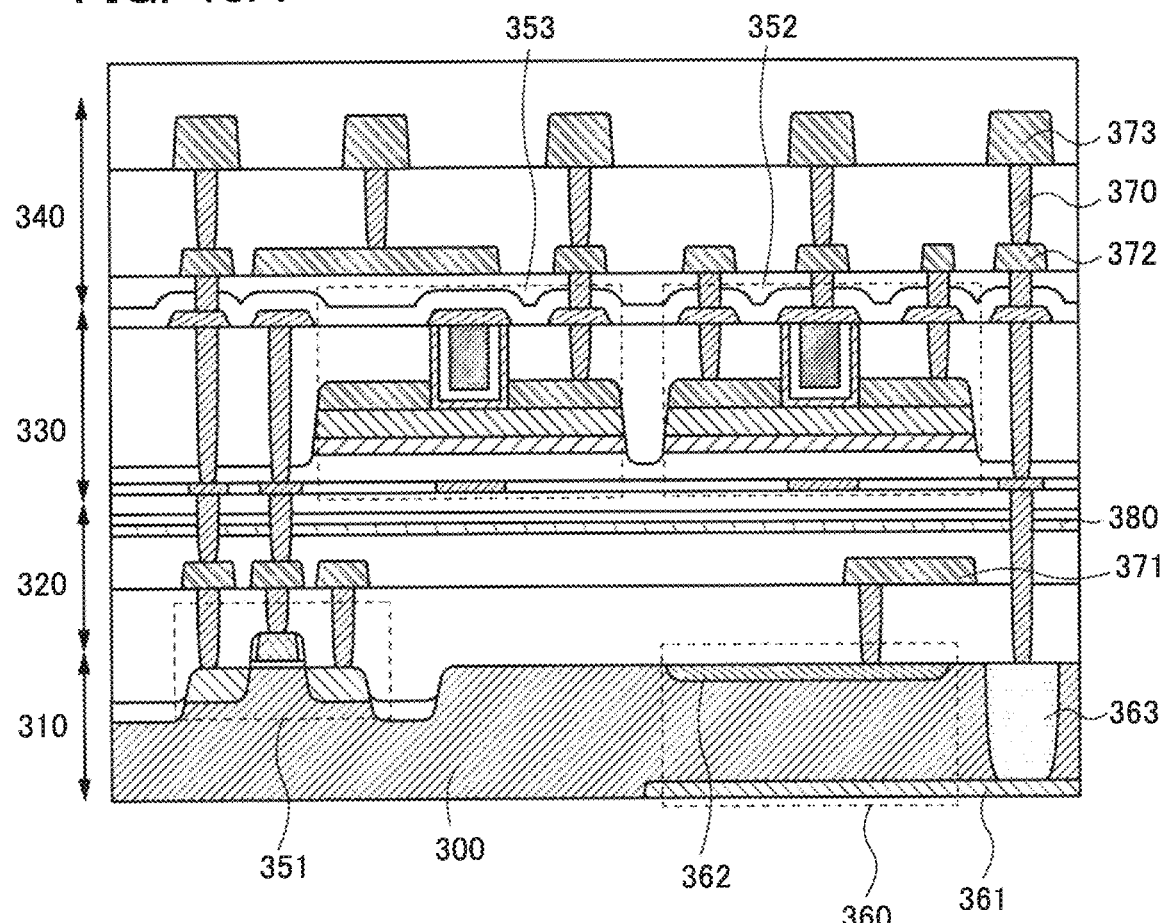
FIGS. 46A and 46B are each a cross-sectional view illustrating a semiconductor device according to one embodiment of the present invention.
Figure 46B:
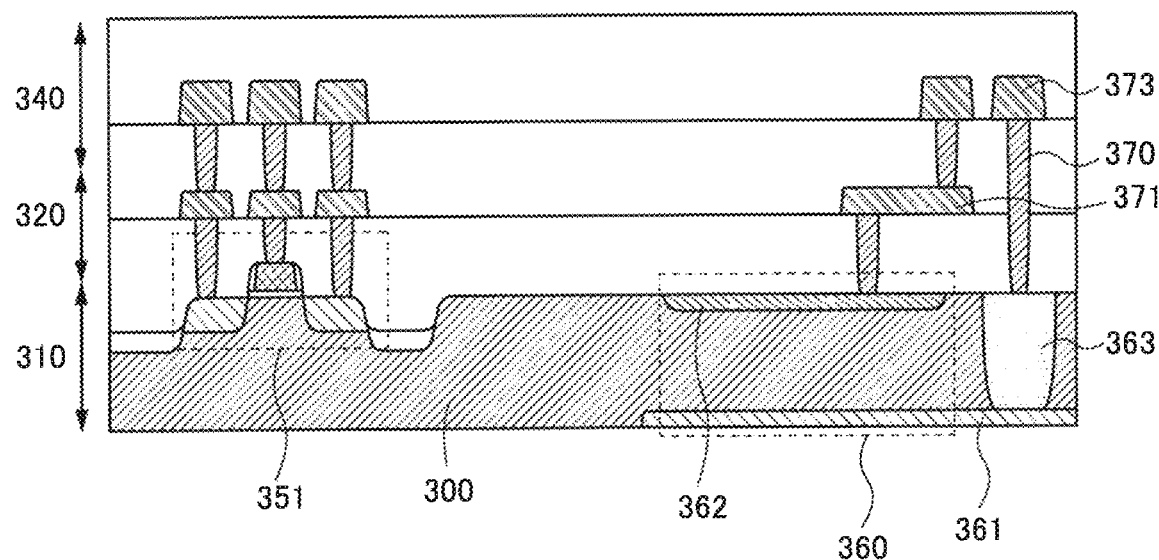

FIGS. 46A and 46B are each a cross-sectional view of an element included in an imaging device. The imaging device illustrated in FIG. 46A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 46A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 46B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 46A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 47A1 and FIG. 47B1, part or the whole of the imaging device can be bent. FIG. 47A1 illustrates a state in which the imaging device is bent in the direction of a dashed-dotted line X1-X2. FIG. 47A2 is a cross-sectional view illustrating a portion indicated by the dashed-dotted line X1-X2 in FIG. 47A1. FIG. 47A3 is a cross-sectional view illustrating a portion indicated by a dashed-dotted line Y1-Y2 in FIG. 47A1.

FIG. 47B1 illustrates a state where the imaging device is bent in the direction of a dashed-dotted line X3-X4 and the direction of a dashed-dotted line Y3-Y4. FIG. 47B2 is a cross-sectional view illustrating a portion indicated by the dashed-dotted line X3-X4 in FIG. 47B1. FIG. 47B3 is a cross-sectional view illustrating a portion indicated by the dashed-dotted line Y3-Y4 in FIG. 47B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 9

In this embodiment, examples of CPUs including semiconductor devices such as the transistor of one embodiment of the present invention and the above-described memory device will be described.

<Configuration of CPU>

Figure 48:
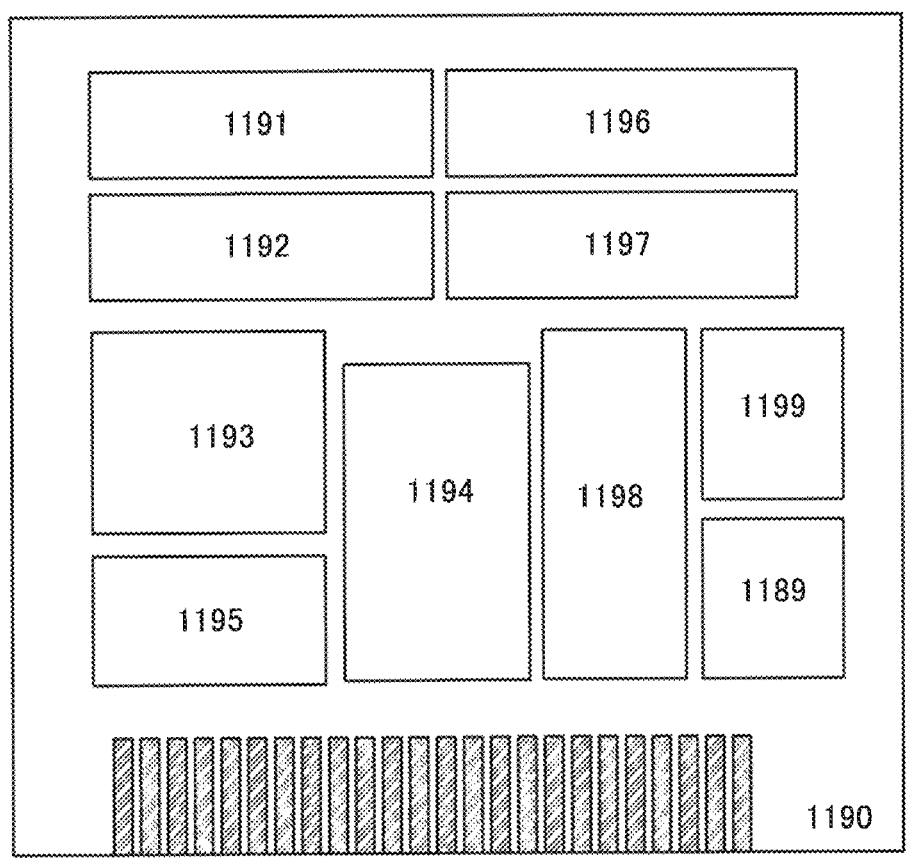
FIG. 48 is a block diagram illustrating a semiconductor device of one embodiment of the present invention.

FIG. 48 is a block diagram illustrating a configuration example of a CPU including any of the above-described transistors as a component.

The CPU illustrated in FIG. 48 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 48 is just an example in which the configuration has been simplified, and an actual CPU may have a variety of configurations depending on the application. For example, the CPU may have the following configuration: a structure including the CPU illustrated in FIG. 48 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 48, a memory cell is provided in the register 1196. For the memory cell of the register 1196, any of the above-described transistors, the above-described memory device, or the like can be used.

In the CPU illustrated in FIG. 48, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 49:
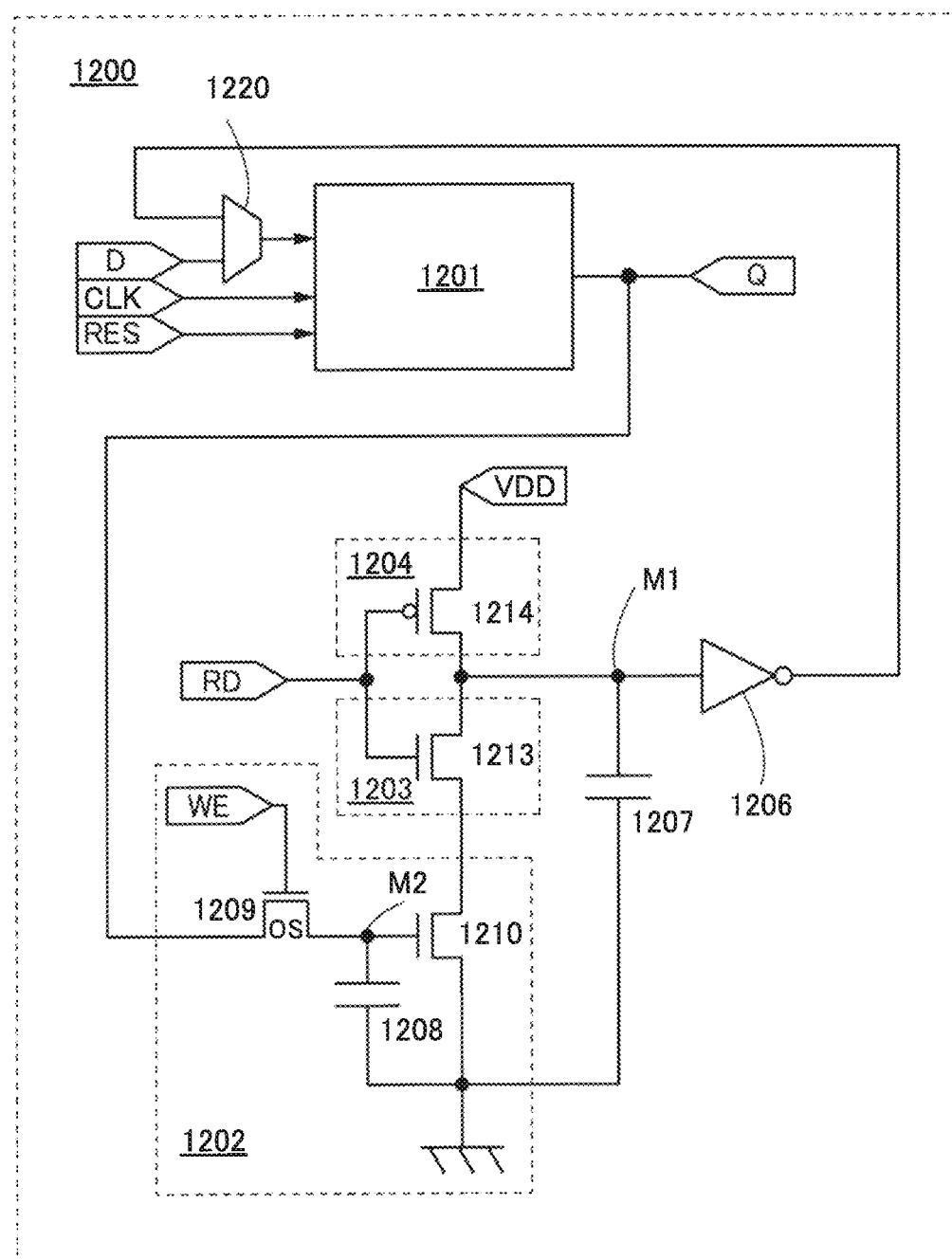
FIG. 49 is a circuit diagram of a semiconductor device according to one embodiment of the present invention.

FIG. 49 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 49 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 49, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 49, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 49, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP) or a custom LSI, and a radio frequency (RF) device. The memory element 1200 can also be used in an LSI such as a programmable logic circuit including a field programmable gate array (FPGA) or a complex programmable logic device (CPLD).

The structures described in this embodiment can be used in appropriate combination with any of the structures described in the other embodiments.

Embodiment 10

In this embodiment, display devices each including the transistor or the like of one embodiment of the present invention will be described with reference to FIGS. 50A to 50C and FIGS. 51A and 51B.

<Configuration of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 50A:
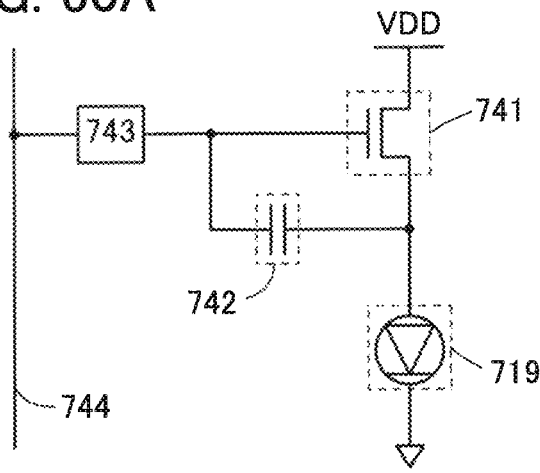
FIGS. 50A to 50C are a circuit diagram, a top view, and a cross-sectional view illustrating a semiconductor device of one embodiment of the present invention.
Figure 50B:
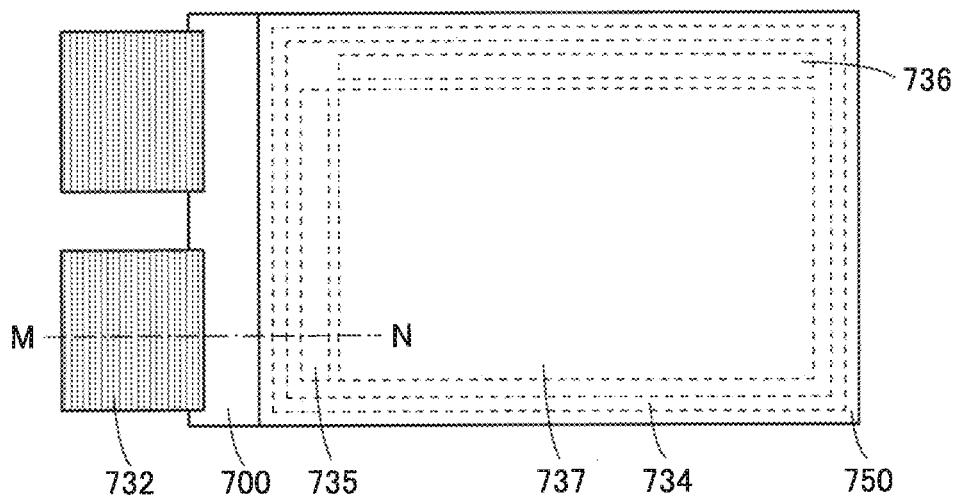
Figure 50C:
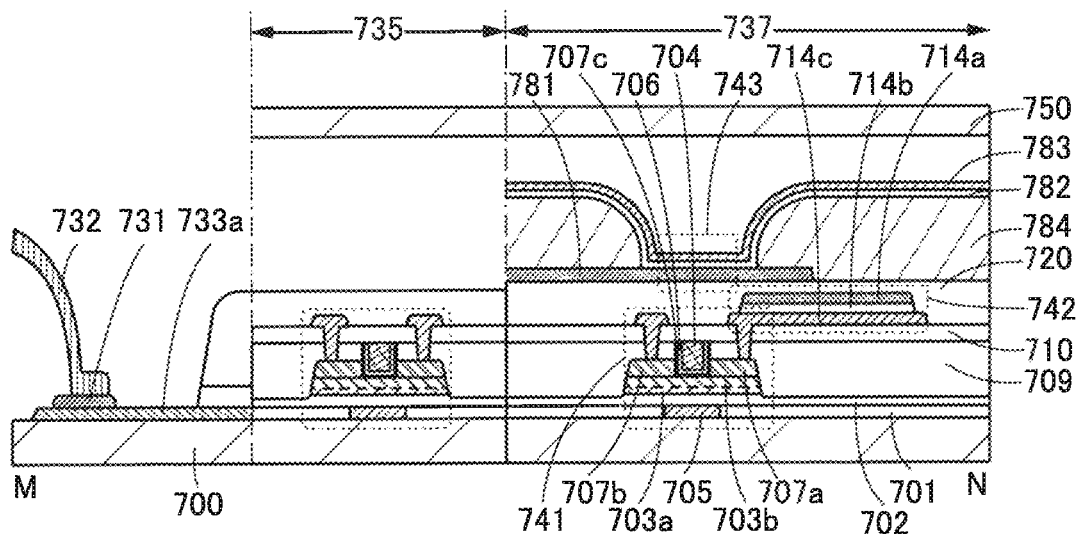

FIGS. 50A to 50C illustrate an example of an EL display device of one embodiment of the present invention. FIG. 50A is a circuit diagram of a pixel in an EL display device. FIG. 50B is a plan view showing the whole of the EL display device. FIG. 50C is a cross-sectional view taken along part of dashed-dotted line M-N in FIG. 50B.

FIG. 50A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 50A includes a switching element 743, a transistor 741, a capacitor 742, and a light-emitting element 719.

Note that FIG. 50A and the like each illustrate an example of a circuit structure; therefore, a transistor can be provided additionally. In contrast, for each node in FIG. 50A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 50B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 50C is a cross-sectional view of the EL display device taken along part of dashed-dotted line M-N in FIG. 50B.

The transistor 741 in FIG. 50C includes a conductor 705 over the substrate 700, an insulator 701 in which the conductor 705 is embedded, an insulator 702 over the insulator 701, an insulator 703a and a semiconductor 703b over the insulator 702, a conductor 707a and a conductor 707b over the semiconductor 703b, an insulator 707c over the semiconductor 703b, an insulator 706 over the insulator 707c, and a conductor 704 over the insulator 706. Note that the structure of the transistor 741 is just an example; the transistor 741 may have a structure different from that illustrated in FIG. 50C.

Thus, in the transistor 741 illustrated in FIG. 50C, the conductors 704 and 705 each function as a gate electrode, the insulators 702 and 706 each function as a gate insulator, and the conductors 707a and 707b function as a source electrode or a drain electrode. Note that in some cases, electrical characteristics of the semiconductor 703b change if light enters the semiconductor 703b. To prevent this, it is preferable that one or more of the conductor 705 and the conductor 704 have a light-blocking property.

FIG. 50C illustrates the capacitor 742 that includes a conductor 714c over an insulator 710, an insulator 714b over the conductor 714c, and a conductor 714a over the insulator 714b.

In the capacitor 742, the conductor 714a serves as one electrode, and the conductor 714c serves as the other electrode.

The capacitor 742 illustrated in FIG. 50C has a large capacitance per area occupied by the capacitor. Therefore, the EL display device illustrated in FIG. 50C has high display quality.

An insulator 720 is provided over the transistor 741 and the capacitor 742. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 51A:
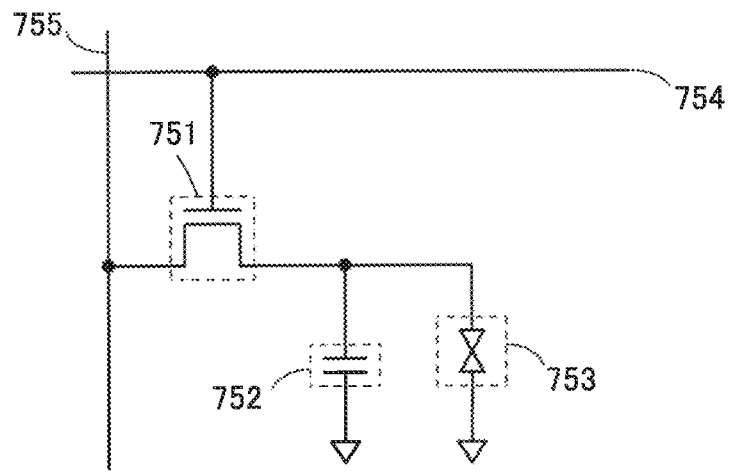
FIGS. 51A and 51B are a circuit diagram and a cross-sectional view illustrating a semiconductor device of one embodiment of the present invention.

FIG. 51A is a circuit diagram illustrating a configuration example of a pixel of a liquid crystal display device. A pixel shown in FIGS. 51A and 51B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 51B:
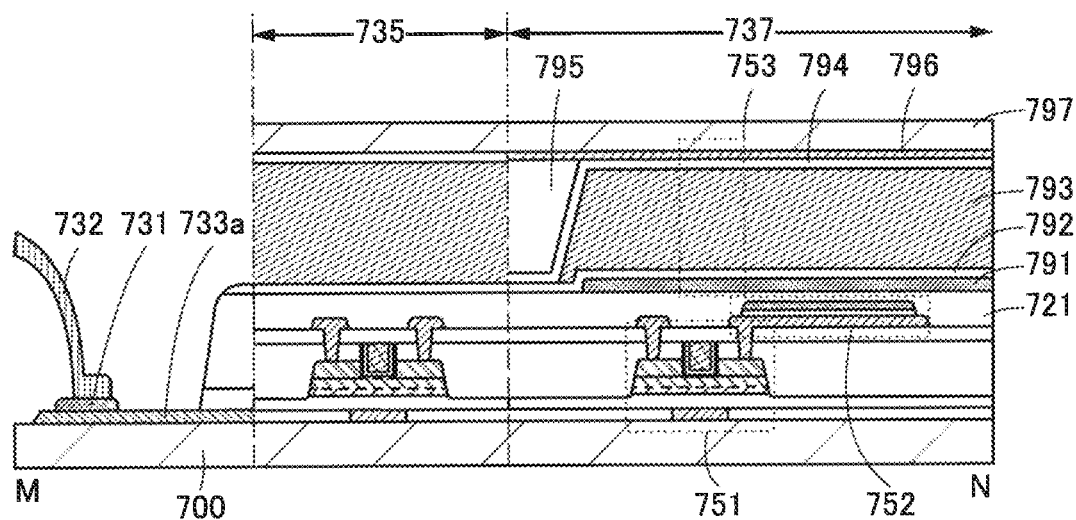

Note that the description of the liquid crystal display device is made on the assumption that the plan view of the liquid crystal display device is similar to that of the EL display device. FIG. 51B is a cross-sectional view of the liquid crystal display device taken along dashed-dotted line M-N in FIG. 50B. In FIG. 51B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 51B corresponds to, but is not limited to, the structure of the capacitor 742 in FIG. 50C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 11

In this embodiment, electronic devices each including the transistor or the like of one embodiment of the present invention will be described.
<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 52A to 52F illustrate specific examples of these electronic devices.

Figure 52A:
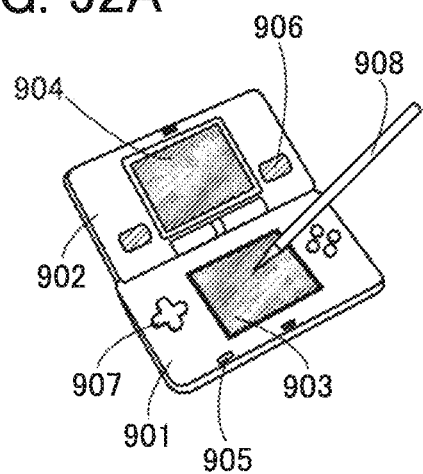
FIGS. 52A to 52F are perspective views each illustrating an electronic device of one embodiment of the present invention.

FIG. 52A illustrates a portable game console including a housing 901, a housing 902, a display portion 903, a display portion 904, a microphone 905, a speaker 906, an operation key 907, a stylus 908, and the like. Although the portable game console in FIG. 52A has the two display portions 903 and 904, the number of display portions included in a portable game console is not limited to this.

Figure 52B:
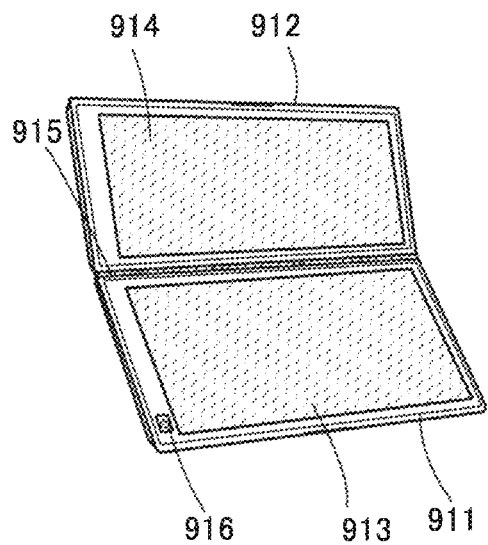

FIG. 52B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 52C:
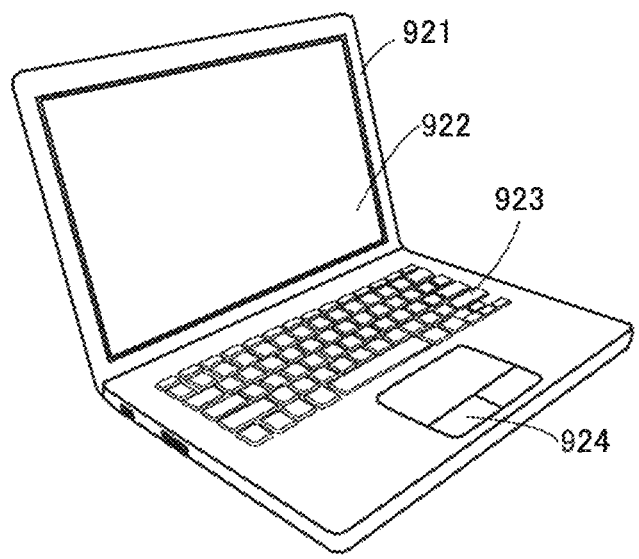

FIG. 52C illustrates a notebook personal computer, which includes a housing 921, a display portion 922, a keyboard 923, a pointing device 924, and the like.

Figure 52D:
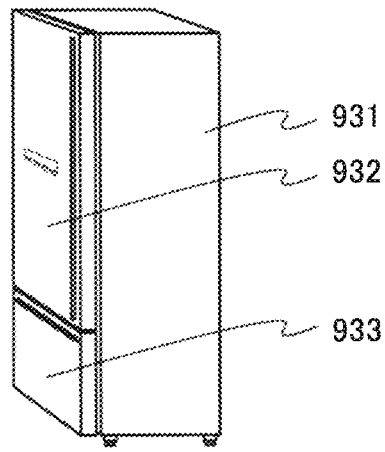

FIG. 52D illustrates an electric refrigerator-freezer, which includes a housing 931, a door for a refrigerator 932, a door for a freezer 933, and the like.

Figure 52E:
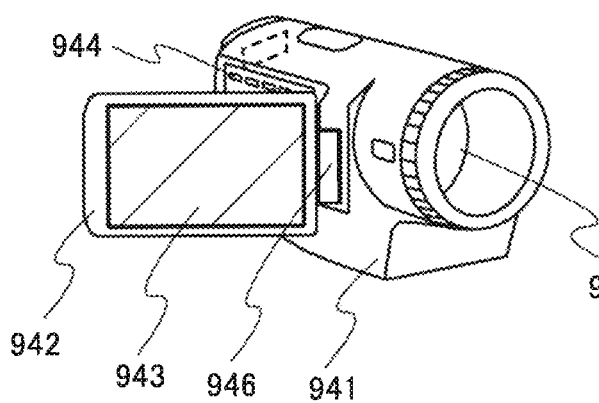

FIG. 52E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 52F:
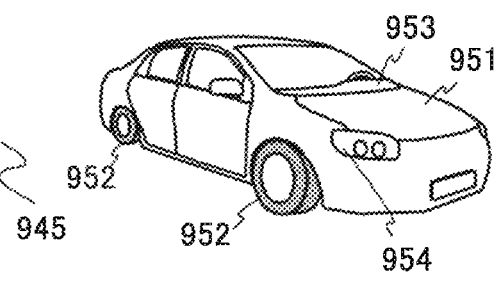

FIG. 52F illustrates a car including a car body 951, wheels 952, a dashboard 953, lights 954, and the like.

The structures described in this embodiment can be used in appropriate combination with any of the structures described in the other embodiments.

Embodiments of the present invention have been described in the above embodiments. Note that one embodiment of the present invention is not limited thereto. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

This application is based on Japanese Patent Application serial no. 2015-096317 filed with Japan Patent Office on May 11, 2015, the entire contents of which are hereby incorporated by reference.

What is claimed is:

1. A method for manufacturing a semiconductor device, comprising:
    forming a semiconductor over a substrate;
    forming a sacrificial layer over the semiconductor;
    forming source and drain regions by adding an impurity to part of the semiconductor;
    forming a first insulator so as to cover the semiconductor and the sacrificial layer;
    exposing a top surface of the sacrificial layer;
    removing the sacrificial layer to form an opening in the first insulator, so that part of the semiconductor is exposed;
    forming a second insulator so as to cover the first insulator and the opening;
    forming a conductor over the second insulator; and
    removing part of the conductor.

2. The method for manufacturing a semiconductor device according to claim 1,
    wherein the semiconductor is an oxide semiconductor including indium, an element M, and zinc, and
    wherein the element M is one of gallium, aluminum, yttrium, and tin.

3. The method for manufacturing a semiconductor device according to claim 1, wherein the sacrificial layer includes one of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten.

4. The method for manufacturing a semiconductor device according to claim 1, wherein the sacrificial layer comprises one of a silicon film, a chromium film, a molybdenum film, a tungsten film, a zinc oxide film, and a molybdenum oxide film.

5. The method for manufacturing a semiconductor device according to claim 1, wherein the impurity comprises one of boron, phosphorus, and argon.

6. The method for manufacturing a semiconductor device according to claim 1, wherein the sacrificial layer serves as a mask in the step of adding the impurity.

7. The method for manufacturing a semiconductor device according to claim 1, wherein the step of removing the sacrificial layer is performed by a wet etching method.

8. The method for manufacturing a semiconductor device according to claim 1, wherein the step of exposing the top surface of the sacrificial layer is performed by a chemical mechanical polishing method.

9. The method for manufacturing a semiconductor device according to claim 1, wherein the step of removing the part of the conductor is performed by a chemical mechanical polishing method.

* * * * *